(12) United States Patent
Gabrys et al.

(10) Patent No.: US 8,378,776 B1
(45) Date of Patent: Feb. 19, 2013

(54) SEMICONDUCTOR STRUCTURE WITH GALVANICALLY-ISOLATED SIGNAL AND POWER PATHS

(75) Inventors: Ann Gabrys, Santa Clara, CA (US); William French, San Jose, CA (US); Peter J. Hopper, San Jose, CA (US); Dok Won Lee, Mountain View, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/218,682

(22) Filed: Aug. 26, 2011

(51) Int. Cl.
*H01F 5/00* (2006.01)
*H01F 27/28* (2006.01)
*H01F 27/29* (2006.01)
*H01L 29/66* (2006.01)
*H01L 27/08* (2006.01)
*H01L 21/02* (2006.01)
*H01L 27/06* (2006.01)

(52) U.S. Cl. ........ 336/200; 336/182; 336/192; 257/277; 257/531; 257/532; 257/533; 257/535

(58) Field of Classification Search .................. 336/200, 336/223, 209, 182, 192, 69, 232; 257/277, 257/531–533, 535; 361/523–541
See application file for complete search history.

(56) References Cited

U.S. PATENT DOCUMENTS

| 4,904,967 | A | * | 2/1990 | Morii et al. ................... 333/185 |
| 5,786,979 | A | * | 7/1998 | Douglass ...................... 361/328 |
| 6,445,271 | B1 | * | 9/2002 | Johnson ........................ 336/200 |
| 7,085,118 | B2 | * | 8/2006 | Inoue et al. ................... 361/119 |
| 8,044,757 | B2 | * | 10/2011 | Bae et al. ...................... 336/200 |
| 2002/0003281 | A1 | * | 1/2002 | Ibata et al. .................... 257/531 |
| 2007/0045773 | A1 | * | 3/2007 | Mi et al. ....................... 257/531 |
| 2011/0095620 | A1 | * | 4/2011 | Fouquet et al. ............... 307/104 |

OTHER PUBLICATIONS

U.S. Appl. No. 13/205,823, filed Aug. 9, 2011 for William French et al.
U.S. Appl. No. 12/827,316, filed Jun. 30, 2010 for William French et al.

* cited by examiner

*Primary Examiner* — Mohamad Musleh
*Assistant Examiner* — Mangtin Lian
(74) *Attorney, Agent, or Firm* — Eugene C. Conser; Wade J. Brady, III; Frederick J. Telecky, Jr.

(57) ABSTRACT

A galvanic die has signal structures and a transformer structure that provide galvanically-isolated signal and power paths for a high-voltage die and a low-voltage die, which are both physically supported by the galvanic die and electrically connected to the signal and transformer structures of the galvanic die.

19 Claims, 90 Drawing Sheets

SEMICONDUCTOR STRUCTURE WITH GALVANICALLY-ISOLATED SIGNAL AND POWER PATHS

BACKGROUND OF THE INVENTION

1. Field of the Invention

The present invention relates to semiconductor structures and, more particularly, to a semiconductor structure with galvanically-isolated signal and power paths.

2. Description of the Related Art

Galvanic isolation refers to an isolation that prevents a first system from communicating with a second system by way of a flow of electrons from one system to the other system, but which allows the two systems to communicate in other ways. For example, the first system can transmit a signal to the second system using changes in inductance or capacitance, or by using optical or other means.

The first system and the second system commonly have separate power supplies, but a single power supply can also be used where the first system transfers galvanically-isolated power to the second system. A single power supply has the advantage of eliminating the power supply requirements of the second system. However, galvanic isolation with a single power supply tends to be bulky and expensive.

Galvanic isolation is typically implemented with a dielectric layer that lies between and electrically isolates a first conductor, such as the first coil of a transformer or the first plate of a capacitor, and a second conductor, such as the second coil of the transformer or the second plate of the capacitor. Galvanic isolation is commonly used in multi-die chips that operate with different ground potentials and require a large isolation voltage, such as $5000V_{RMS}$.

FIGS. 1A-1D show views that illustrate an example of a prior-art multi-die chip 100. FIG. 1A shows a plan view of multi-die chip 100, FIG. 1B shows a cross-sectional view of multi-die chip 100 taken along lines 1B-1B of FIG. 1A, FIG. 1C shows a plan view of multi-die chip 100 taken along lines 1C-1C of FIG. 1B, and FIG. 1D shows a cross-sectional view of multi-die chip 100 taken along lines 1D-1D of FIG. 1A.

As shown in FIGS. 1A-1D, multi-die chip 100 includes a non-conductive structure 110, a number of high-voltage planar coils 112 that are isolated by non-conductive structure 110, and a corresponding number of low-voltage planar coils 114 that are isolated by non-conductive structure 110. (Only one high-voltage planar coil 112 and one low-voltage planar coil 114 are shown for clarity.)

The high-voltage planar coils 112 and the low-voltage planar coils 114 are arranged in pairs and vertically aligned so that each high-voltage planar coil 112 is inductively coupled to a corresponding low-voltage planar coil 114. Each high-voltage planar coil 112 and vertically-aligned low-voltage planar coil 114 functions as an "air-core" transformer 116 that provides an inductively-coupled signal path. (Air core transformer 116 can also be used to transfer power. However, the very low efficiency makes this a poor approach to transferring power.)

As further shown in FIGS. 1A-1D, multi-die chip 100 also includes a high-voltage die 120 and a low-voltage die 122 that are adhesively attached to non-conductive structure 110. High-voltage die 120 is electrically connected to each of the high-voltage planar coils 112, and low-voltage die 122 is electrically connected to each of the low-voltage planar coils 114 to provide a number of galvanically-isolated signal paths.

Non-conductive structure 110, in turn, is adhesively attached to a die attach pad or paddle (DAP), which is part of a lead frame. (Alternately, low-voltage die 122 and multi-die chip 100 without low-voltage die 122 can be adhesively attached to a split DAP to isolate the substrates.)

Multi-die chip 100 additionally includes a toroidal transformer 124 that is adhesively attached to the top surface of non-conductive structure 110. Toroidal transformer 124 has a high-voltage input and a high-voltage output that are electrically connected to high-voltage die 120, and a low-voltage input and a low-voltage output that are electrically connected to low-voltage die 122.

As additionally shown in FIGS. 1A-1D, high-voltage die 120 is electrically connected to the high-voltage planar coils 112 and toroidal transformer 124, and low-voltage die 122 is electrically connected to the low-voltage planar coils 114 and toroidal transformer 124 by way of a number of bonding wires 126.

In operation, high-voltage die 120 transmits data to low-voltage die 122 by encoding the data, and then placing encoded data signals in the form of pulses, RF waveforms, or glitches onto a high-voltage planar coil 112. The signals are inductively coupled to a low-voltage planar coil 114, and are then detected and decoded by low-voltage die 122. (Signals can also be sent from low-voltage die 122 to high-voltage die 120 in the same manner using a different pair of vertically-aligned planar coils.) In addition, toroidal transformer 124 transfers power from high-voltage die 120 to low-voltage die 122 based on the ratio of turns.

Although multi-die chip 100 provides galvanic isolation for both the signal and power paths, toroidal transformer 124 tends to be bulky and expensive to manufacture. Thus, there is a need for a smaller and less expensive multi-die chip that provides galvanic isolation for both the signal and power paths.

BRIEF DESCRIPTION OF THE DRAWINGS

FIG. 1A is a plan view of multi-die chip 100. FIG. 1B is a cross-sectional view of multi-die chip 100 taken along lines 1B-1B of FIG. 1A. FIG. 1C is a plan view of multi-die chip 100 taken along lines 1C-1C of FIG. 1B. FIG. 1D is a cross-sectional view of multi-die chip 100 taken along lines 1D-1D of FIG. 1A.

FIG. 2A is a plan view. FIG. 2B is a cross-sectional view taken along lines 2B-2B of FIG. 2A. FIG. 2C is a cross-sectional view taken along lines 2C-2C of FIG. 2A. FIG. 2D is a cross-sectional view taken along lines 2D-2D of FIG. 2A. FIG. 2E is a cross-sectional view taken along lines 2B-2B of FIG. 2A.

FIGS. 3A-41A are plan views. FIGS. 3B-41B are cross-sectional views taken along lines 3B-3B through 41B-41B of FIGS. 3A-41A, respectively. FIGS. 3C-41C are cross-sectional views taken along lines 3C-3C through 41C-41C of FIGS. 3A-41A, respectively. FIGS. 3D-41D are cross-sectional views taken along lines 3D-3D through 41D-41D of FIGS. 3A-41A, respectively.

FIG. 42A is a plan view. FIG. 42B is a cross-sectional view taken along lines 42B-42B of FIG. 42A. FIG. 42C is a cross-sectional view taken along lines 42C-42C of FIG. 42A. FIG. 42D is a cross-sectional view taken along lines 42D-42D of FIG. 42A.

DETAILED DESCRIPTION OF THE INVENTION

Figure 1A:
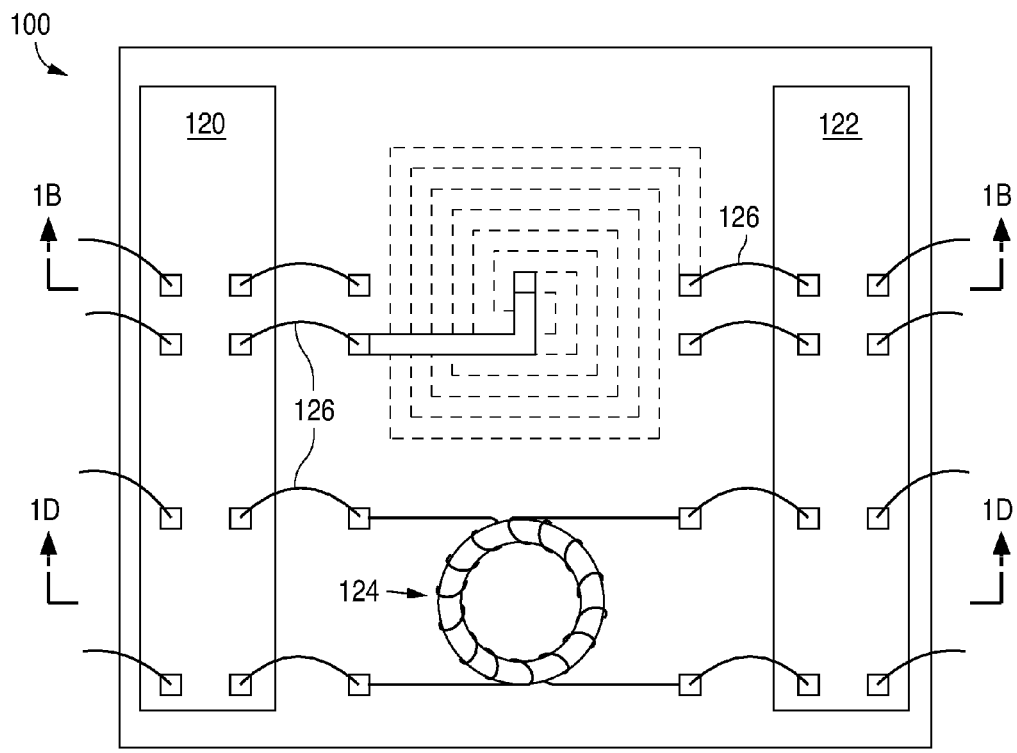
FIGS. 1A-1D are views illustrating an example of a prior-art multi-die chip 100.
Figure 1B:
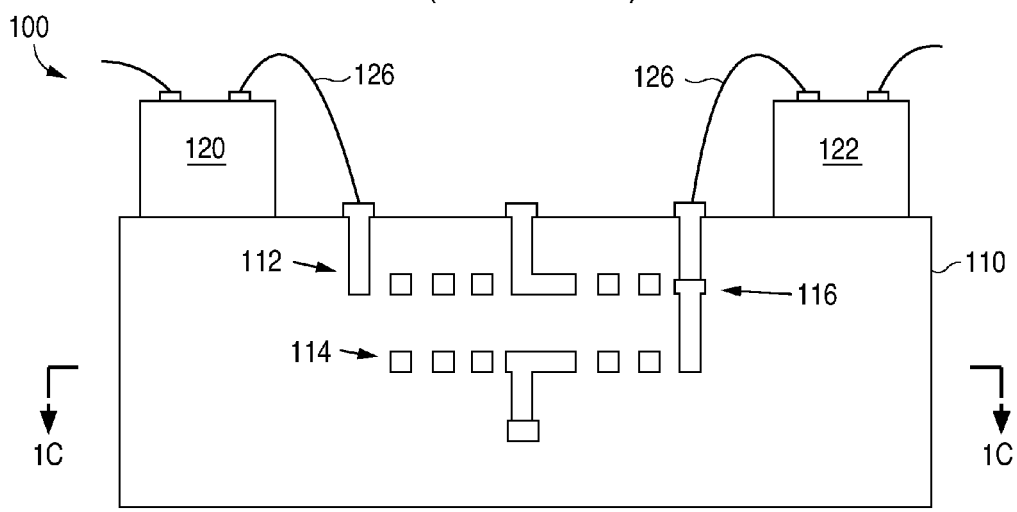
Figure 1C:
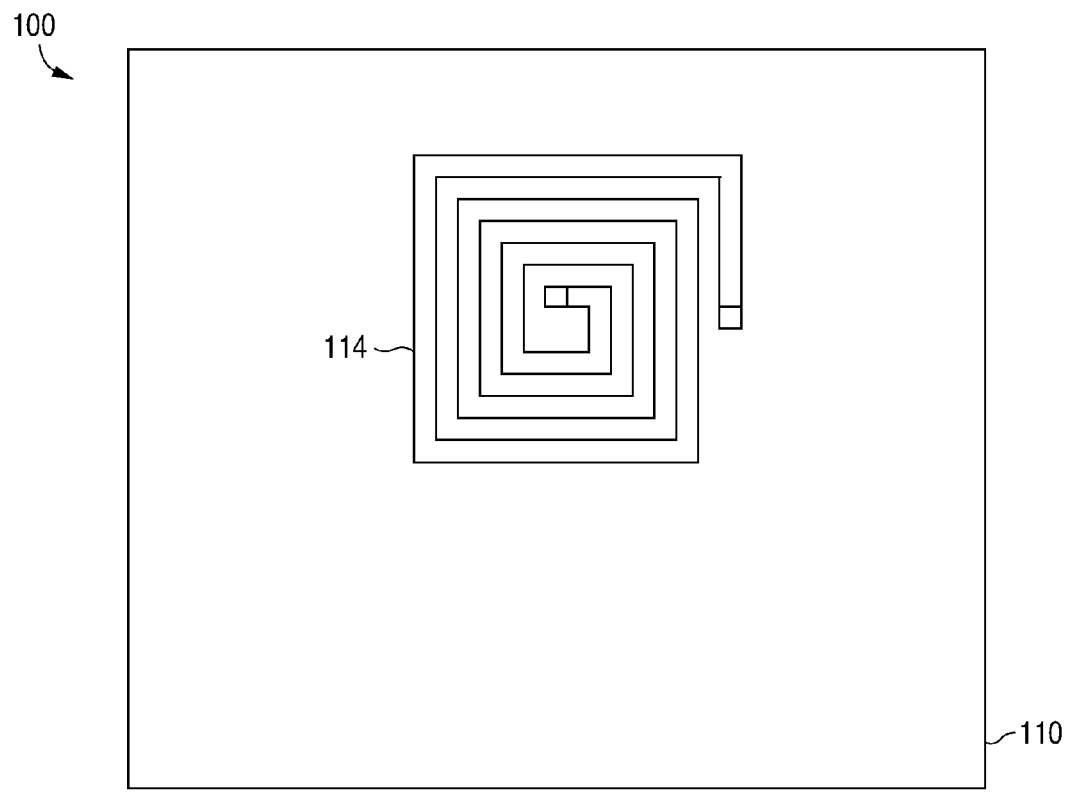
Figure 1D:
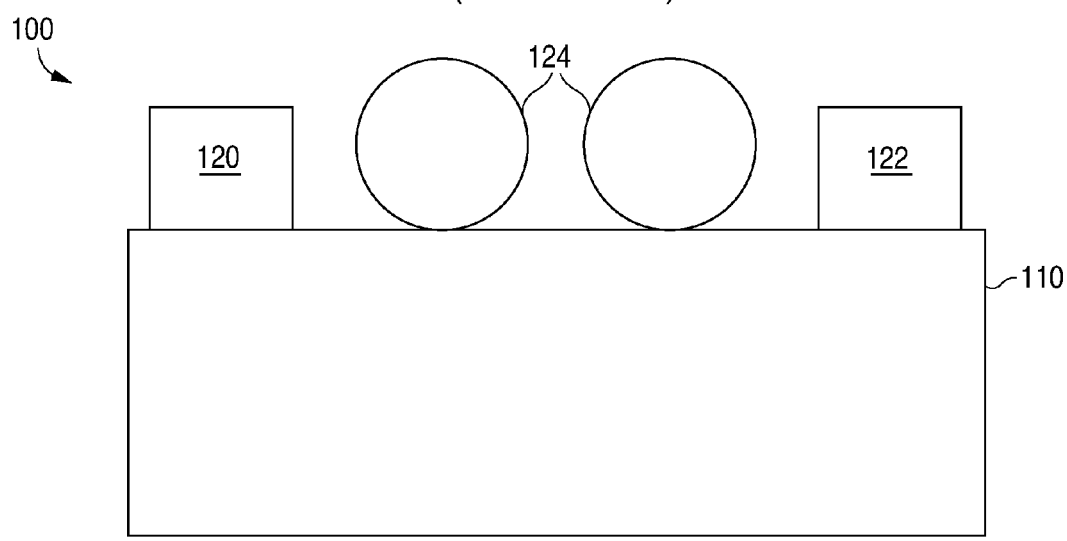
Figure 2A:
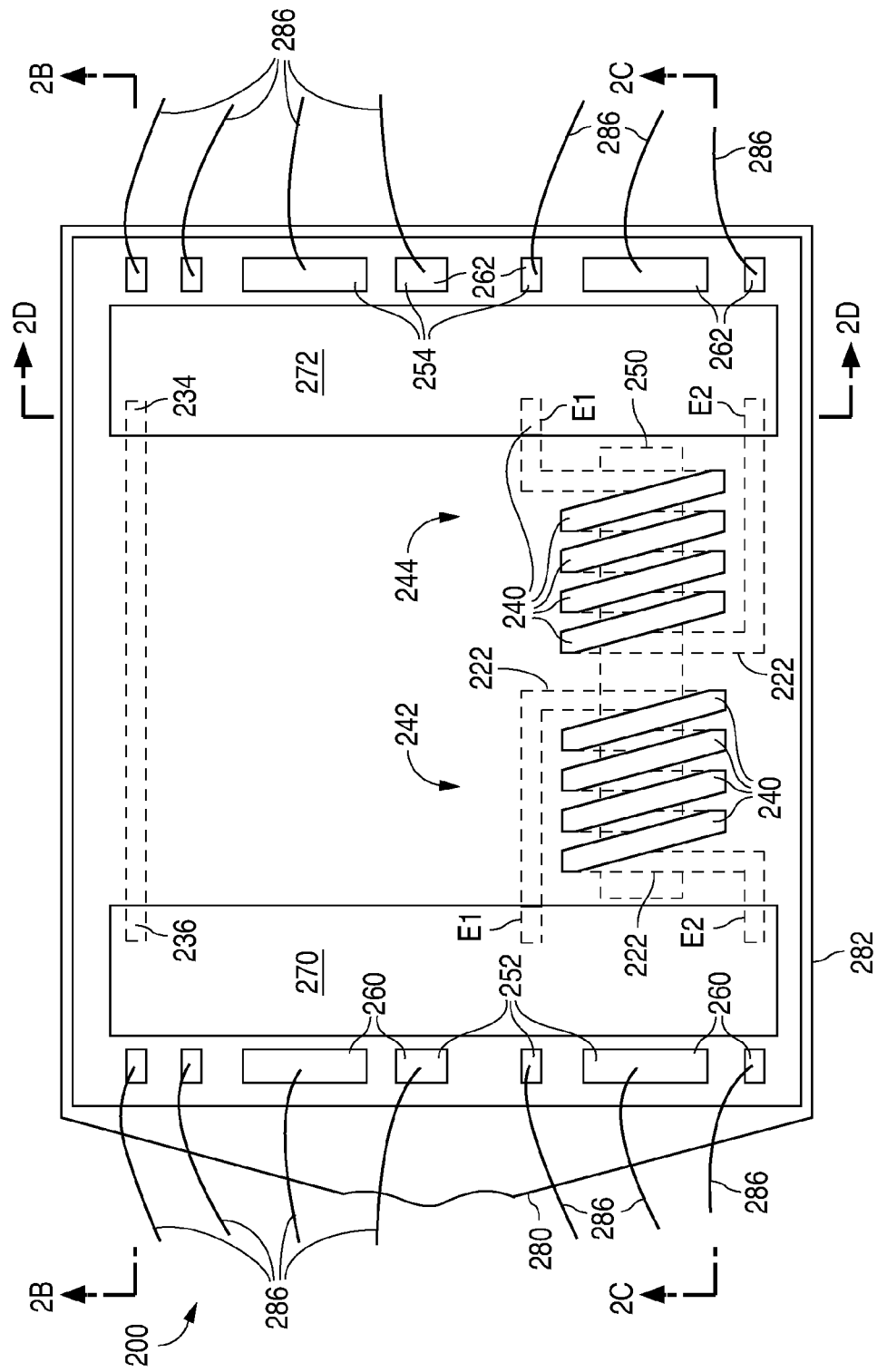
FIGS. 2A-2E are views illustrating an example of a galvanically-isolated, multi-die chip 200 in accordance with the present invention.
Figure 2B:
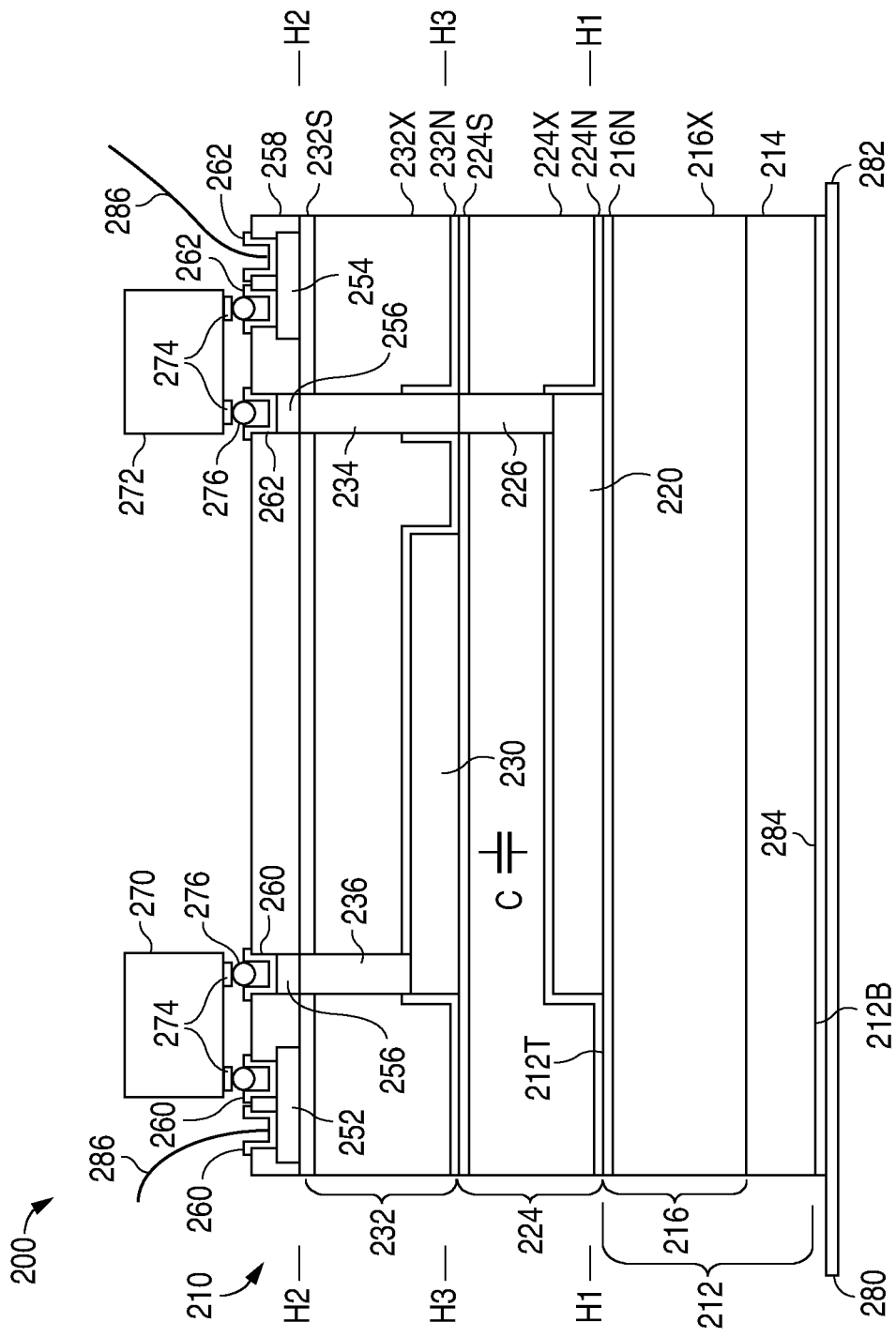
Figure 2C:
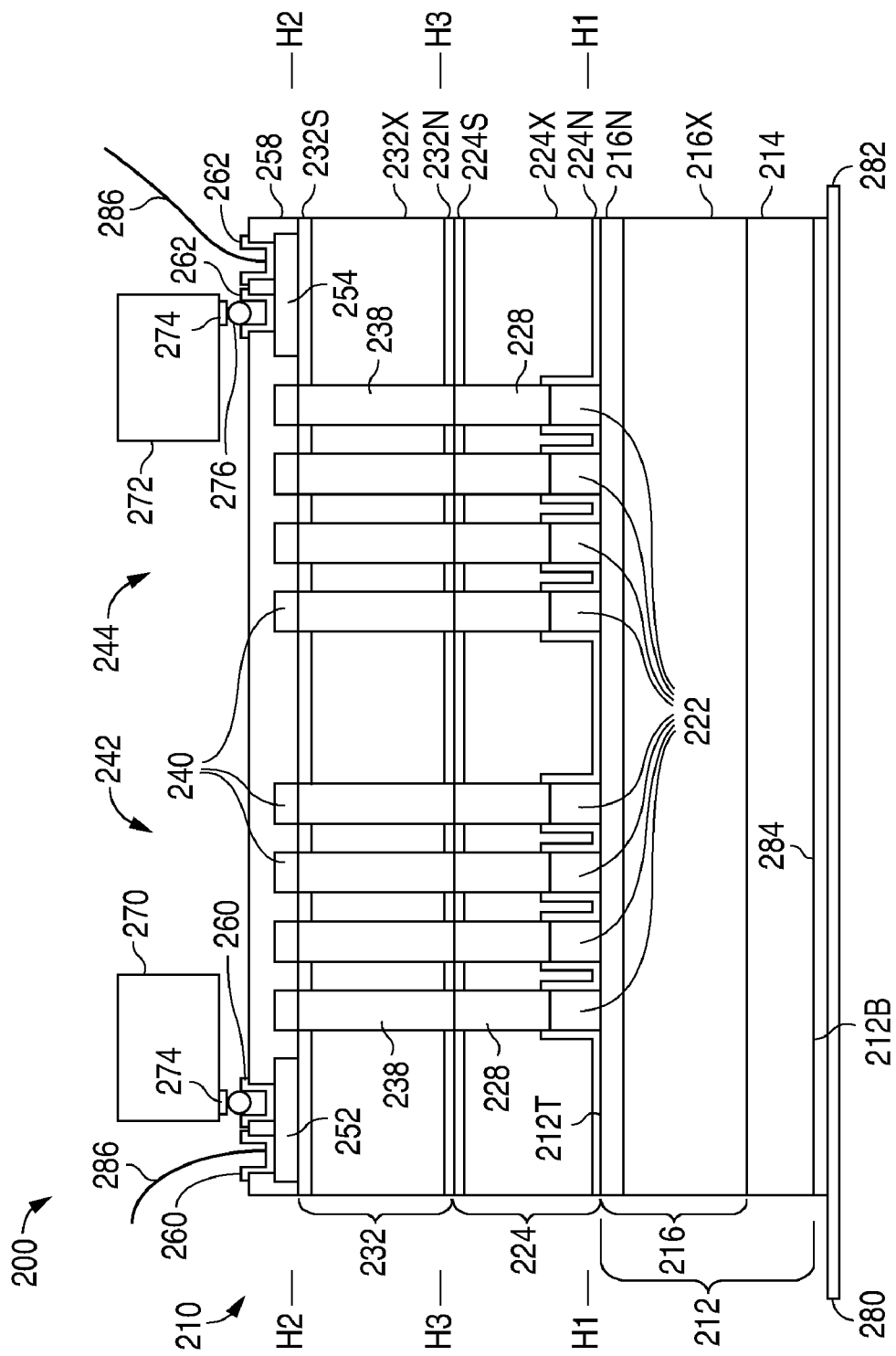
Figure 2D:
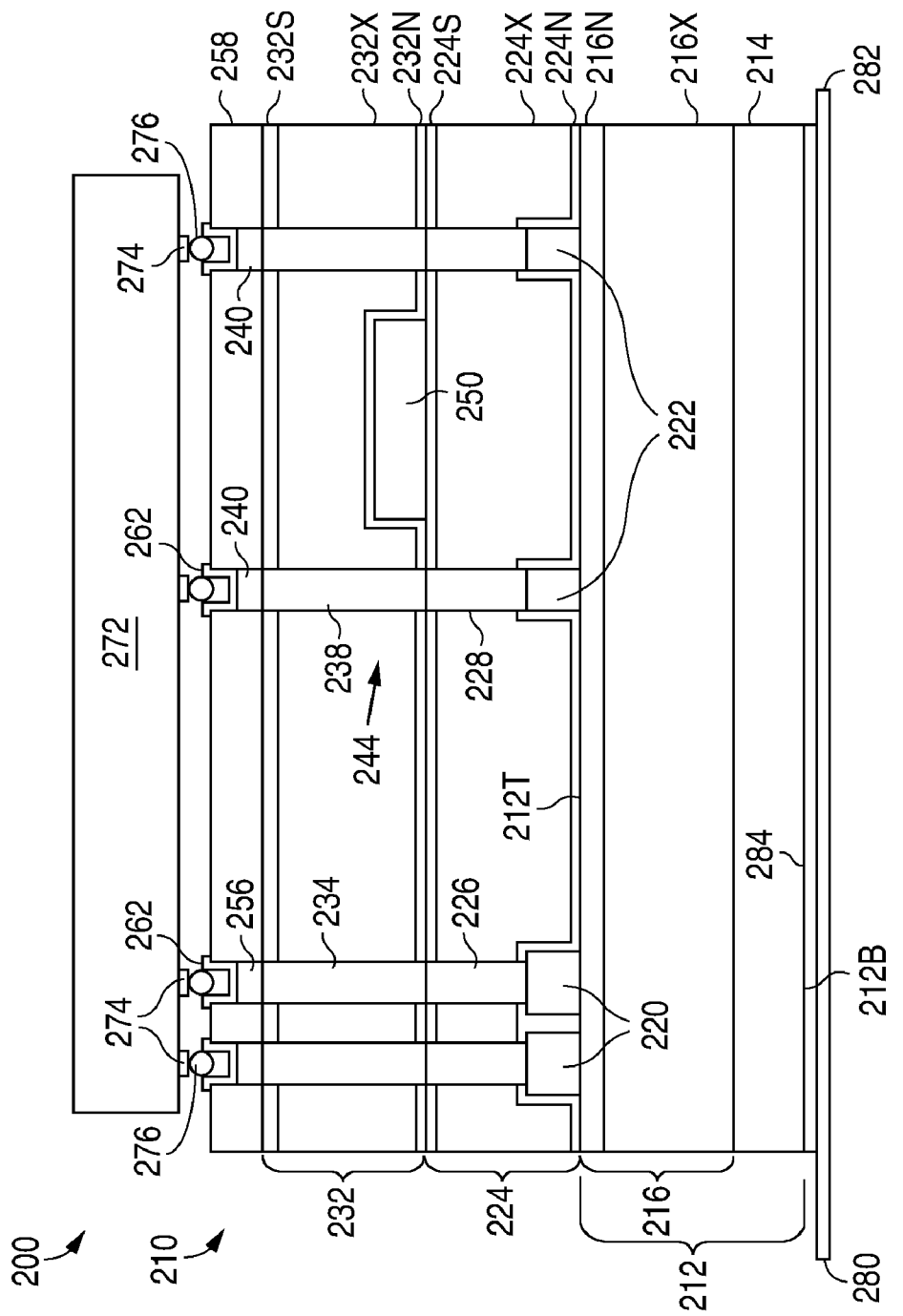
Figure 2E:
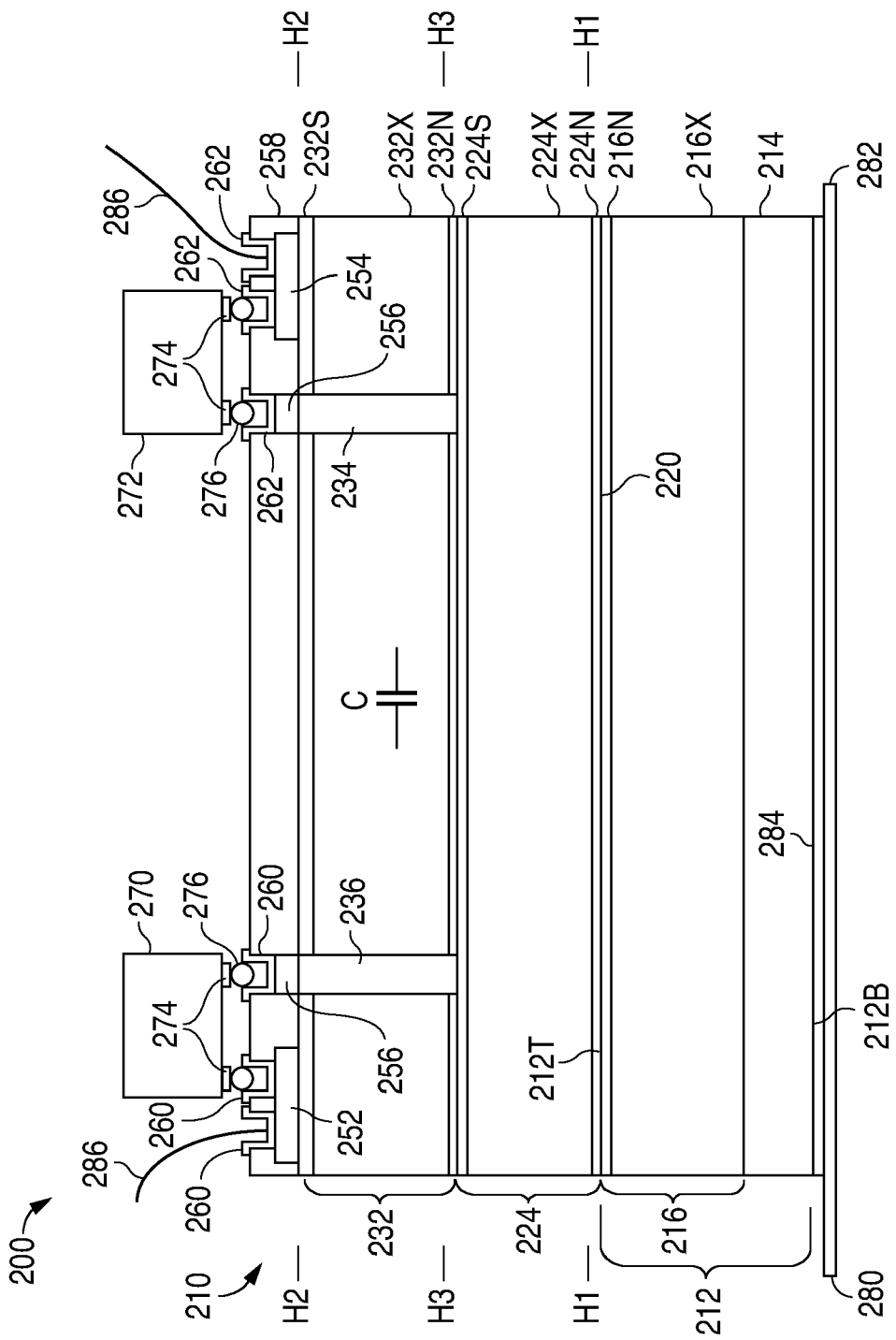

FIGS. 2A-2E show views that illustrate an example of a galvanically-isolated, multi-die chip 200 in accordance with the present invention. FIG. 2A shows a plan view, while FIG. 2B shows a cross-sectional view taken along lines 2B-2B of FIG. 2A, FIG. 2C shows a cross-sectional view taken along lines 2C-2C of FIG. 2A, FIG. 2D shows a cross-sectional view taken along lines 2D-2D of FIG. 2A, and FIG. 2E shows a cross-sectional view taken along lines 2B-2B of FIG. 2A.

As described in greater detail below, the present invention provides galvanic isolation between a high-voltage die and a low-voltage die for both signal and power paths by utilizing a galvanic isolation die that includes both signal structures for transferring signals and a transformer structure for transferring power.

As shown in FIGS. 2A-2D, multi-die chip 200 includes a galvanic isolation die 210. Galvanic isolation die 210, in turn, includes a semiconductor structure 212 that has a bottom surface 212B and a non-conductive top surface 212T. In the present example, top surface 212T is completely non-conductive such that no conductive structure both lies above top surface 212T and touches a conductive region that touches and lies below top surface 212T. As a result, no conductive structure extends through top surface 212T of semiconductor structure 212.

Also in the present example, semiconductor structure 212 includes a conventionally-fabricated substrate 214, and an overlying non-conductive structure 216 that touches the top surface of substrate 214. Non-conductive structure 216 can be implemented with, for example, an oxide layer 216X that touches the top surface of substrate 214, and a layer of silicon nitride 216N that touches the top surface of oxide layer 216X.

As an alternative to a non-conductive layer that overlies a substrate material, other materials with non-conductive top surfaces, such as glass (quartz, borosilicate glass (BSG), and diamond), can also be used to implement semiconductor structure 212. One advantage of silicon over glass is that a silicon substrate can be easily back ground to accommodate different package size limitations. One advantage of glass over silicon is that glass eliminates parasitic coupling and losses associated with a conductive substrate.

As further shown in FIGS. 2A-2D, galvanic isolation die 210 includes a number of low-voltage plates 220 that touch the non-conductive top surface 212T of semiconductor structure 212. (Only one low-voltage plate 220 is shown for clarity.) Galvanic isolation die 210 also includes a number of lower coil structures 222 that touch the non-conductive top surface 212T of semiconductor structure 212.

The lower coil structures 222, which lie in the same horizontal plane as the low-voltage plates 220, are horizontally spaced apart from each other and from each low-voltage plate 220. In the present example, both the low-voltage plates 220 and the lower coil structures 222 are implemented with metal.

In addition, galvanic isolation die 210 includes a non-conductive structure 224 that touches the non-conductive top surface 212T of semiconductor structure 212, the low-voltage plates 220, and the lower coil structures 222. Non-conductive structure 224 can be implemented with, for example, a layer of silicon nitride 224N that touches the non-conductive top surface 212T of semiconductor structure 212, a layer of silicon dioxide 224X that touches the top surface of nitride layer 224N, and a layer of silicon nitride 224S that touches the top surface of oxide layer 224X.

One of the advantages of using nitride as the top layer of non-conductive structure 216 and nitride as the bottom layer of non-conductive structure 224 is that the two nitride layers surround the low-voltage plates 220 and the lower-coil structures 222 (except for points of electrical connection).

For example, when the low-voltage plates 220 and the lower-coil structures 222 are formed from copper, the two nitride layers prevent copper diffusion. Other materials, such as tantalum, can also be used to provide a barrier to copper and prevent copper diffusion. When conductive materials such as tantalum are utilized, the conductive materials must be etched after deposition to prevent the copper structures from being shorted to each other.

Galvanic isolation die 210 also includes a number of lower plate via structures 226 that extend through non-conductive structure 224 to make electrical connections with the low-voltage plates 220. (Only one lower plate via structure 226 is shown for clarity.) Galvanic isolation die 210 also includes a number of coil side-wall via structures 228 that extend through non-conductive structure 224 to make electrical connections with each end of each lower coil structure 222.

In addition, the lower plate via structures 226 and the coil side-wall via structures 228 can each include an external barrier layer. For example, when the lower plate via structures 226 and the coil side-wall via structures 228 are formed from copper, the external barrier layer can be implemented with nitride to prevent copper diffusion into non-conductive structure 224.

As further shown in FIGS. 2A-2D, galvanic isolation die 210 includes a number of high-voltage plates 230 that touch the top surface of non-conductive structure 224 directly vertically over the low-voltage plates 220. (Only one high-voltage plate 230 is shown for clarity.) Galvanic isolation die 210 also includes a non-conductive structure 232 that touches non-conductive structure 224, the high-voltage plates 230, the lower-plate via structures 226, and the coil side-wall via structures 228.

Non-conductive structure 232 can be implemented with, for example, a layer of silicon nitride 232N that touches non-conductive structure 224, the high-voltage plates 230, the lower-plate via structures 226, and the coil side-wall via structures 228, a layer of silicon dioxide 232X that touches the top surface of nitride layer 232N, and a layer of silicon nitride 232S that touches the top surface of oxide layer 232X.

One of the advantages of using nitride as the top layer of non-conductive structure 224 and nitride as the bottom layer of non-conductive structure 232 is that the two nitride layers surround the high-voltage plates 230 (except for points of electrical connection). For example, when the high-voltage plates 230 are formed from copper, the two nitride layers prevent copper diffusion.

Further, galvanic isolation die 210 includes a number of lower plate via structures 234 that extend through non-conductive structure 232 to make electrical connections with the lower plate via structures 226, and a number of upper plate via structures 236 that extend through non-conductive structure 232 to make electrical connections with the high-voltage plates 230. (Only one lower plate via structure 234 and one upper plate via structure 236 are shown for clarity.) Galvanic isolation die 210 also includes a number of coil side-wall via structures 238 that extend through non-conductive structure 232 to make electrical connections with the coil side-wall via structures 228.

In addition, the lower plate via structures 234, the upper plate via structures 236, and the coil side-wall via structures 238 can each include an external barrier layer. For example, when the lower plate via structures 234, the upper plate via structures 236, and the coil side-wall via structures 238 are formed from copper, the external barrier layers can be implemented with nitride to prevent copper diffusion into non-conductive structure 232.

Further, galvanic isolation die 210 includes a number of upper coil structures 240 that touch the top surface of non-conductive structure 232 with the ends touching the coil side-wall via structures 238. In the present example, both the high-voltage plates 230 and the upper coil structures 222 are implemented with metal.

The lower plate via structures 226 are connected to the opposite ends of the lower coil structures 222, the lower plate via structures 234 are connected to the lower plate via structures 226, and the opposite ends of the upper coil structures 240 touch the coil side-wall via structures 238 to form a high-voltage coil 242 with opposite ends E1 and E2, and a low-voltage coil 244 with opposite ends E1 and E2 that lies horizontally adjacent to high-voltage coil 242.

Galvanic isolation die 210 further includes a magnetic core structure 250 that touches the top surface of non-conductive structure 224, and lies within the loops of high-voltage coil 242 and the loops of low-voltage coil 244. Galvanic isolation die 210 also includes a number of high-voltage strips 252 that touch the top surface of non-conductive structure 232 to provide points of external high-voltage electrical connection, and a number of low-voltage strips 254 that touch the top surface of non-conductive structure 232 to provide points of external low-voltage electrical connection.

Galvanic isolation die 210 additionally includes a number of via cap structures 256 that touch the lower plate via structures 234 and the upper plate via structures 236. In the present example, the high-voltage strips 252, the low-voltage strips 254, and the via cap structures 256 are implemented with metal.

Further, galvanic isolation die 210 includes a passivation layer 258 that touches non-conductive structure 232 and the top surfaces of the upper coil structures 240, the high-voltage strips 252, the low-voltage strips 254, and the via cap structures 256. Passivation layer 258 can be implemented with, for example, a layer of oxide and an overlying layer of nitride.

One of the advantages of using nitride as the top layer of non-conductive structure 232 and nitride as passivation layer 258 or the bottom layer of passivation layer 258 is that the two nitride layers surround the upper coil structure 240, the high-voltage strips 252, the low-voltage strips 254, and the via cap structures 256 (except for points of electrical connection). For example, when the upper coil structure 240, the high-voltage strips 252, the low-voltage strips 254, and the via cap structures 256 are formed from copper, the two nitride layers prevent copper diffusion.

Galvanic isolation die 210 also includes a number of high-voltage pads 260 that extend through passivation layer 258 to touch and make electrical connections with the high-voltage strips 252, to touch the via cap structures 256 and make electrical connections with the upper plate via structures 236, to touch the upper coil structures 240 and make electrical connections with the ends E1 and E2 of high-voltage coil 242.

Galvanic isolation die 210 further includes a number of low-voltage pads 262 that extend through passivation layer 258 to touch and make electrical connections with the low-voltage strips 254, to touch the via cap structures 256 and make electrical connections with the lower plate via structures 234, to touch the upper coil structures 240 and make electrical connections with the ends E1 and E2 of low-voltage coil 244.

As shown in FIGS. 2A-2D, multi-die chip 200 also includes a high-voltage die 270 and a low-voltage die 272 that are connected to galvanic isolation die 210. High-voltage die 270, which can operate with a ground voltage of, for example, 1000V, and low-voltage die 272, which can operate with a ground voltage of, for example, 0V, each have a number of bond pads 274.

As further shown in FIGS. 2A-2D, high-voltage die 270 and low-voltage die 272 can be connected to galvanic isolation die 210 as flip chips such that the bond pads 274 on high-voltage die 270 are electrically connected to the high-voltage bond pads 260 (which are connected to the upper plate via structures 236 and the ends E1 and E2 of high-voltage coil 242), and the bond pads 274 on low-voltage die 272 are electrically connected to the low-voltage bond pads 262 (which are connected to the lower plate via structures 234 and the ends E1 and E2 of low-voltage coil 244 by way of melted solder balls 276. In a flip chip mounting, a conductive material, such as the melted solder, provides both electrical and physical connection to galvanic isolation die 210.

As additionally shown in FIGS. 2A-2D, multi-die chip 200 includes a lead frame 280 which has a single DAP 282 that is physically attached to the bottom surface of galvanic isolation die 210 (e.g., the bottom surface 212B of substrate structure 212). Galvanic isolation die 210 can be physically connected to DAP 282 using an adhesive 284 such as, for example, a conductive or non-conductive epoxy or die attach film.

As further shown in FIGS. 2A-2D, multi-die chip 200 includes a number of bonding wires 286 that electrically connect the high-voltage pads 260 on the high-voltage strips 252, which are connected to high-voltage die 270, and the low-voltage pads 262 on the low-voltage strips 254, which are connected to low-voltage die 272, to external connection structures (e.g., pins or pads) on lead frame 280.

In operation, high-voltage die 270 transmits data to low-voltage die 272 by encoding the data, and then placing encoded data signals in the form of pulses, RF waveforms, or glitches onto a high-voltage plate 230. As shown in FIG. 2B, high-voltage plate 230 and low-voltage plate 220 function as a capacitor C that provides a galvanically-isolated signal path.

As a result, the signals on the high-voltage plate 230 are capacitively coupled to a low-voltage plate 220. The signals on the low-voltage plate 220 are then detected and decoded by low-voltage die 272. Power, on the other hand, is transferred by way of high-voltage coil 242 and low-voltage coil 244 which, together with magnetic core 250, function as a transformer 290.

To withstand a voltage difference of $5000V_{RMS}$ between high-voltage upper plate 230 and low-voltage plate 220, the thickness of dielectric layer 224 must be sufficient to withstand the total voltage difference (e.g., $5000V_{RMS}$) without dielectric breakdown. In addition, the lateral separation distance between conductors must be sufficient to prevent lateral dielectric breakdown in two instances.

The first instance is so that the molding compound which is used to encapsulate lead frame 280, galvanic isolation die 210, high-voltage die 270, low-voltage die 272, and the bonding wires 286 can withstand the total voltage difference (e.g., $5KV_{RMS}$) without dielectric breakdown. The second instance is to prevent lateral breakdown between high-voltage plate 230 and low-voltage plate 220 through an overlying passivation layer and/or mold compound.

Thus, multi-die chip 200 includes a non-conductive structure 224, 232, and a transformer 290 that touches non-conductive structure 224, 232. Transformer 290, in turn, includes a first coil 242, a second coil 244 that is spaced apart from first coil 242, and a magnetic core structure 250 that lies within and extends completely through first coil 242 and second coil 244.

First coil 242 and second coil 244 each has a number of lower coil structures 222 that lie in a first horizontal plane H1 within non-conductive structure 224, and a number of upper coil structures 240 that lie in a second horizontal plane H2 within non-conductive structure 224 which, as shown in FIG. 2C, lies above first horizontal plane H1.

Multi-die chip 200 also includes a signal structure that touches non-conductive structure 224, 232. The signal structure has a pair of dielectrically-isolated metal members that provides a galvanically-isolated signal path. In the present example, as shown in FIG. 2B, the signal structure is implemented as a vertical capacitor C, where low-voltage plate 220 and high-voltage plate 230 are examples of the pair of dielectrically-isolated metal members.

In addition, low-voltage plate 220 is shown as lying in the same horizontal plane H1 as the lower coil structures 222, while high-voltage plate 230 is shown as lying in a third horizontal plane H3 that lies between the first and second horizontal planes H1 and H2. Alternately, high-voltage plate 230 can be formed to lie in the second horizontal plane H2.

Further, if high-voltage plate 230 lies in the second horizontal plane H2, then low-voltage plate 220 can be formed to lie in the third horizontal plane H3. As a result, a first metal member of the pair of metal members lies in a horizontal plane that lies above the first horizontal plane H1, while a second metal member of the pair of metal members lies in a horizontal plane that lies below the second horizontal plane H2.

Although illustrated as a vertical capacitor C in FIG. 2B, the capacitor can alternately be implemented as a comb structure (a number of vertically alternating low-voltage and high-voltage plates), or as a horizontal capacitor. FIG. 2E shows an example of a horizontal capacitor C where via structure 236 functions as the high-voltage capacitor plate, and via structure 234 functions as the low-voltage capacitor plate. (Additional via structures can also be used to extend the depths of the plates.) Further, the signal structure can alternately be implemented as a transformer, where the first and second coils of a signal path air-core transformer are examples of the pair of dielectrically-isolated metal members.

Multi-die chip 200 further includes a cap structure that touches the non-conductive structure and forms the top surface of a galvanic isolation die. The cap structure can include passivation layer 258, high-voltage metal strip 4010, low-voltage metal strip 4012, the high-voltage pads 260, and the low-voltage pads 262. Multi-die chip 200 also includes a high-voltage die 270 and a low-voltage die 280 that are physically and electrically attached to the galvanic isolation die.

One of the advantages of multi-die chip 200 over prior-art multi-die chip 100 is that multi-die chip 200 integrates a galvanically-isolated power transformer into a galvanic isolation die. The integration allows a galvanically-isolated power transformer to be formed within a semiconductor fabrication sequence, thereby reducing cost and eliminating the time and cost associated with attaching and connecting a transformer to the top surface of a galvanic isolation die. Additionally, using semiconductor lithography enables a smaller and more controllably precise structure versus the printed circuit board approaches used in the past.

Figure 3A:
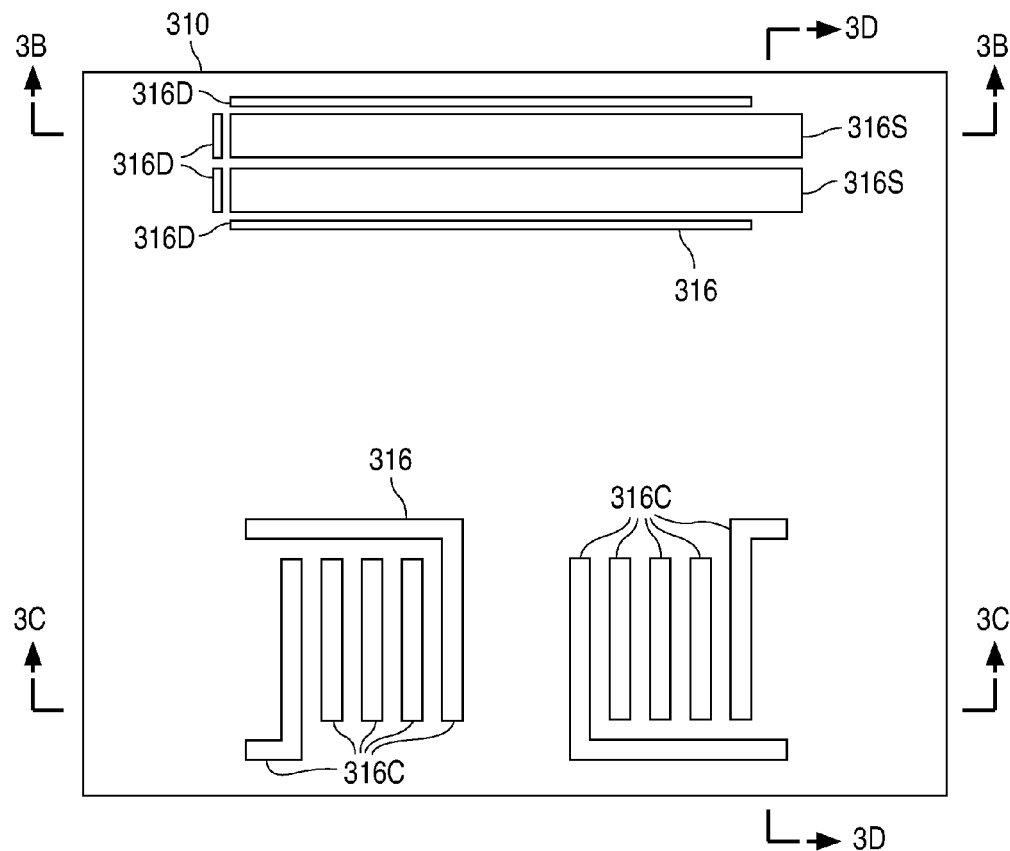
FIGS. 3A-3D through FIGS. 41A-41D are a series of views illustrating an example of a method of forming a galvanically-isolated multi-die chip in accordance with the present invention.
Figure 3B:
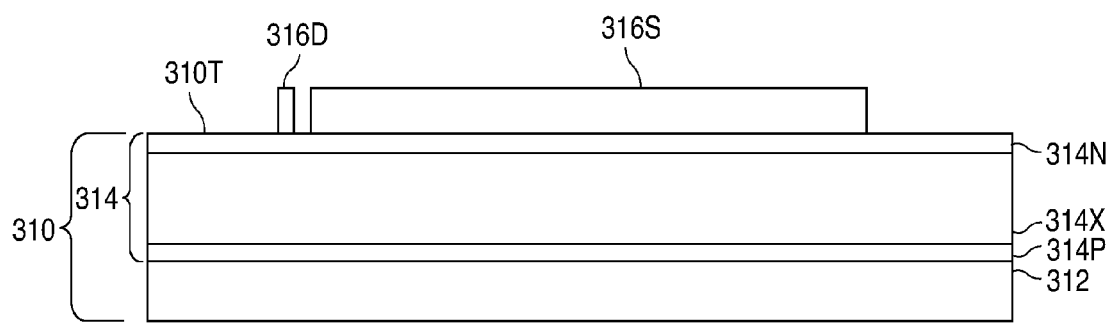
Figure 3C:
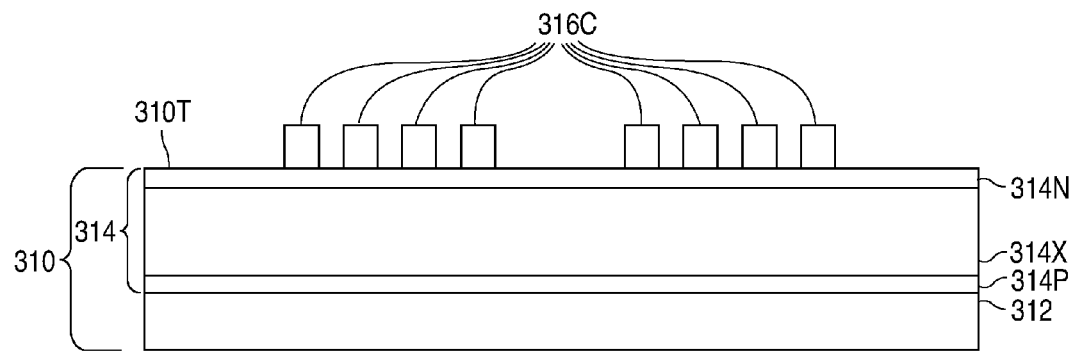
Figure 3D:
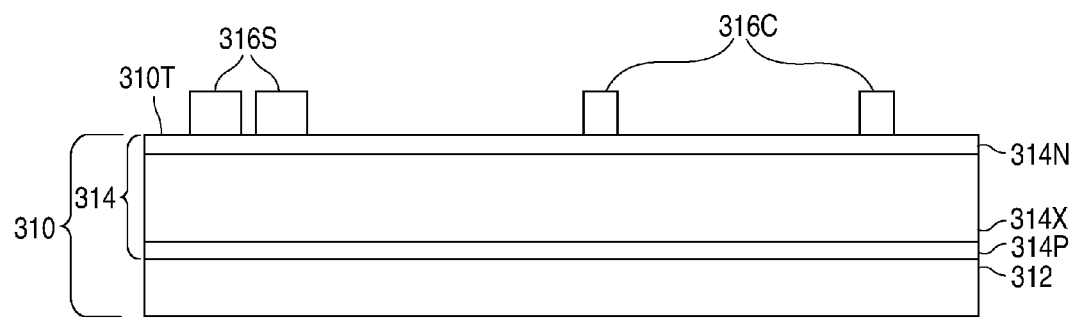
Figure 4A:
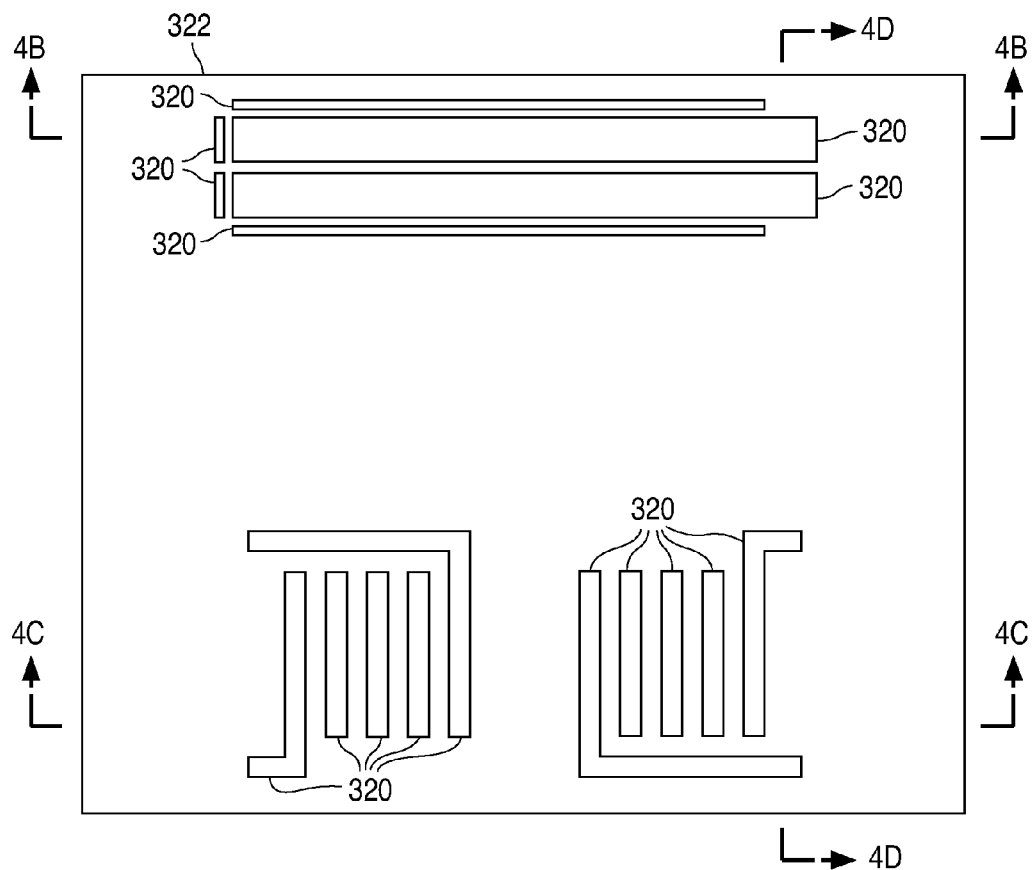
Figure 4B:
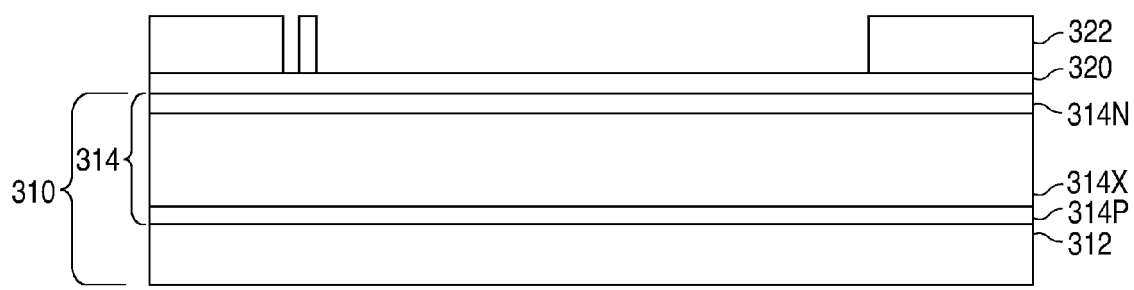
Figure 4C:
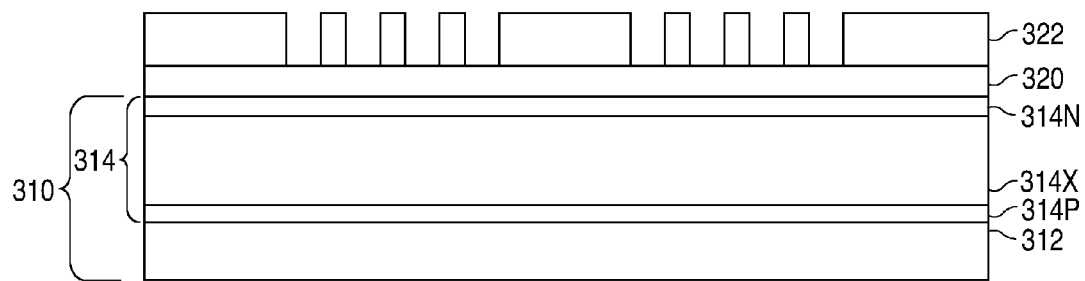
Figure 4D:
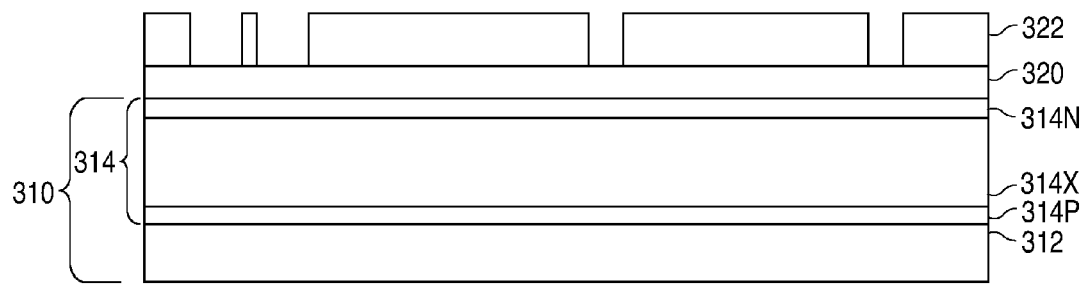
Figure 5A:
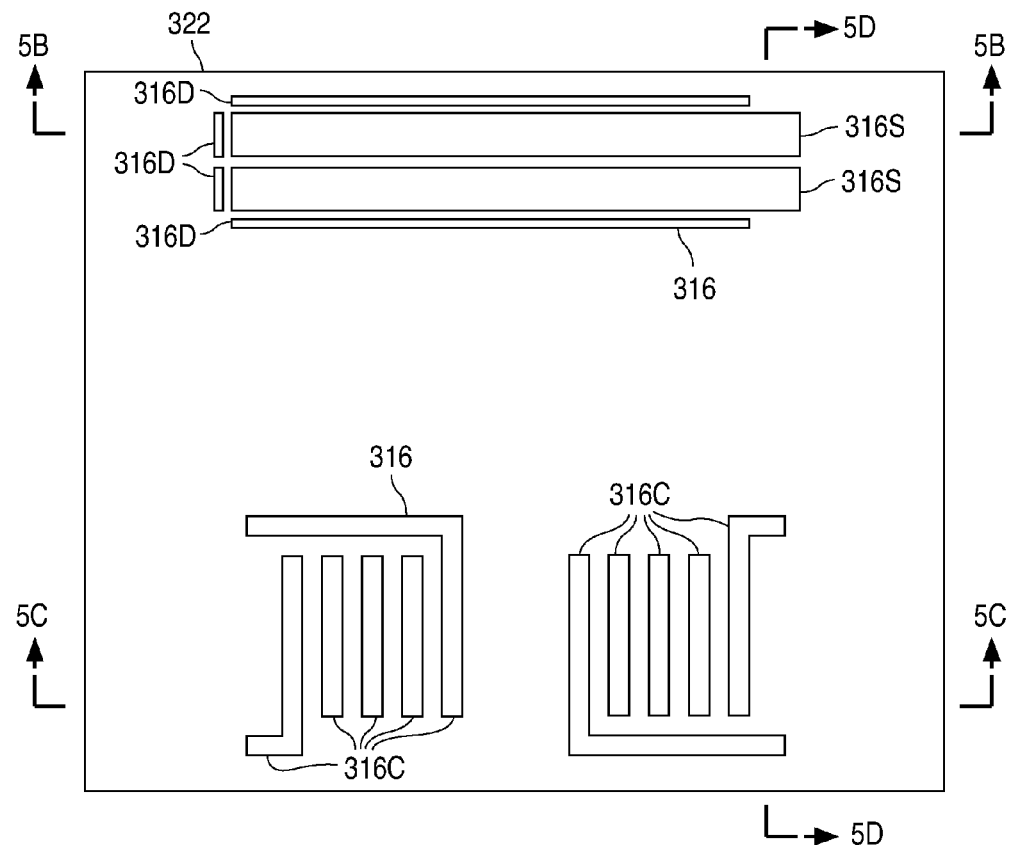
Figure 5B:
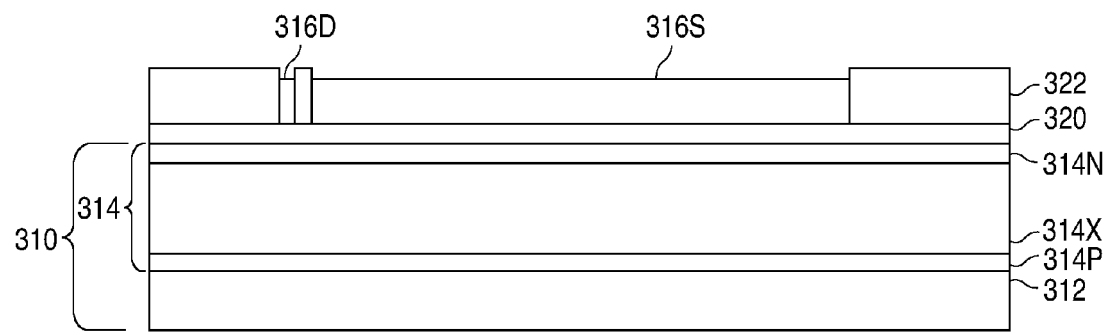
Figure 5C:
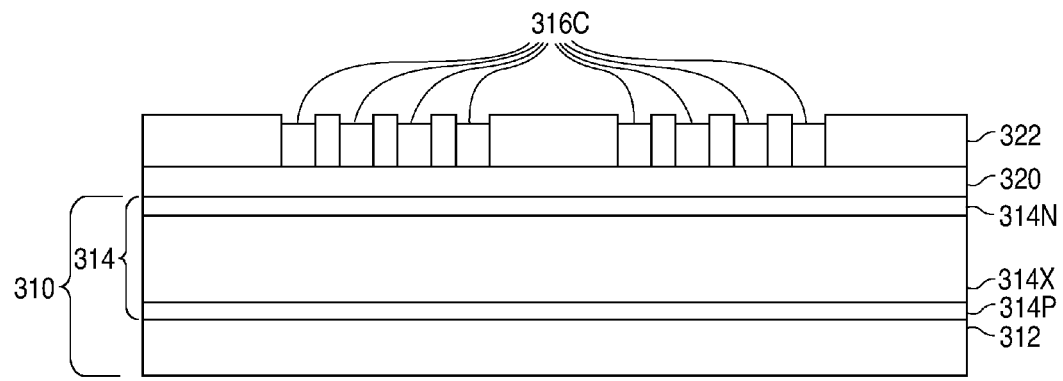
Figure 5D:
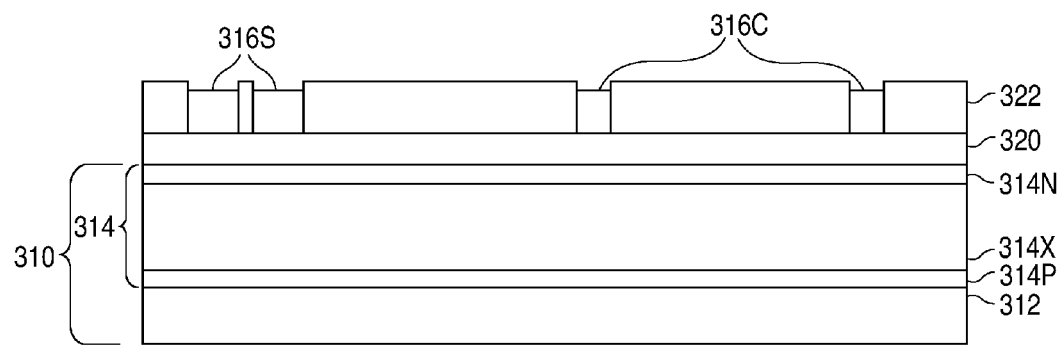
Figure 6A:
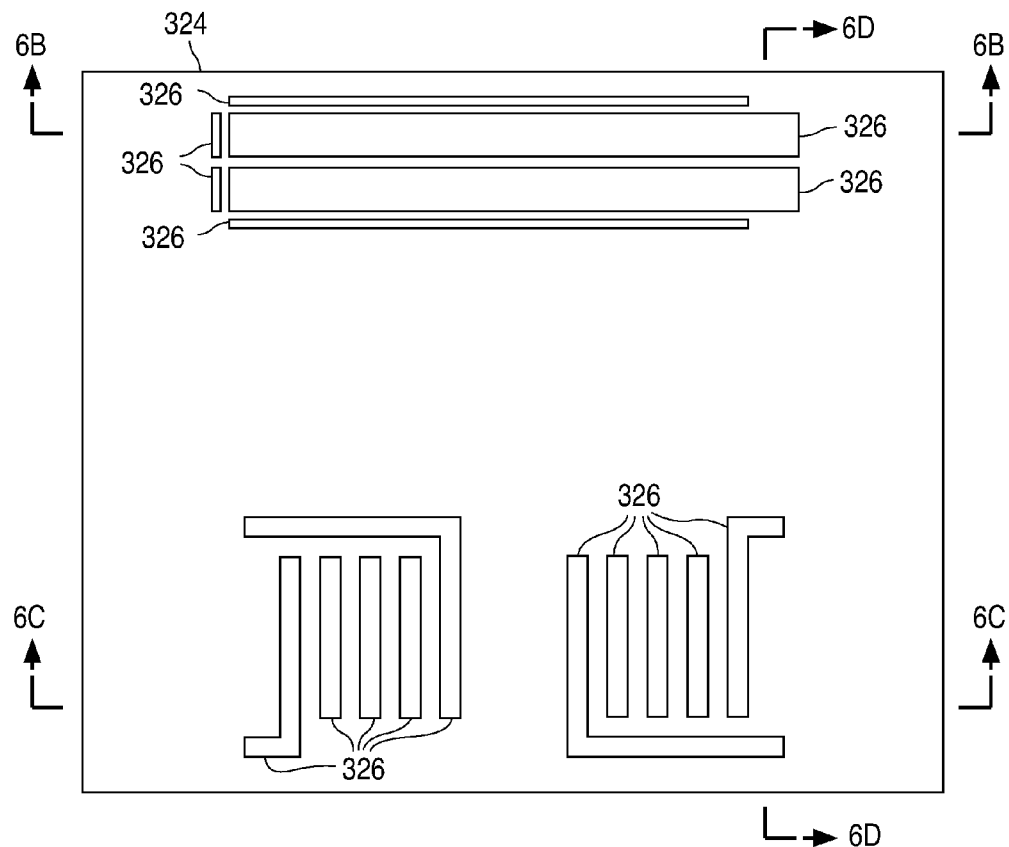
Figure 6B:
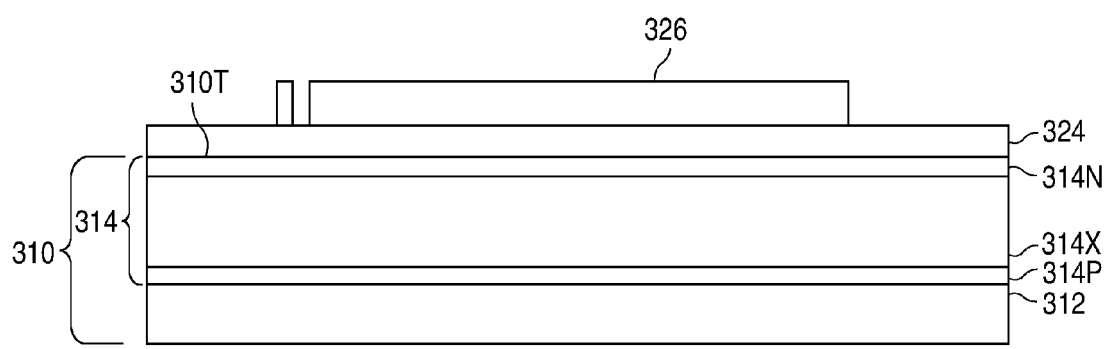
Figure 6C:
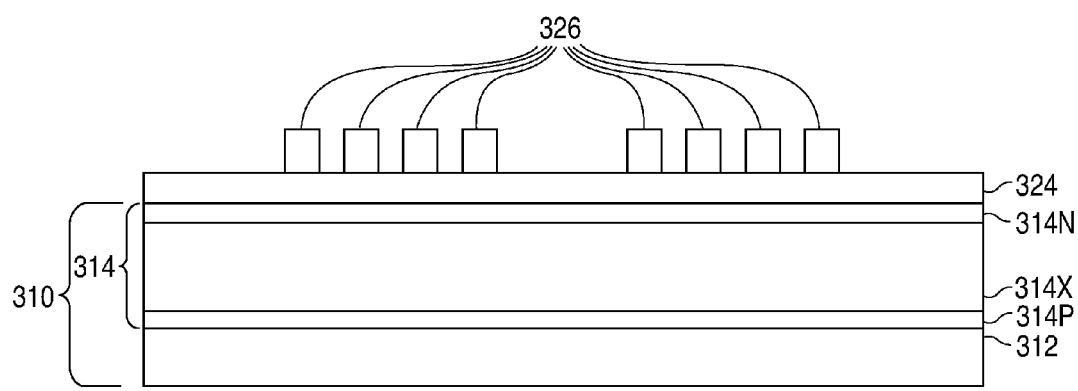
Figure 6D:
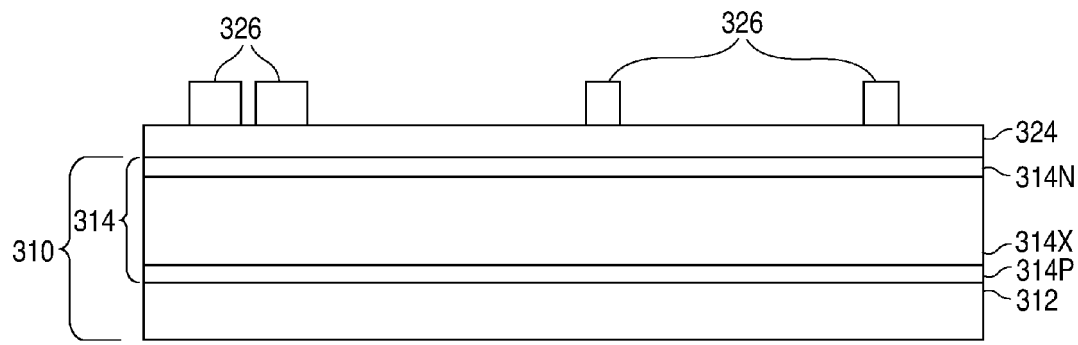
Figure 7A:
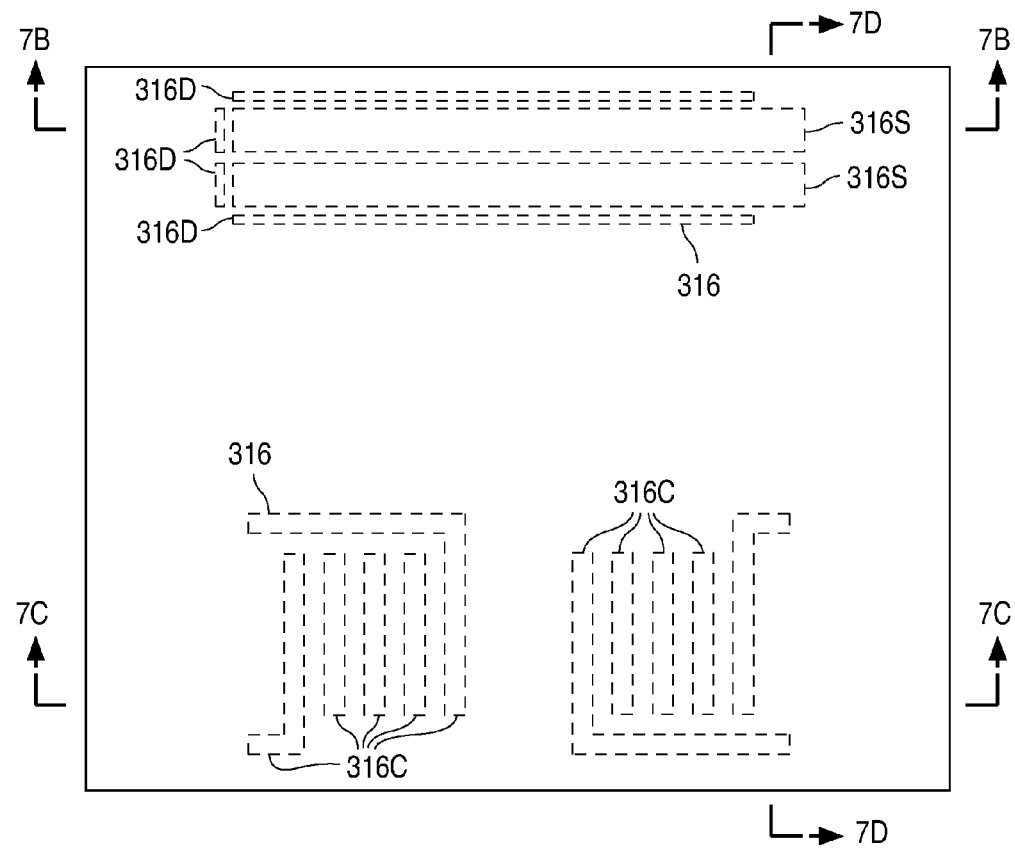
Figure 7B:
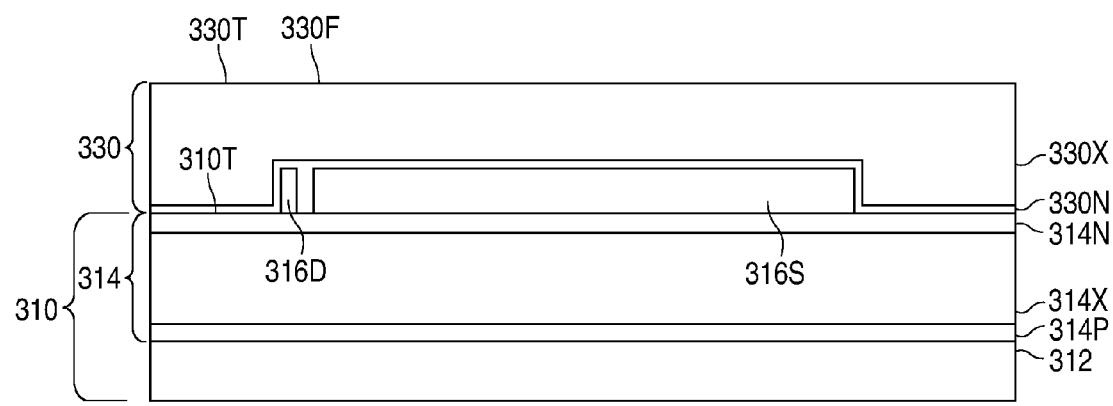
Figure 7C:
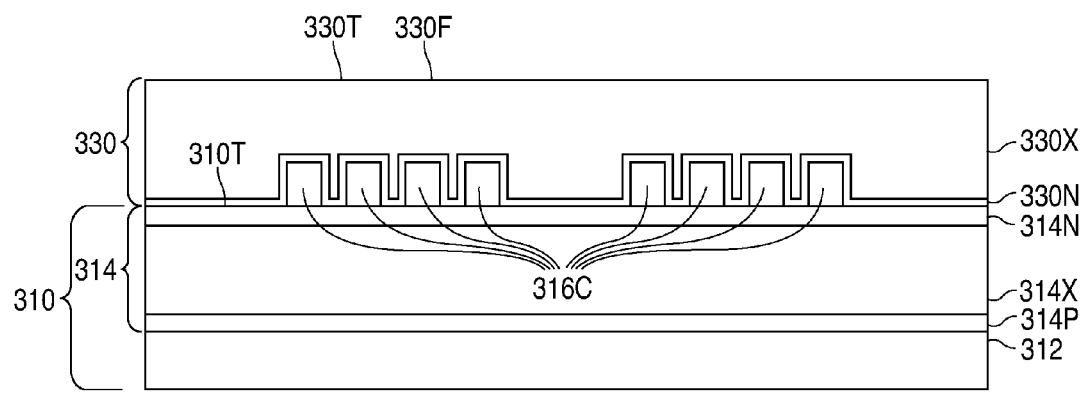
Figure 7D:
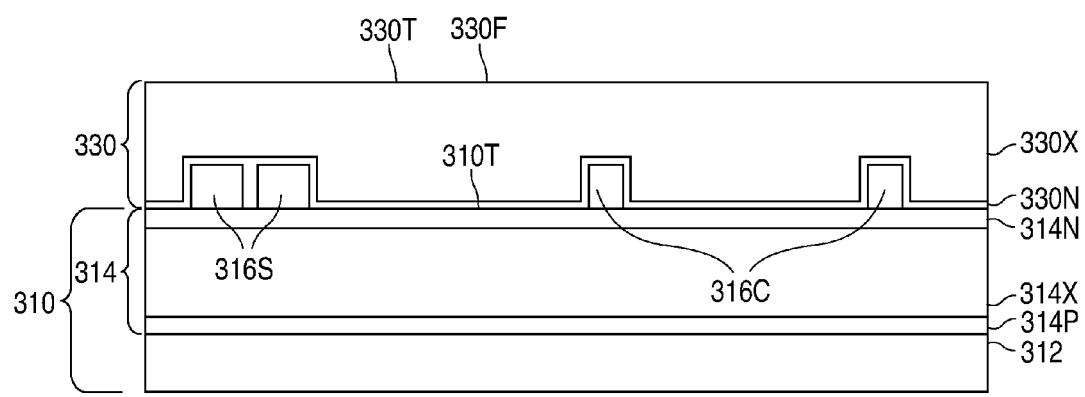
Figure 8A:
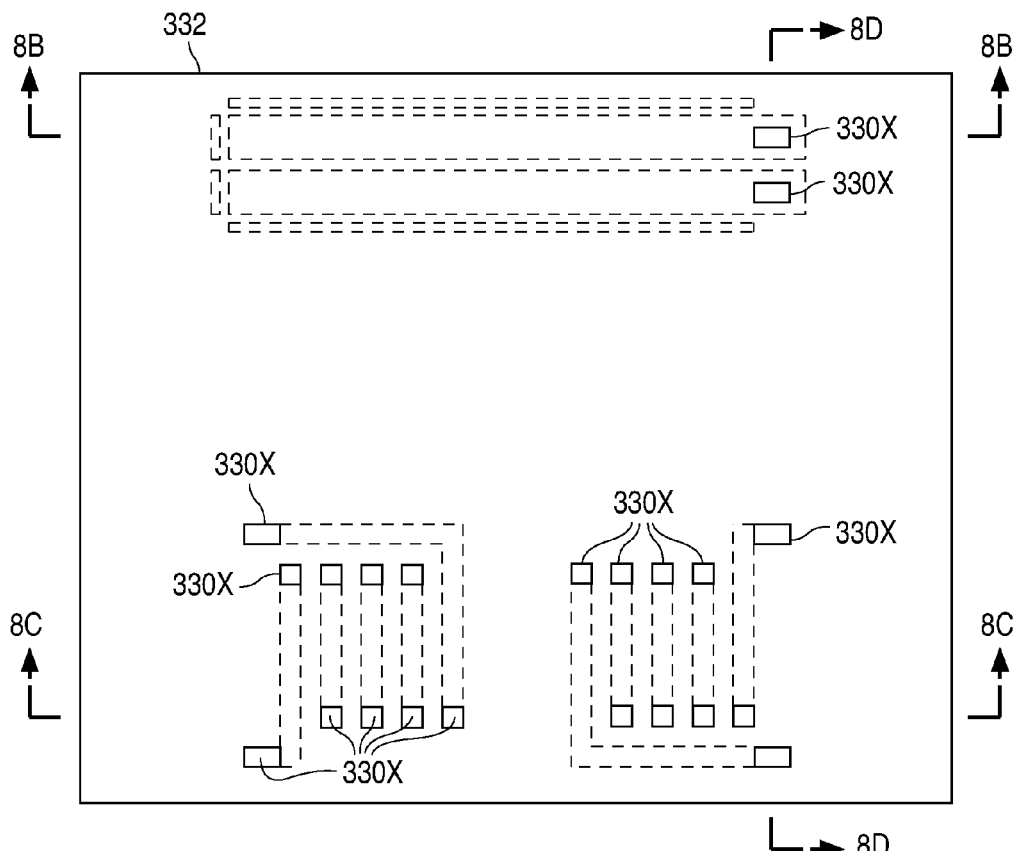
Figure 8B:
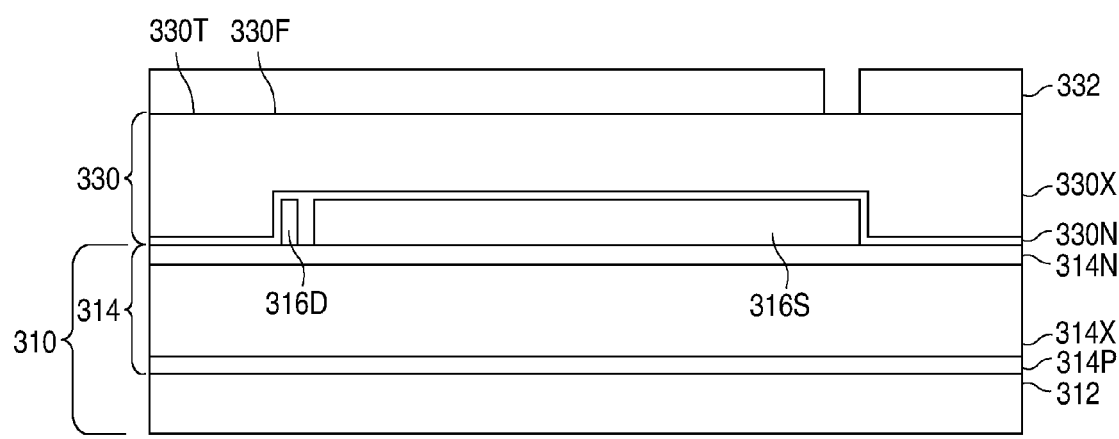
Figure 8C:
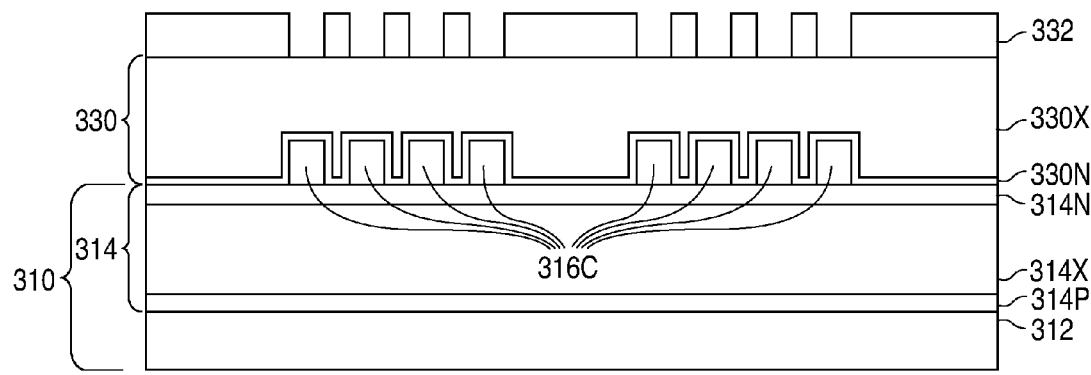
Figure 8D:
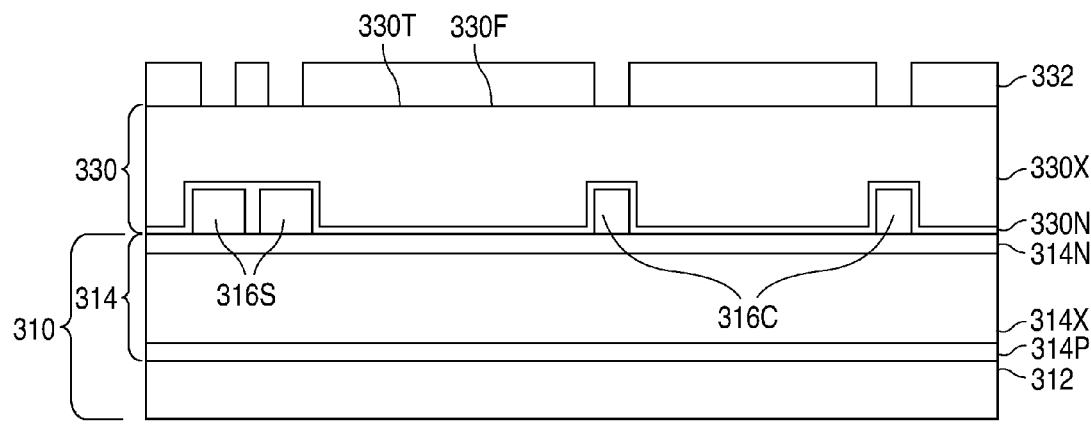
Figure 9A:
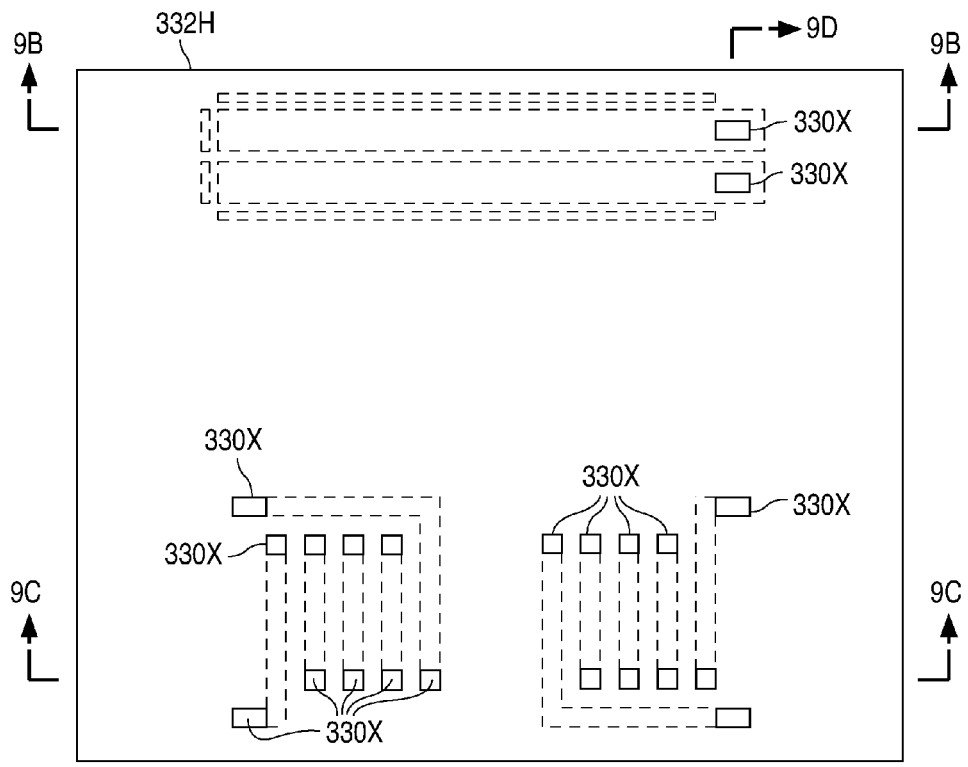
Figure 9B:
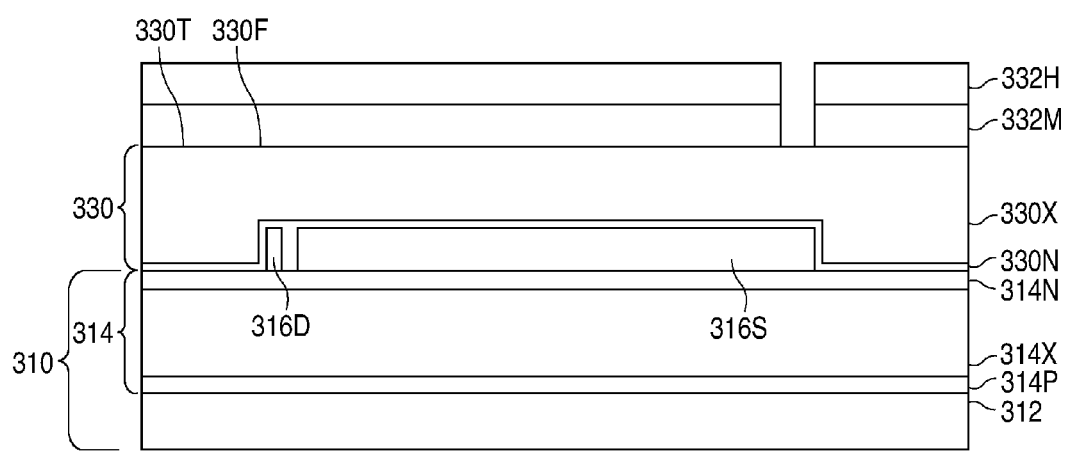
Figure 9C:
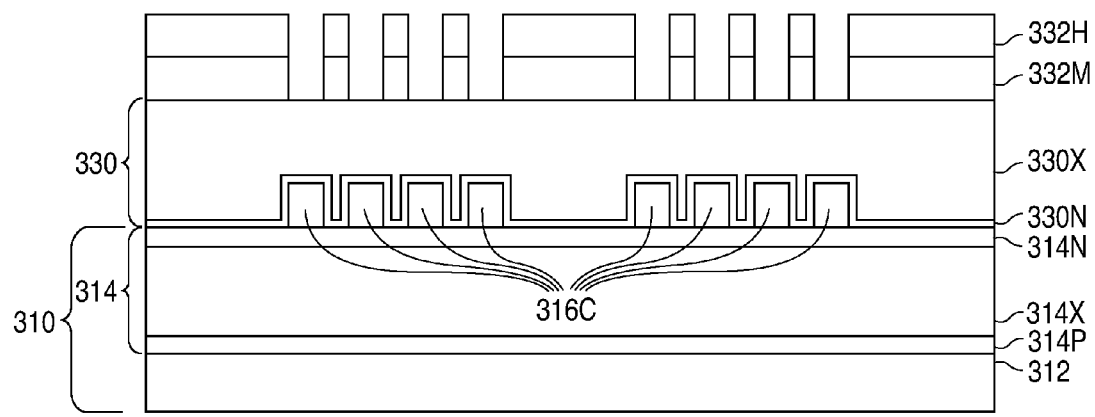
Figure 9D:
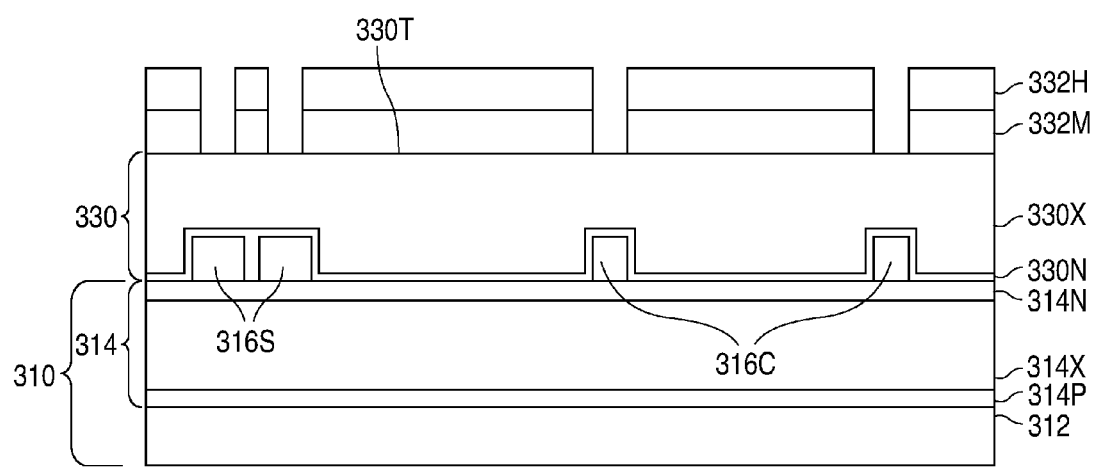
Figure 10A:
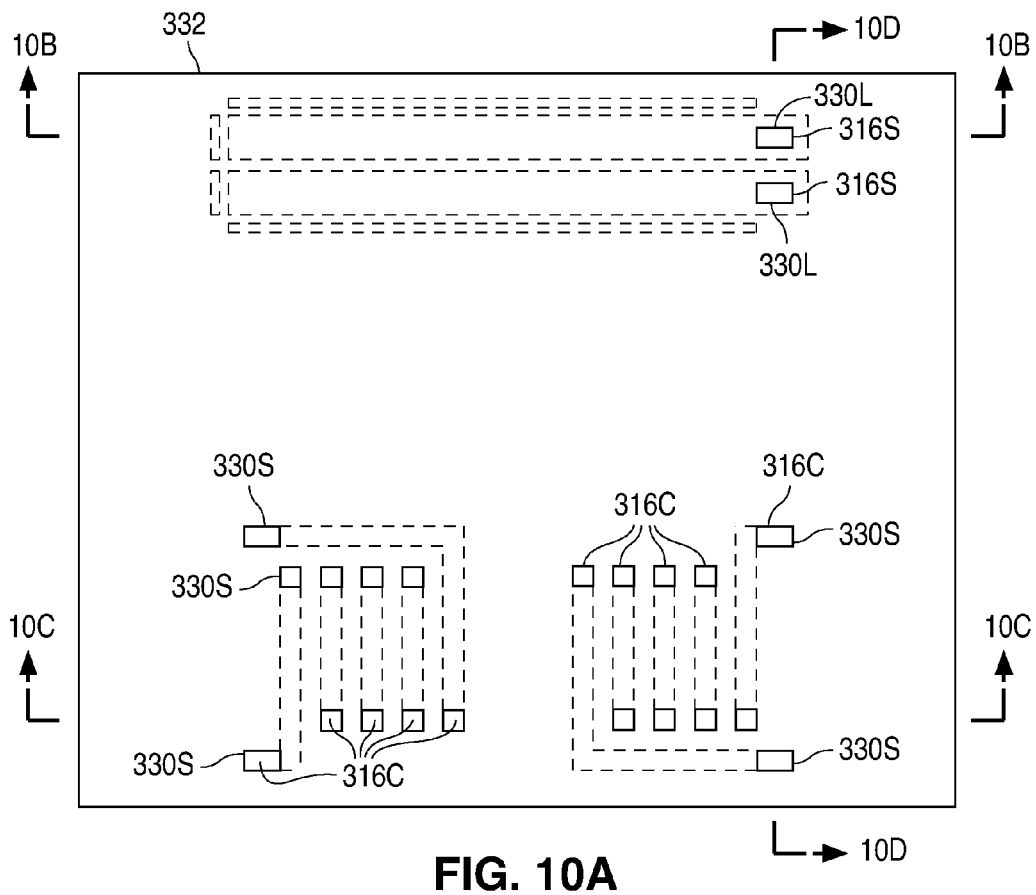
Figure 10B:
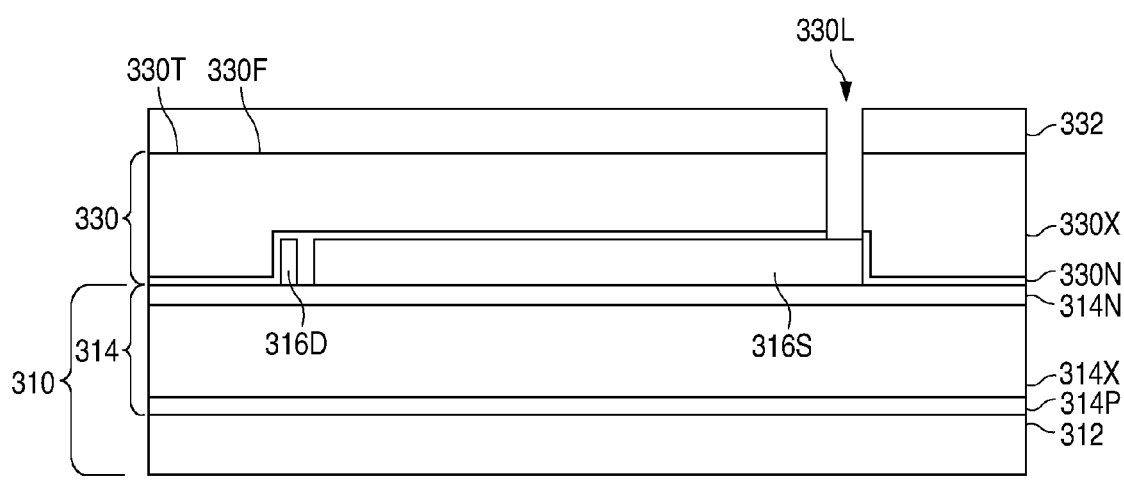
Figure 10C:
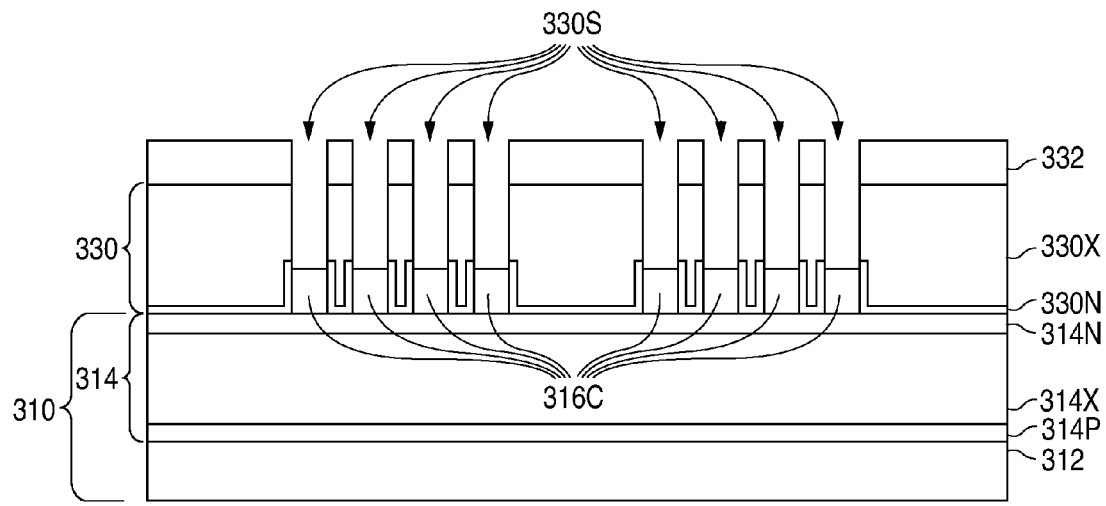
Figure 10D:
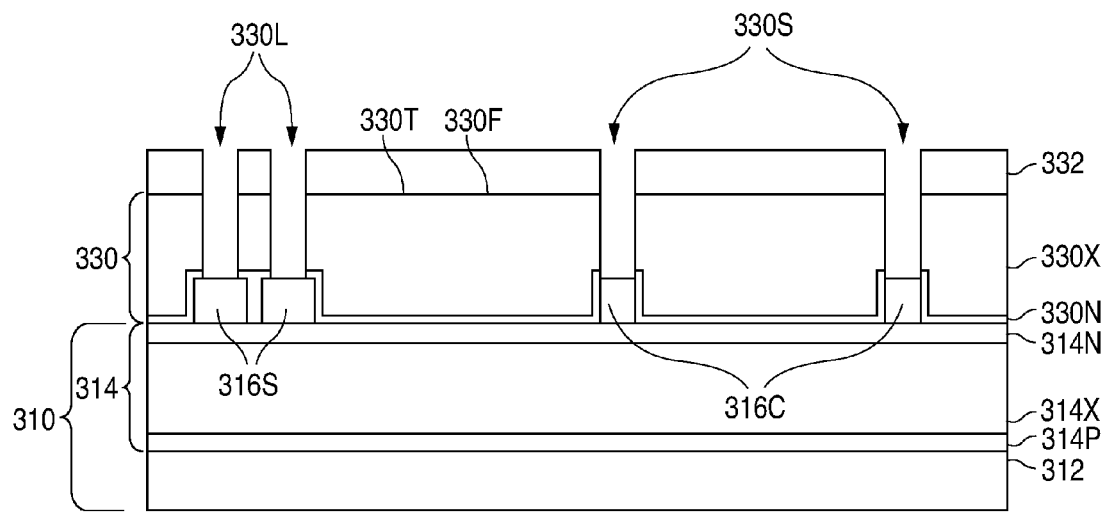
Figure 11A:
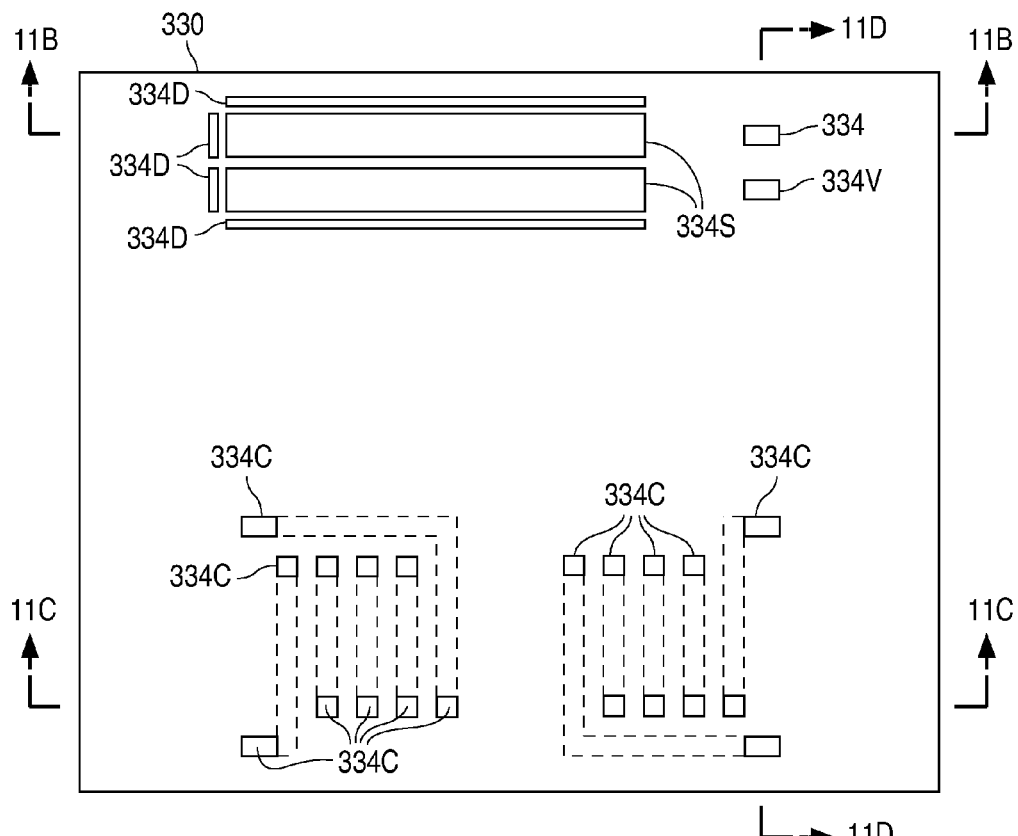
Figure 11B:
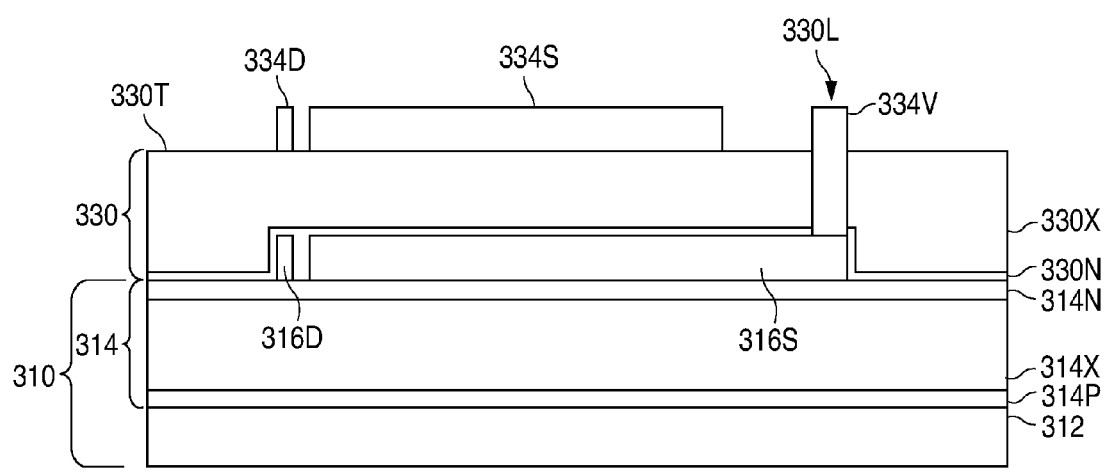
Figure 11C:
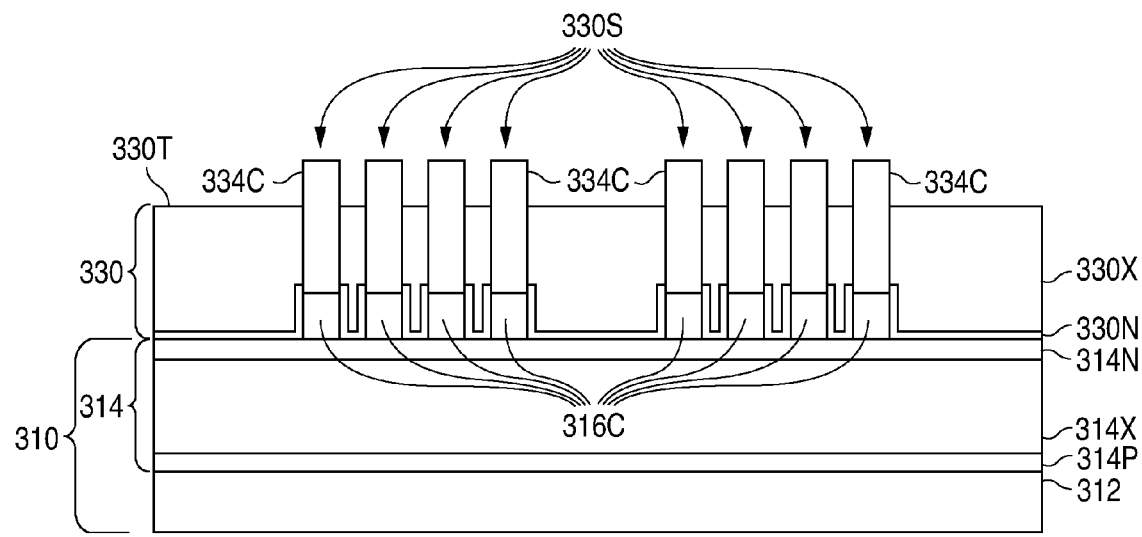
Figure 11D:
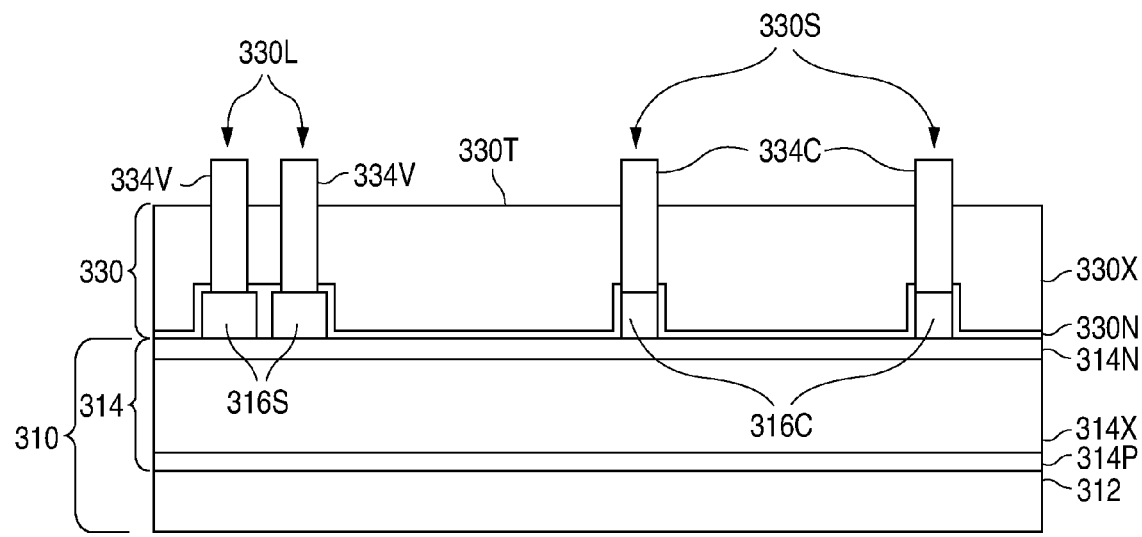
Figure 12A:
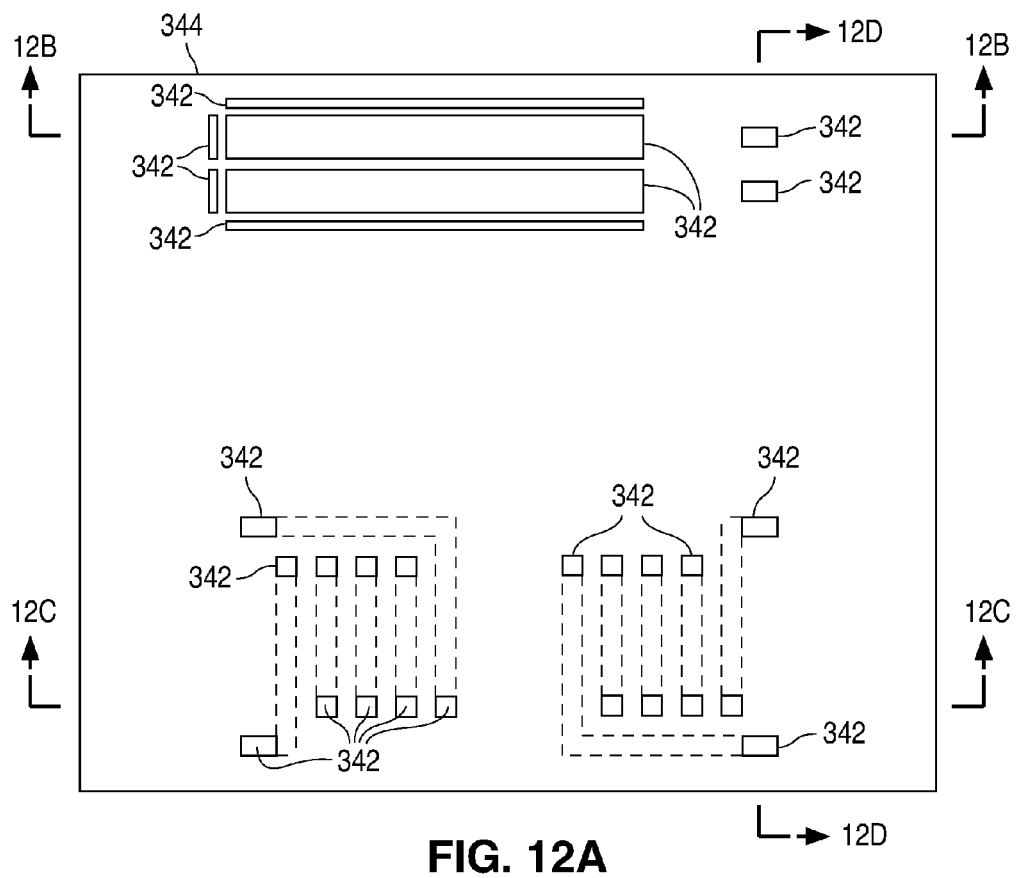
Figure 12B:
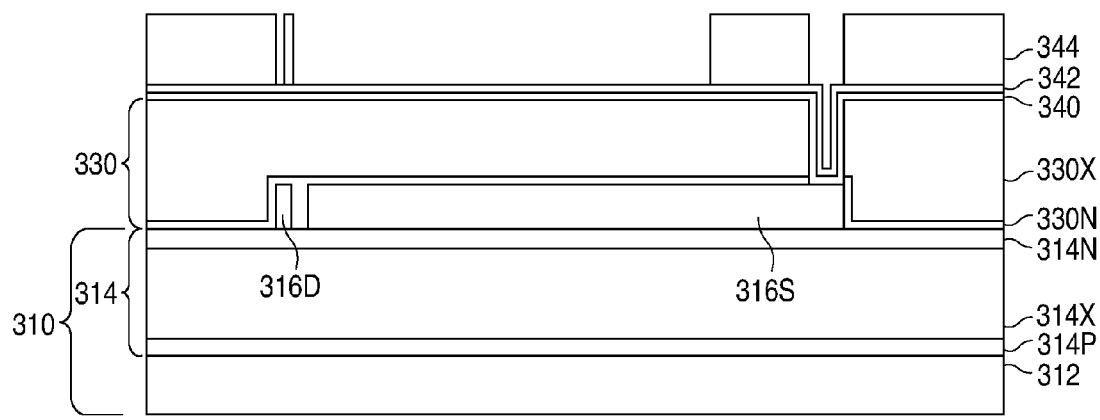
Figure 12C:
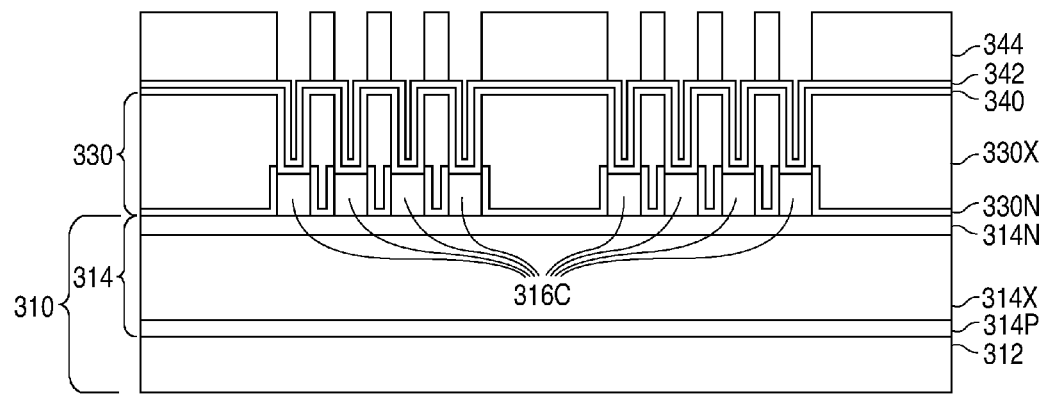
Figure 12D:
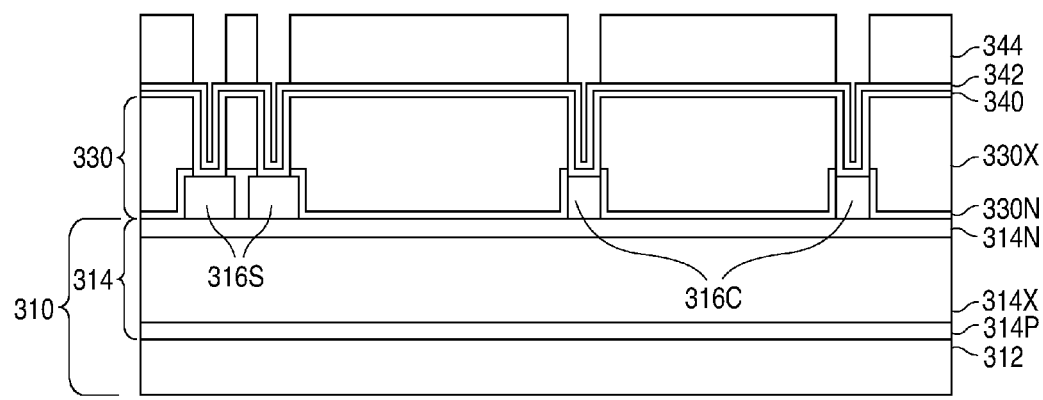
Figure 13A:
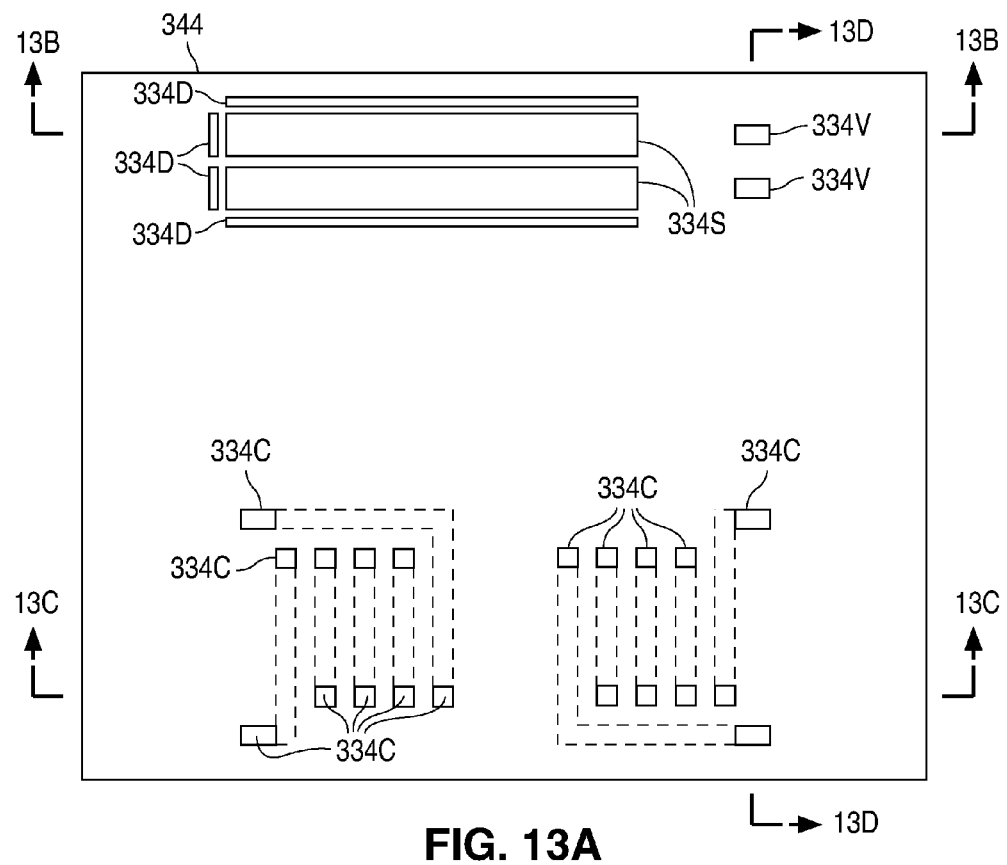
Figure 13B:
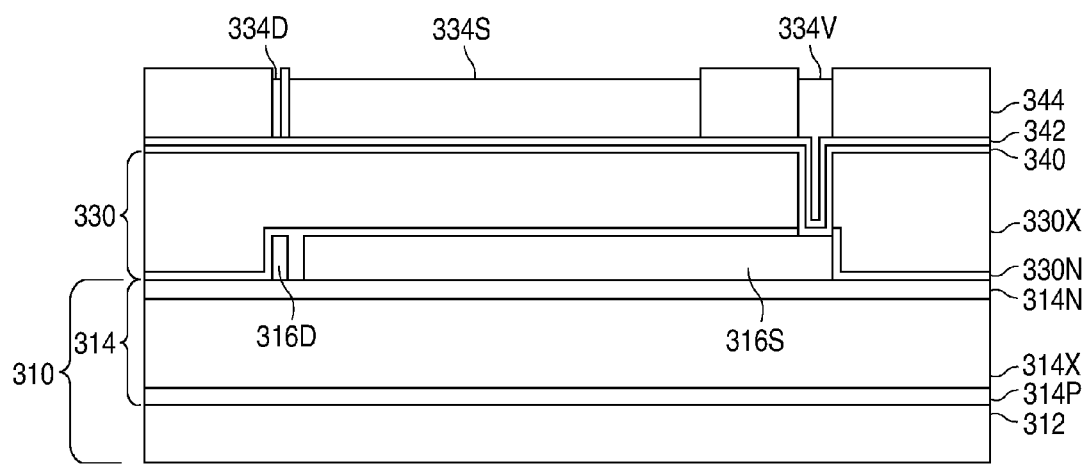
Figure 13C:
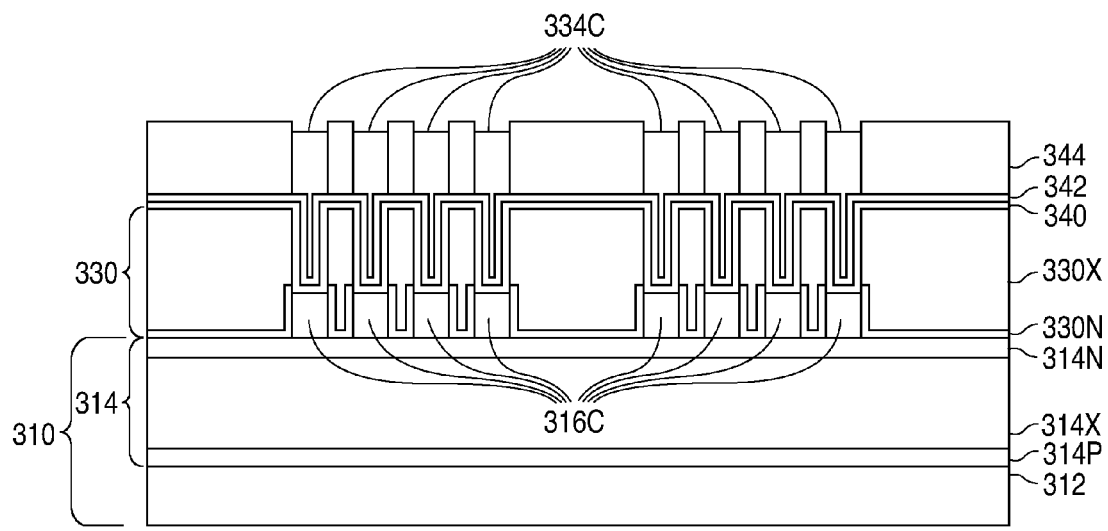
Figure 13D:
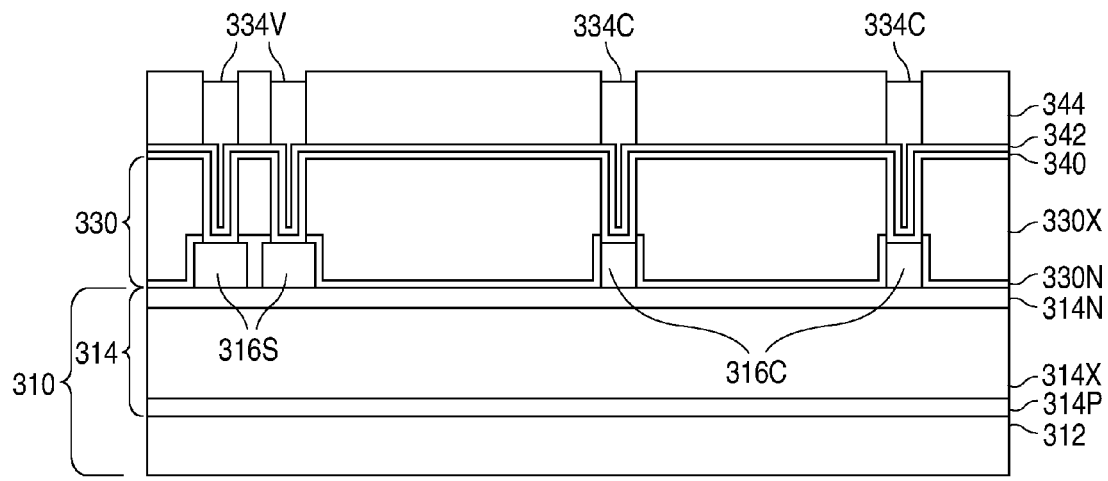
Figure 14A:
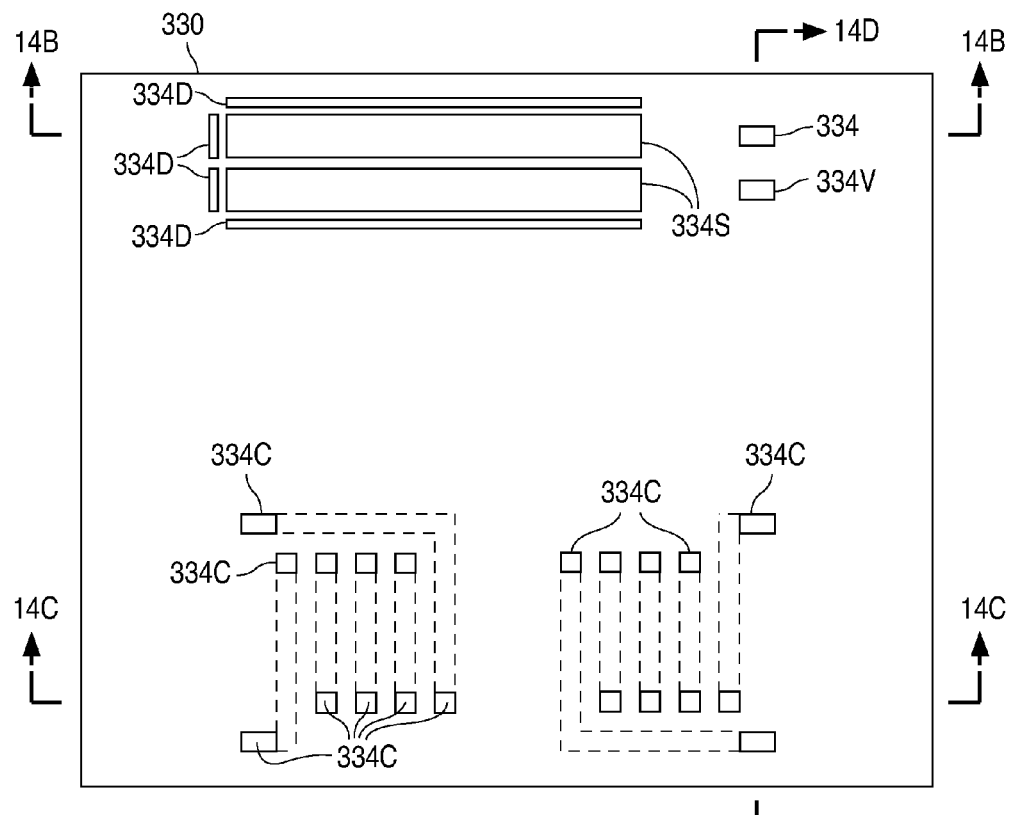
Figure 14B:
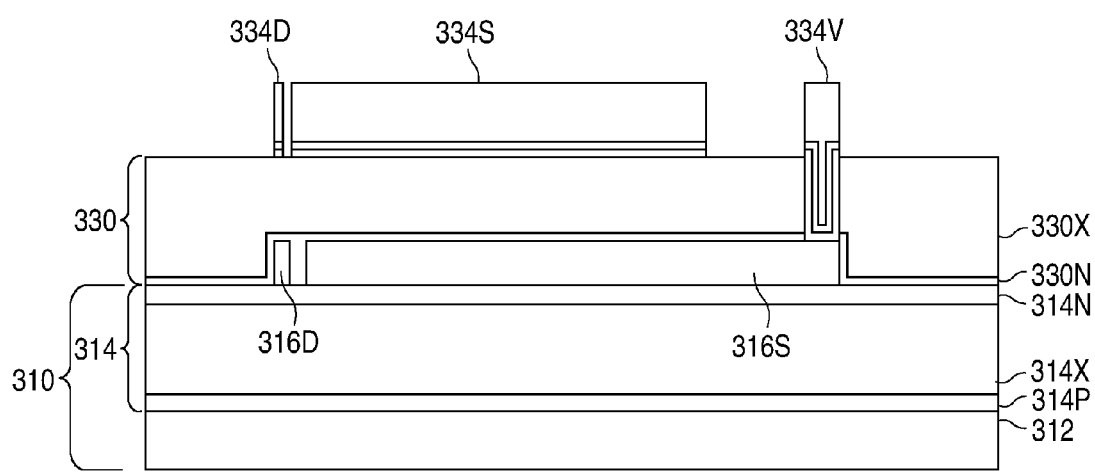
Figure 14C:
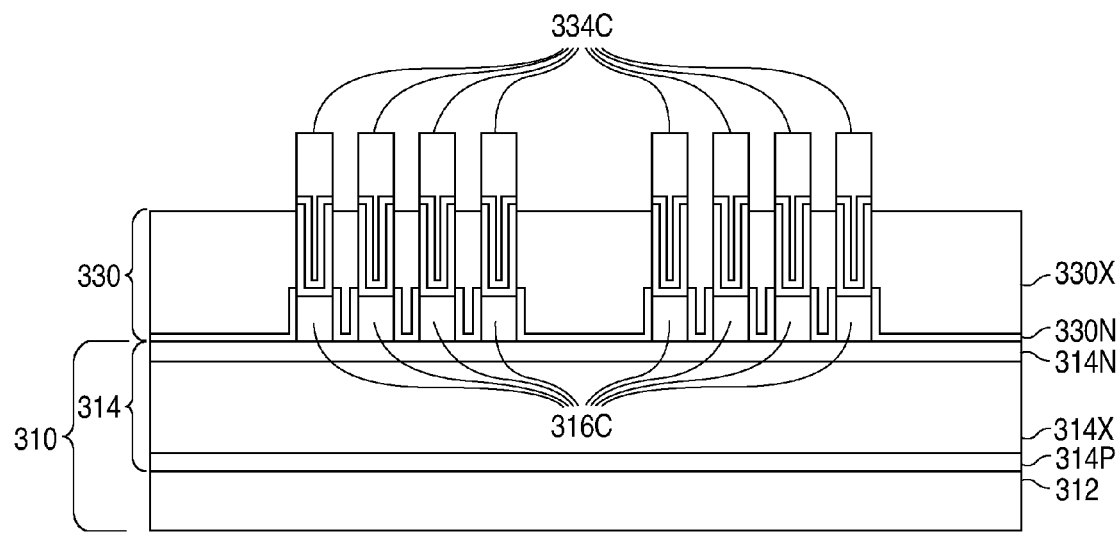
Figure 14D:
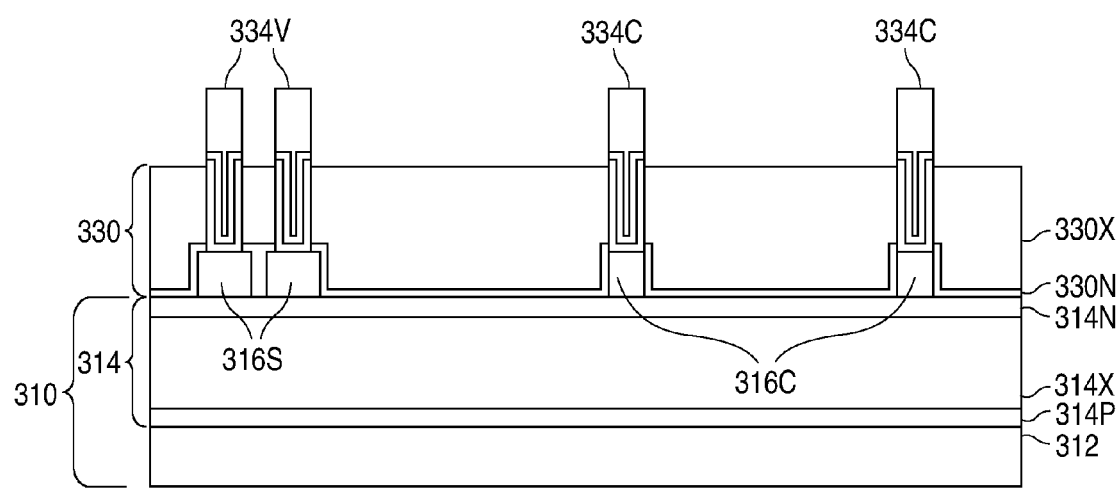
Figure 15A:
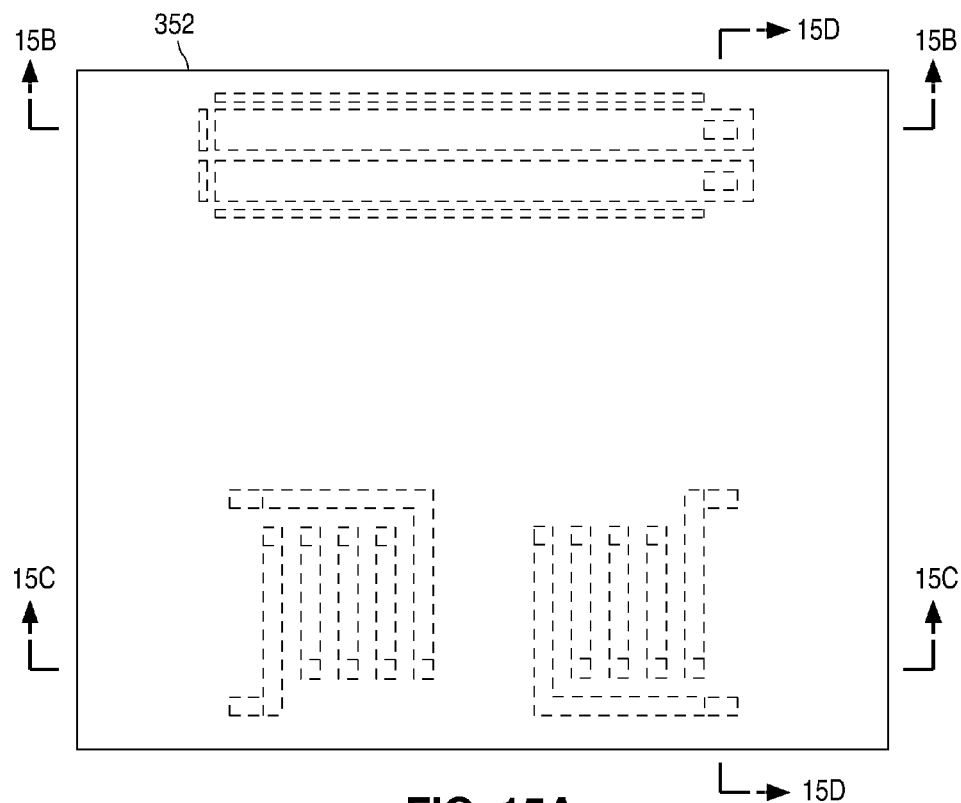
Figure 15B:
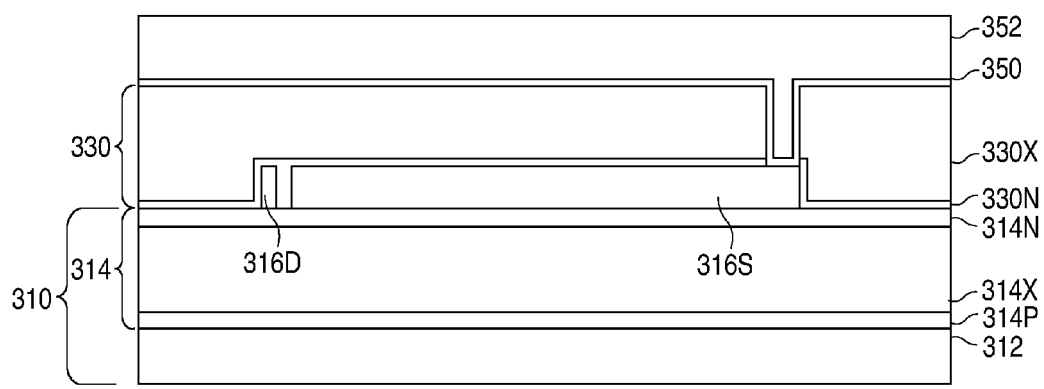
Figure 15C:
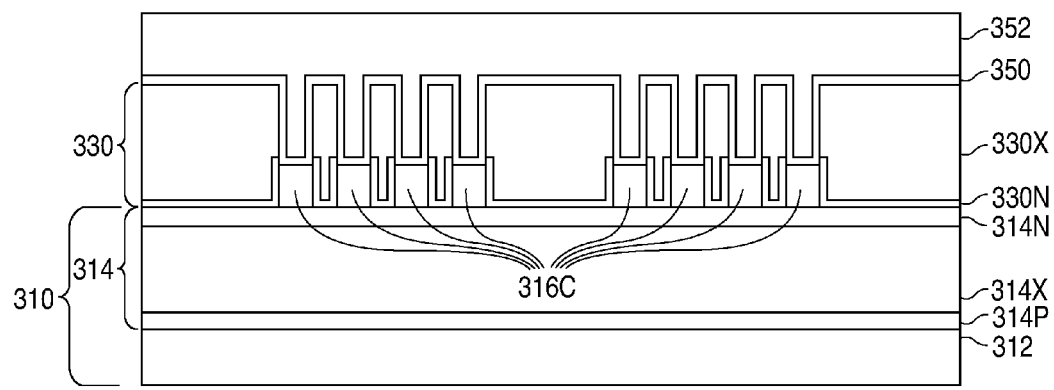
Figure 15D:
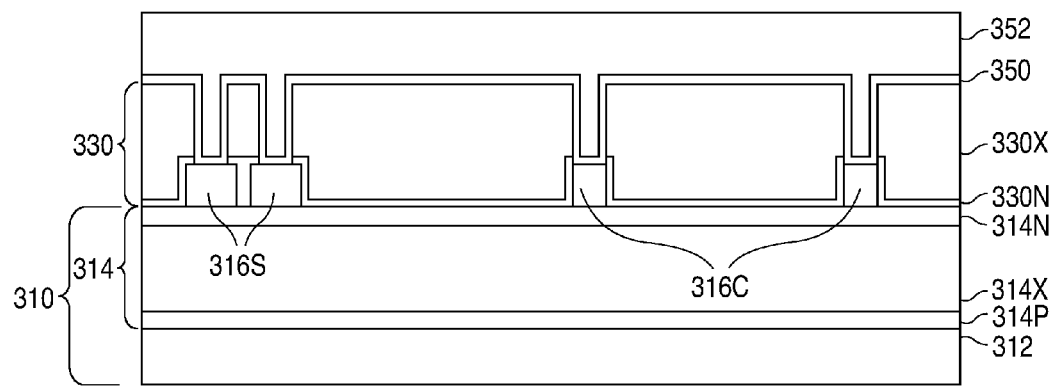
Figure 16A:
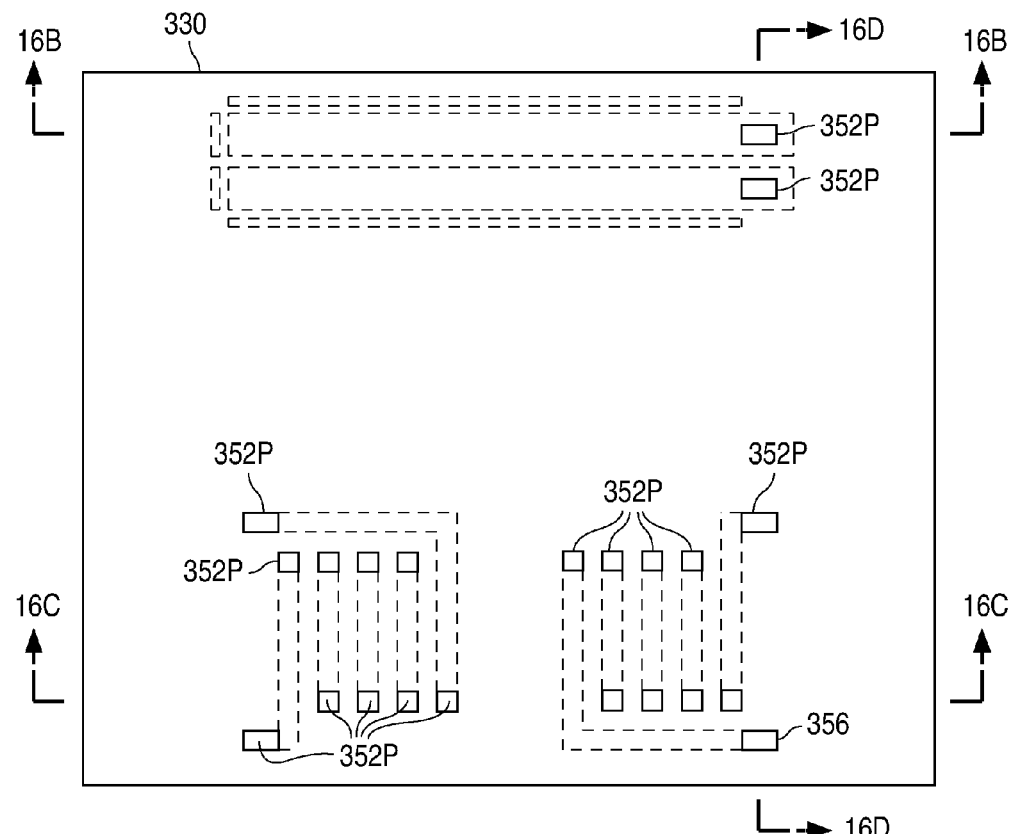
Figure 16B:
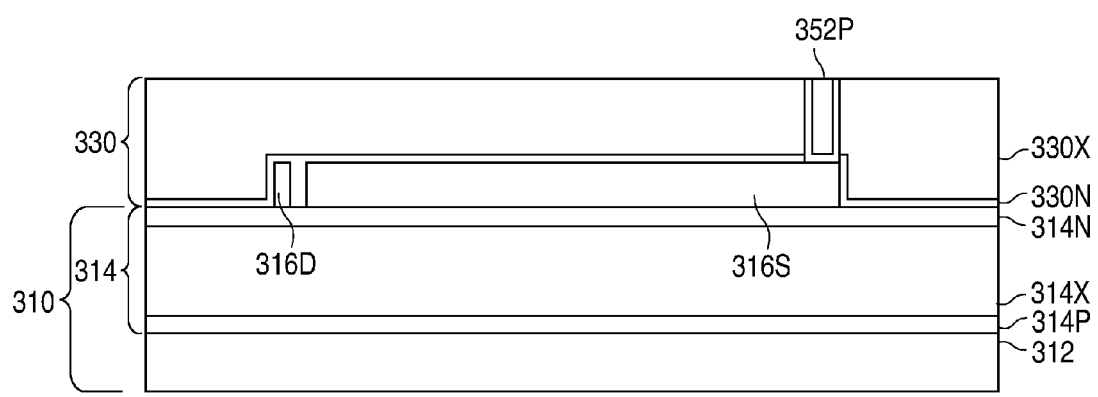
Figure 16C:
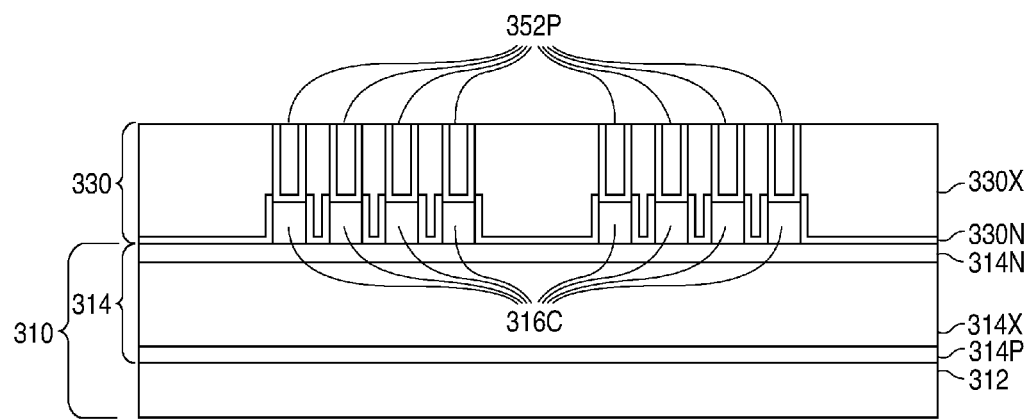
Figure 16D:
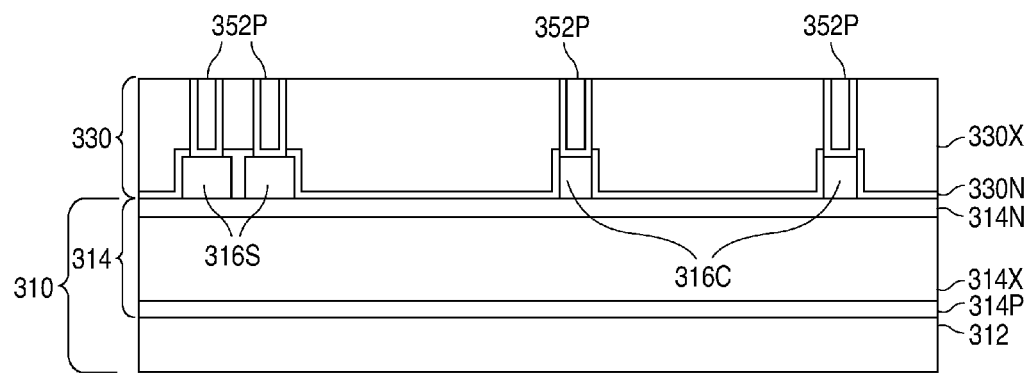
Figure 17A:
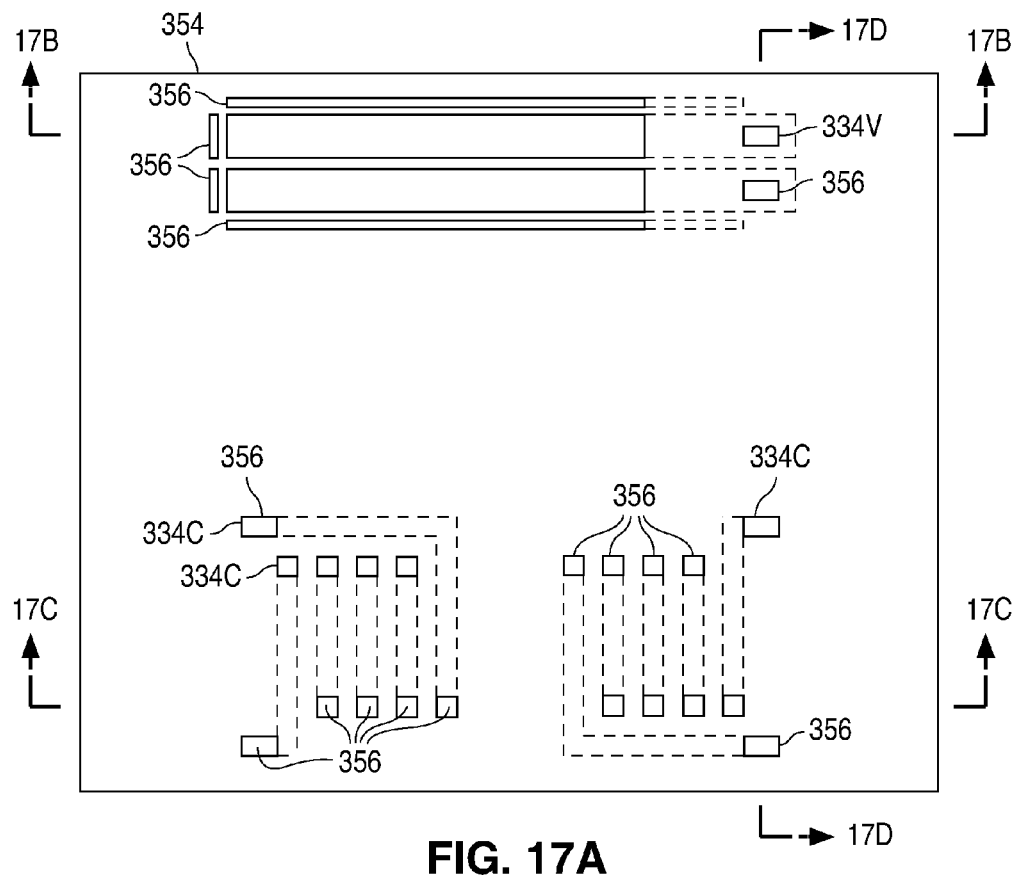
Figure 17B:
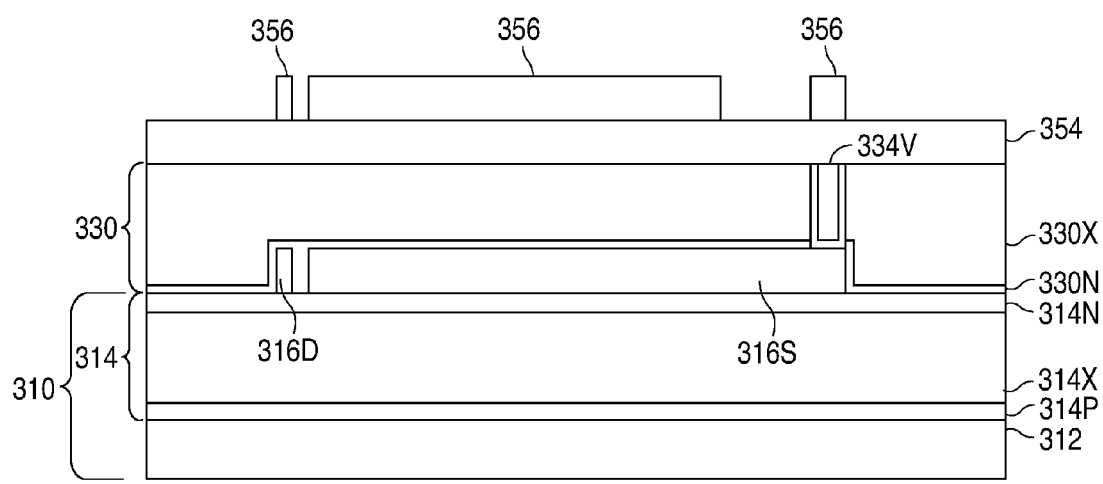
Figure 17C:
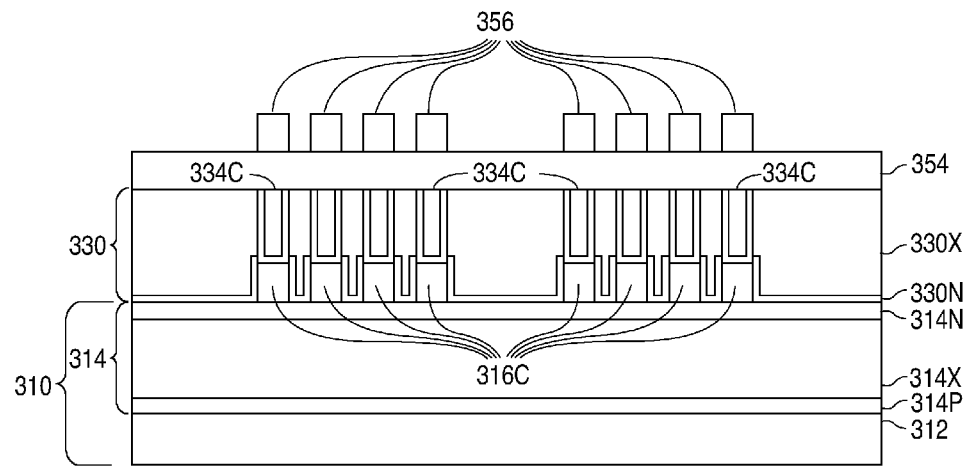
Figure 17D:
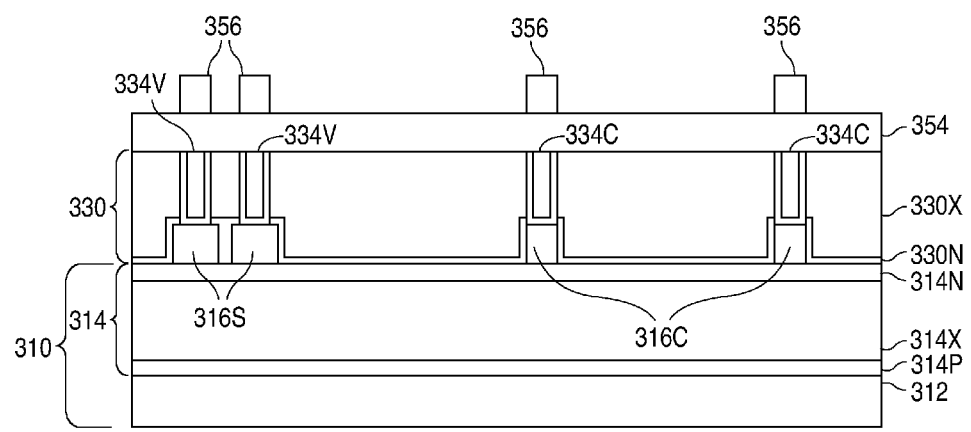
Figure 18A:
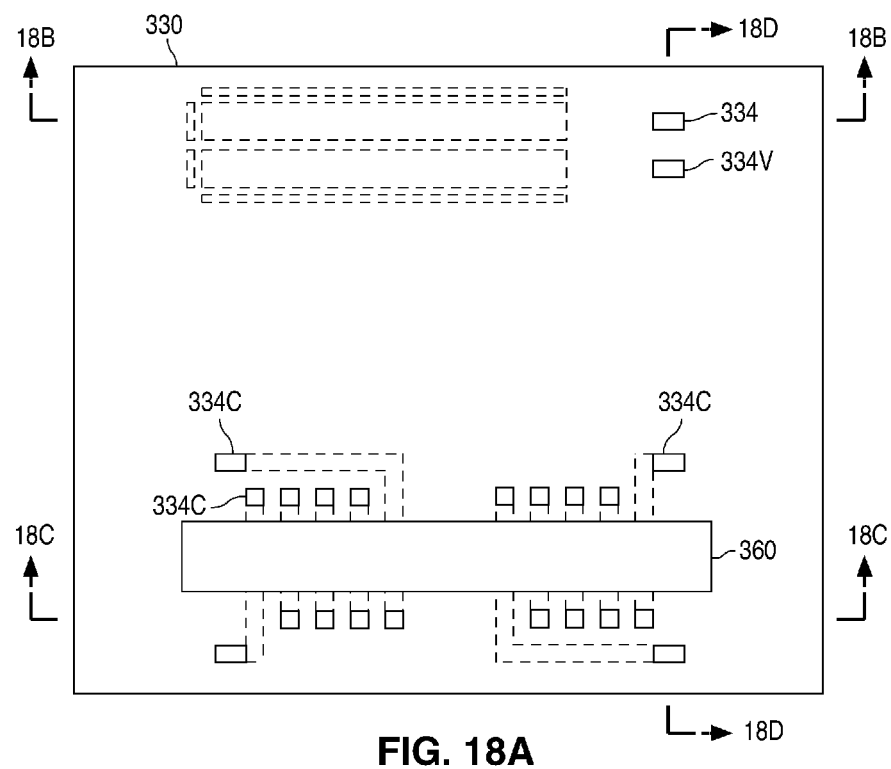
Figure 18B:
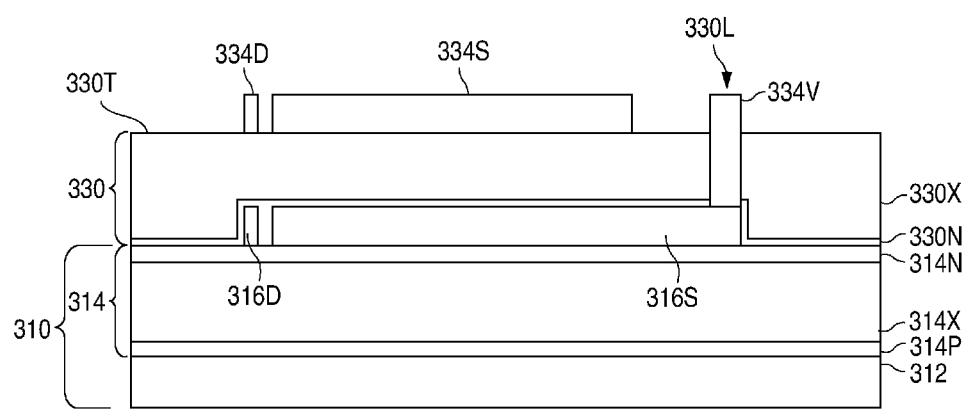
Figure 18C:
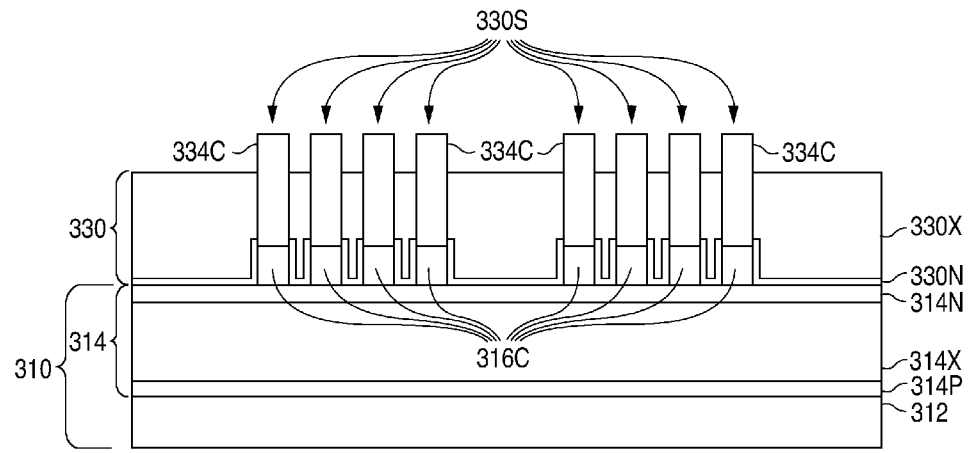
Figure 18D:
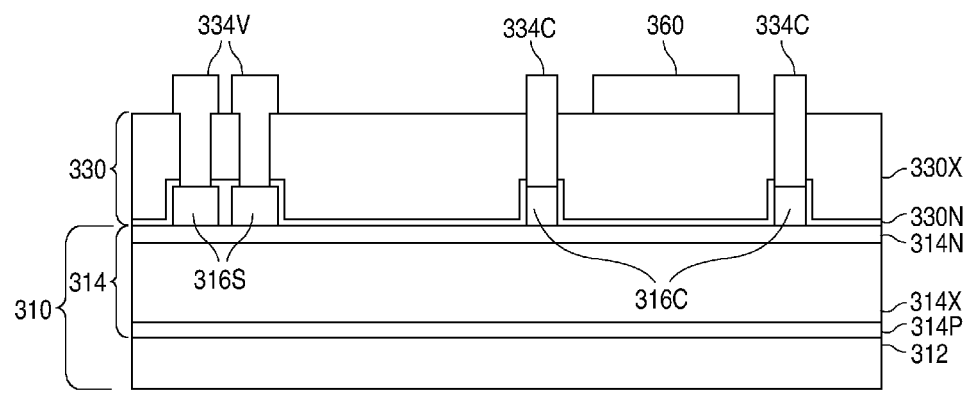
Figure 19A:
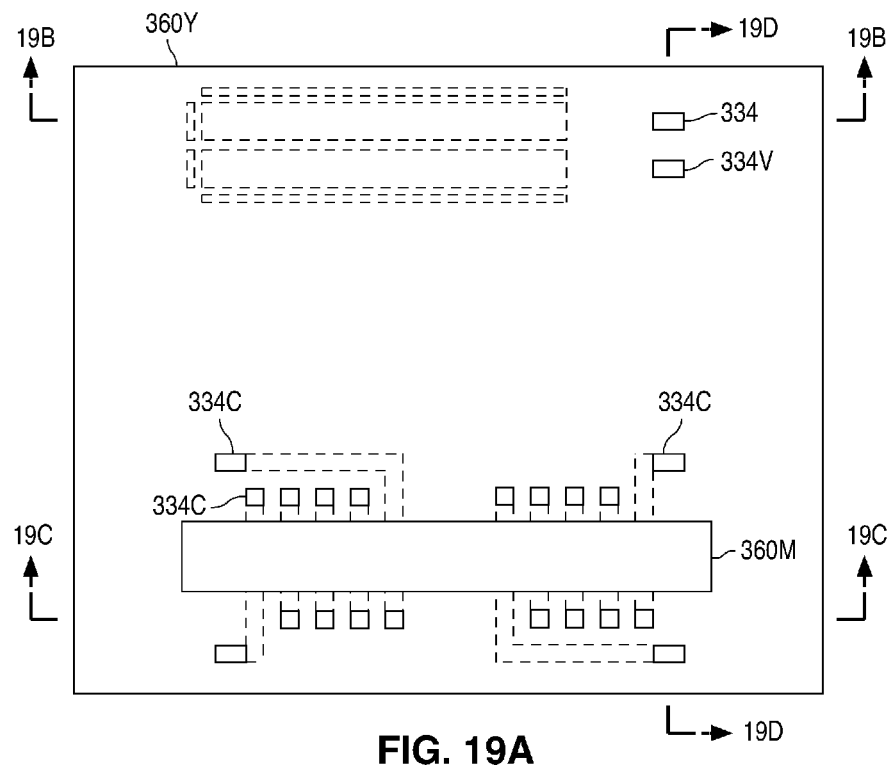
Figure 19B:
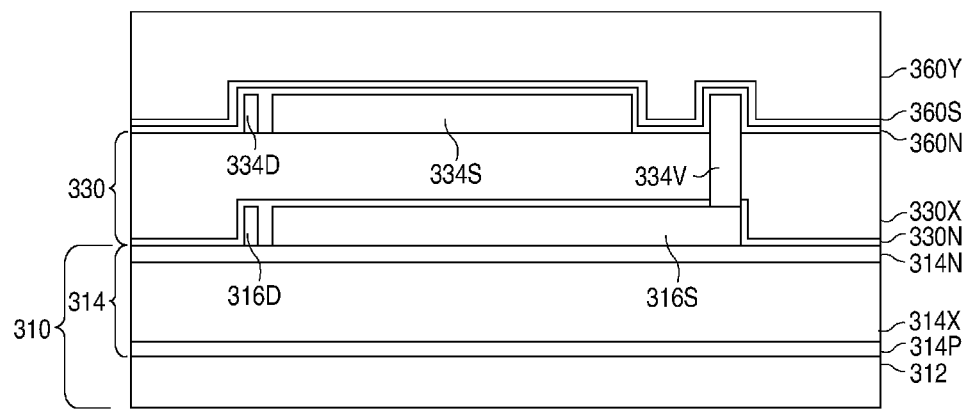
Figure 19C:
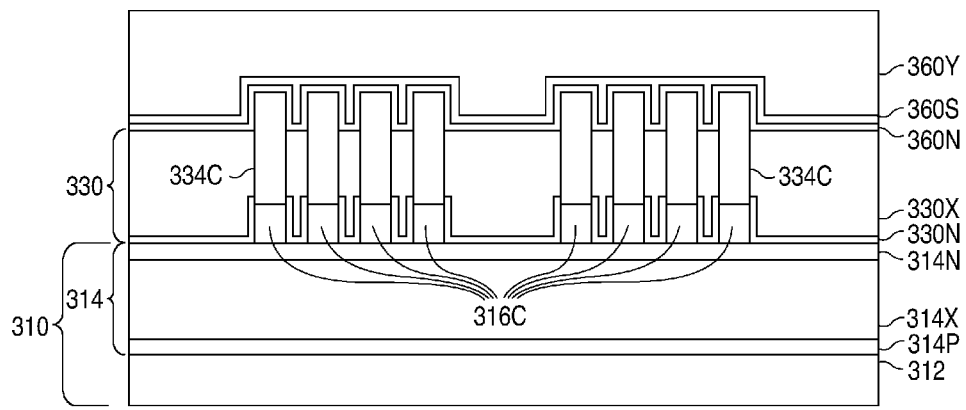
Figure 19D:
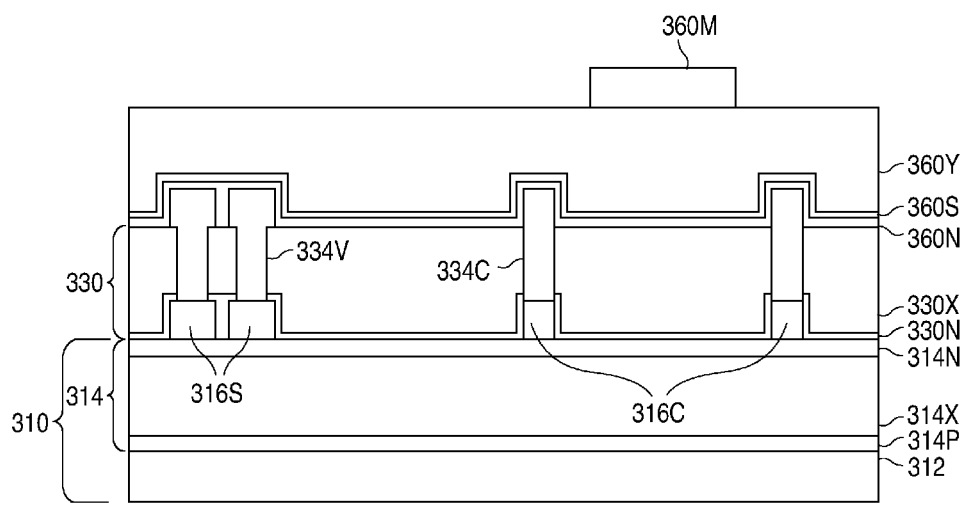
Figure 20A:
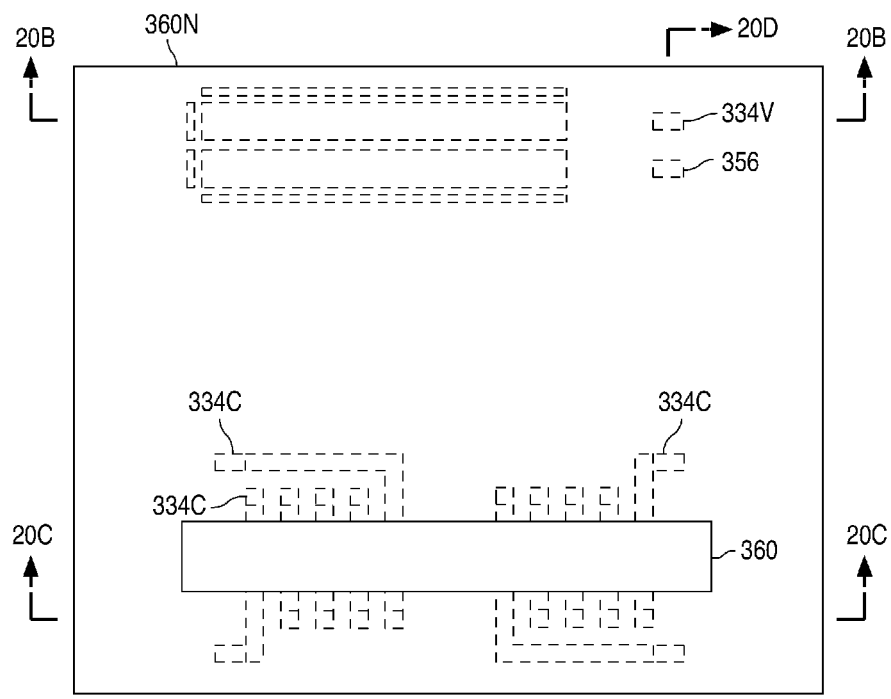
Figure 20B:
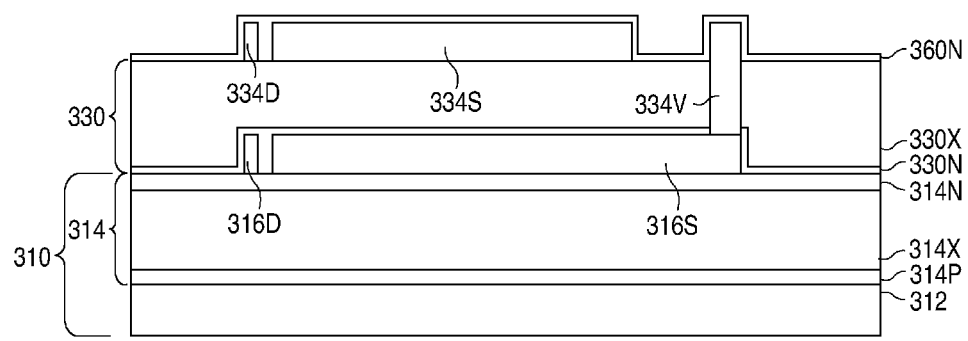
Figure 20C:
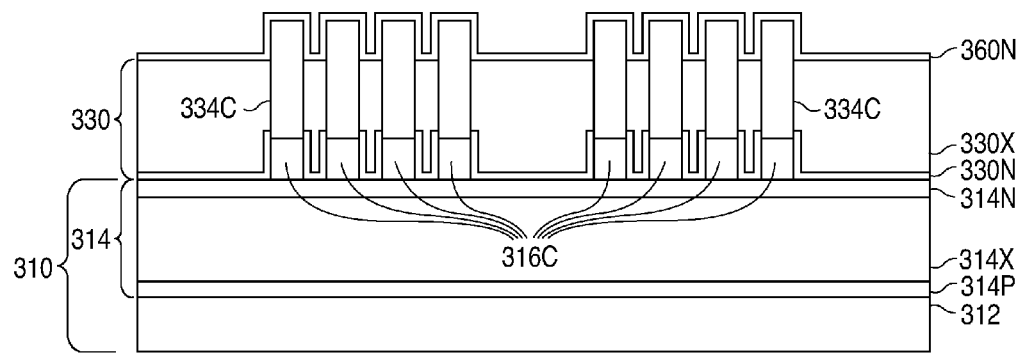
Figure 20D:
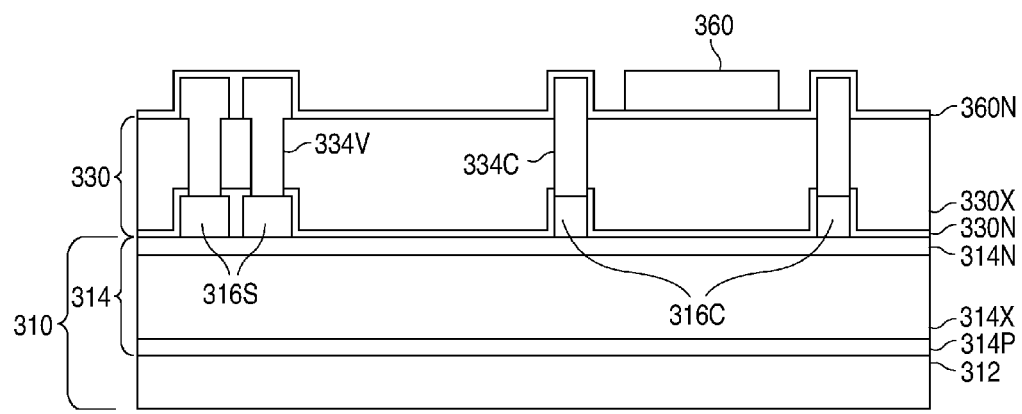
Figure 21A:
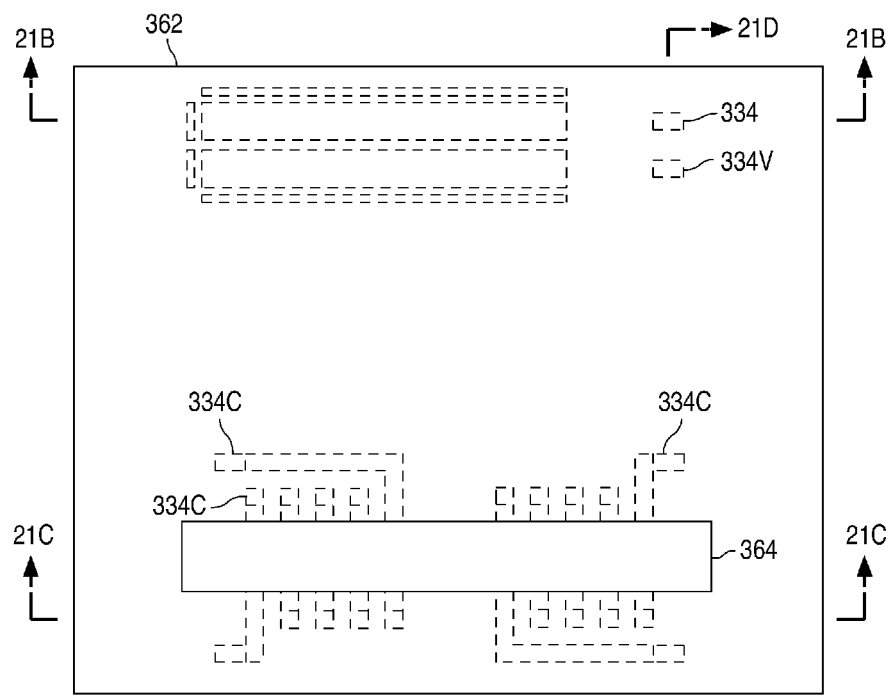
Figure 21B:
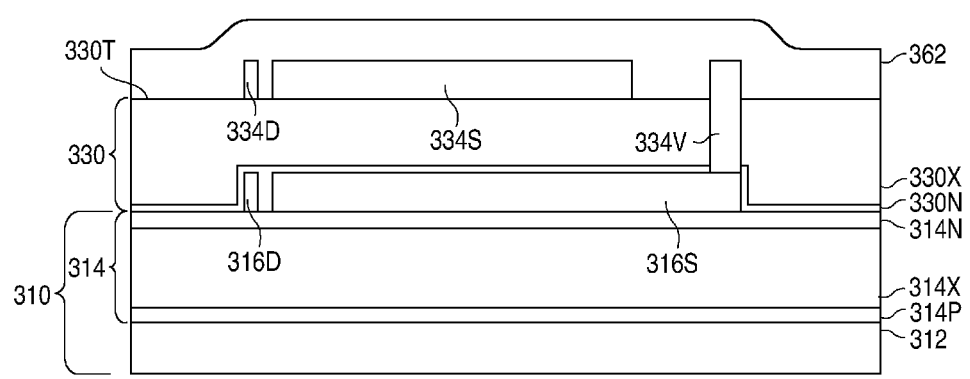
Figure 21C:
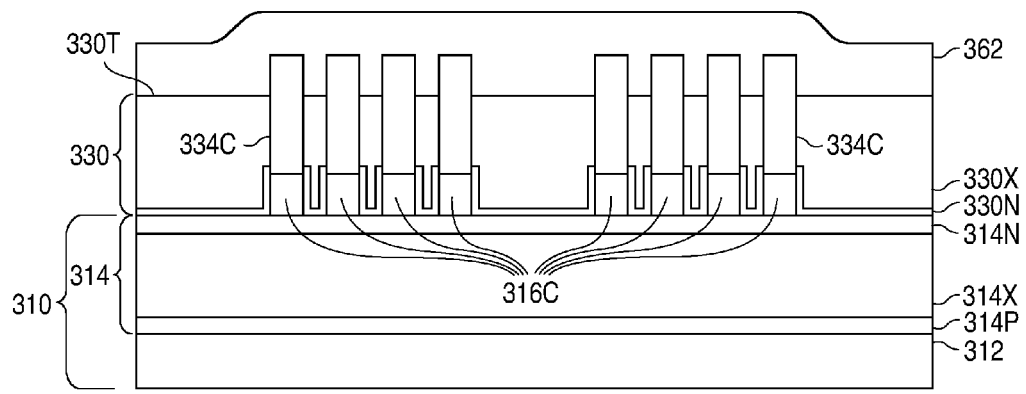
Figure 21D:
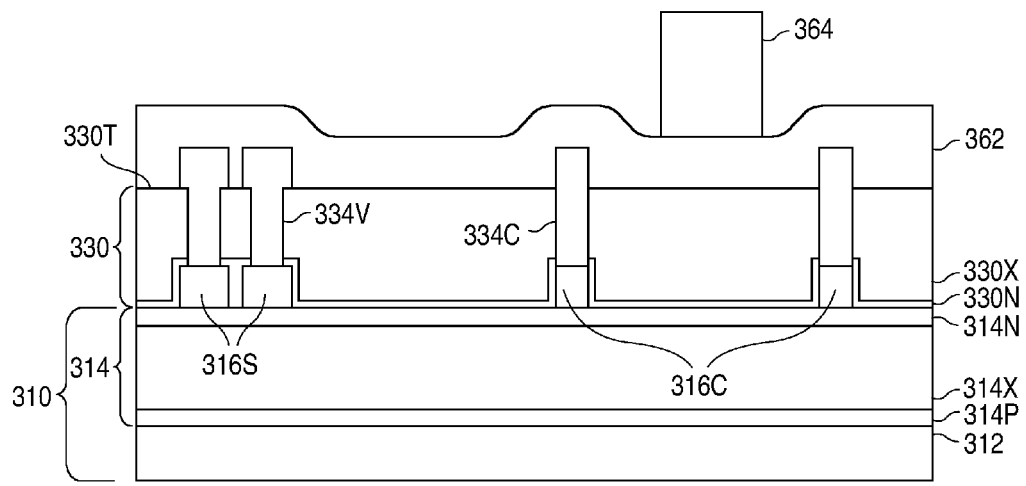

FIGS. 3A-3D through FIGS. 41A-41D show a series of views that illustrate an example of a method of forming a galvanically-isolated multi-die chip in accordance with the present invention. FIGS. 3A-41A show plan views. FIGS. 3B-3B show cross-sectional views taken along lines 3B-3B through 41B-41B of FIGS. 3A-39A, respectively. FIGS. 3C-41C show cross-sectional views taken along lines 3C-3C through 41C-41C of FIGS. 3A-41A, respectively. FIGS. 3D-41D show cross-sectional views taken along lines 3D-3D through 41D-41D of FIGS. 3A-41A, respectively.

As shown in FIGS. 3A-3D, the method begins by forming a substrate structure 310 which has a non-conductive top surface 310T. In the present example, substrate structure 310 utilizes a conventionally-fabricated silicon wafer 312, and is formed by forming a non-conductive structure 314 onto the top surface of silicon wafer 312. Silicon wafer 312 can have, for example, a thickness of 750 μm, a diameter of 200 mm, and a resistivity of 10-100Ω per square centimeter.

Non-conductive structure 314, in turn, can be formed by growing a layer of silicon dioxide 314P approximately 3-5 μm thick on the top surface of silicon wafer 312, followed by the deposition of a layer of silicon dioxide 314X approximately 10-15 μm thick on the top surface of oxide layer 314P (stress <6.5 MPa). The combined thickness of oxide layers 314P and 314X is determined by the isolation voltage that is required.

Following this, a layer of silicon nitride 314N approximately 0.6 μm thick is deposited on the top surface of oxide layer 314X. Oxide layer 314P can be grown using high pressure oxygen (HIPDX) or deposited using plasma-enhanced chemical vapor deposition (PECVD), while silicon dioxide layer 314X and nitride layer 314N can be deposited with PECVD.

After the formation of substrate structure 310, a number of metal lower structures 316 are formed on the non-conductive top surface 310T of substrate structure 310. The metal lower structures 316 include a number of lower plate structures 316S, a number of lower dummy structures 316D, and a number of lower coil structures 316C. Each lower plate structure 316S represents the lower plate of a capacitor. In the present example, only two lower plate structures 316S of two capacitors are shown for clarity. In addition, the lower dummy structures 316D, which are optional, are utilized to provide better edge definition to the lower plate structures 316S. The metal lower structures 316 can be formed in a number of different ways.

As shown in FIGS. 4A-4D, in a first embodiment, the metal lower structures 316 can be formed by depositing a seed layer 320 to touch the non-conductive top surface 310T of substrate structure 310. For example, seed layer 320 can be implemented with a layer of aluminum copper. Seed layer 320 can alternately be formed by depositing 300 Å of titanium, 3000 Å of copper, and 300 Å of titanium. After seed layer 320 has been formed, a plating mold 322 is formed on the top surface of seed layer 320.

As shown in FIGS. 5A-5D, following the formation of plating mold 322, copper is electroplated in a conventional manner to form the metal lower structures 316 approximately 5 μm thick. After the electroplating, plating mold 322 and the underlying regions of seed layer 320 are removed to expose the lower plate structures 316S, the lower dummy structures 316D, and the lower coil structures 316C.

Alternately, in a second embodiment, as shown in FIGS. 6A-6D, the metal lower structures 316 can be formed by sputter depositing a metal layer 324, such as aluminum, onto the non-conductive top surface 310T of substrate structure 310 to a depth of approximately 5 μm. Alternately, metal layer 324 can include multiple layers of metal such as, for example, a layer of titanium, a layer of titanium nitride, a layer of aluminum copper, a layer of titanium, and a layer of titanium nitride.

Once metal layer 324 has been formed, a patterned photoresist layer 326 approximately 1.0 µm thick is formed on the top surface of metal layer 324 in a conventional manner. Following the formation of patterned photoresist layer 326, metal layer 324 is etched to remove the exposed regions of metal layer 324 and form the metal lower structures 316.

Metal layer 324 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 326 is then removed in a conventional manner, such as with acetone.

Once patterned photoresist layer 326 has been removed, the resulting structure is conventionally cleaned to remove organics, such as with a Piranha etch (e.g., using a solution of 50 $H_2SO_4$:$1H_2O_2$ @ 120° C. removes approximately 240 nm/minute).

As shown in FIGS. 7A-7D, after the lower plate structures 316S, the lower dummy structures 316D, and the lower coil structures 316C have been formed, a dielectric structure 330 with a substantially planar top surface 330T is formed on the lower plate structures 316S, the lower dummy structures 316D, the lower coil structures 316C, and the non-conductive top surface 310T of substrate structure 310.

In the present example, when the metal lower structures 316 are formed as in the first embodiment (electroplated), dielectric structure 330 can be formed by conventionally depositing a silicon nitride layer 330N approximately 0.6 µm thick on the non-conductive top surface 310T of substrate structure 310 and the metal lower structures 316 to prevent copper diffusion. After this, a layer of silicon dioxide 330X is conventionally formed on the top surface of silicon nitride layer 330N. Alternately, when the metal lower structures 316 are formed as in the second embodiment (metal deposition, mask, and etch), silicon nitride layer 330N can be omitted when a copper diffusion barrier is not required.

Following the formation of oxide layer 330X, oxide layer 330X is planarized in a conventional manner, such as with chemical-mechanical polishing, until oxide layer 330X has a substantially planar top surface 330F, which defines the substantially planar top surface 330T of dielectric structure 330.

As shown in FIGS. 8A-8D, after dielectric structure 330 has been formed, a hard mask 332 is formed on the substantially planar top surface 330T of dielectric structure 330. As shown in FIGS. 9A-9D, hard mask 332 can be formed by conventionally depositing a layer of masking material 332M, such as a layer of aluminum, or a layer of oxide with an overlying layer of nitride, followed by the conventional formation of a patterned photoresist layer 332H. Following this, the exposed regions of masking material 332M are etched to form the openings in hard mask 332. Patterned photoresist layer 332H is then removed in a conventional manner to complete the formation of hard mask 332.

After hard mask 332 has been formed, as shown in FIGS. 10A-10D, the exposed regions of dielectric structure 330 are etched away to form a number of lower plate openings 330L that exposes the lower plate structures 316S, and a number of side wall coil openings 330S that expose the opposite ends of each lower coil structure 316C. After the lower plate structures 316S and the lower coil structures 316C have been exposed, hard mask 332 is removed in a conventional manner. Alternately, depending on the thickness of the dielectric to be etched, a thick patterned photoresist layer can be used in lieu of hard mask 332.

As shown in FIGS. 11A-11D, after hard mask 332 has been removed, a number of metal intermediate structures 334 are formed on the non-conductive top surface 330T of dielectric structure 330, in the lower plate openings 330L to make electrical connections to the lower plate structures 316S, and in the side wall coil openings 330S to make electrical connections to the opposite ends of the lower coil structures 316C.

The metal intermediate structures 334 include a number of upper plate structures 334S, a number of upper dummy structures 334D, a number of lower plate via structures 334V, and a number of lower side wall coil structures 334C. Each upper plate structure 334S represents the upper plate of a capacitor.

In the present example, only two upper plate structures 334S of two capacitors are shown for clarity. In addition, the upper dummy structures 334D, which are optional, are utilized to provide better edge definition to the upper plate structures 334S, and better dielectric thickness control and uniformity during dielectric planarization over metal structures. The metal intermediate structures 334 can be formed in a number of different ways.

In a first embodiment, as shown in FIGS. 12A-12D, the metal intermediate structures 334 are formed by first depositing a copper diffusion barrier layer 340 on dielectric structure 330 to line the lower plate openings 330L and the side wall coil openings 330S. Barrier layer 340 can be implemented with, for example, nitride, titanium nitride, titanium, or tantalum.

If barrier layer 340 is non-conductive, then a patterned photoresist layer is formed on barrier layer 340, followed by an etch to remove a portion of barrier layer 340. The portion of barrier layer 340 removed by the etch exposes the top surfaces of the lower plate structures 316S, and the opposite ends of each lower coil structure 316C.

After barrier layer 340, which is illustrated as a conductive barrier layer, has been formed, a seed layer 342 is conventionally formed on barrier layer 340 (and the exposed surfaces of the lower plate structures 316S, and the exposed opposite ends of each lower coil structure 316C when a non-conductive barrier layer is used). For example, seed layer 342 can be implemented with a layer of aluminum copper. Seed layer 342 can alternately be formed by depositing 300 Å of titanium, 3000 Å of copper, and 300 Å of titanium. After seed layer 342 has been formed, a plating mold 344 is formed on the top surface of seed layer 342.

As shown in FIGS. 13A-13D, following the formation of plating mold 344, copper is electroplated in a conventional manner approximately 5 µm thick to form the upper plate structures 334S, the upper dummy structures 334D, the lower plate via structures 334V in the lower plate openings 330L, and the lower side wall coil structures 334C in the side wall coil openings 330S. After this, as shown in FIGS. 14A-14D, plating mold 344 and the exposed regions of seed layer 342 and barrier layer 340 are removed in a conventional manner.

In a second embodiment, as shown in FIGS. 15A-15D, the metal intermediate structures 334 are formed by first depositing a liner layer 350 on dielectric structure 330 to line the lower plate openings 330L and the side wall coil openings 330S. Liner layer 350 can be implemented with, for example, titanium/titanium nitride. After liner layer 350 has been formed, a metal layer 352, such as tungsten, is conventionally deposited on liner layer 350 to fill up the lower plate openings 330L and the side wall coil openings 330S.

Following this, as shown in FIGS. 16A-16D, metal layer 352 is planarized, such as with chemical-mechanical polishing, to expose the top surface of dielectric structure 330, and form via plug structures 352P in the lower plate openings 330L that make electrical connections to the lower plate structures 316S, and in the side wall coil openings 330S that make electrical connections to the opposite ends of the lower coil structures 316C.

As shown in FIGS. 17A-17D, after the via plug structures 352P have been formed, a metal layer 354, such as aluminum, is sputter deposited onto the non-conductive top surface 330T of dielectric structure 330 to a depth of approximately 5 µm.

Alternately, metal layer 354 can include multiple layers of metal such as, for example, a layer of titanium, a layer of titanium nitride, a layer of aluminum copper, a layer of titanium, and a layer of titanium nitride.

Once metal layer 354 has been formed, a patterned photoresist layer 356 approximately 1.0 μm thick is formed on the top surface of metal layer 354 in a conventional manner. Following the formation of patterned photoresist layer 356, metal layer 354 is etched to remove the exposed regions of metal layer 354 and form the upper plate structures 334S, the dummy structures 334D, the lower plate via structures 334V in the lower plate openings 330L that make electrical connections to the lower plate structures 316S, and the lower side wall coil structures 334C in the side wall coil openings 330S that make electrical connections to the opposite ends of the lower coil structures 316C.

Metal layer 354 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 356 is then removed in a conventional manner, such as with acetone. Once patterned photoresist layer 356 has been removed, the resulting structure is conventionally cleaned to remove organics, such as with a Piranha etch.

As shown in FIGS. 18A-18D, after the upper plate structures 334S, the dummy structures 334D, the lower plate via structures 334V, and the lower side wall coil structures 334C have been formed, a magnetic core structure 360 is formed on the top surface 330T of dielectric structure 330. Magnetic core structure 360, in turn, can be formed in a number of ways.

In a first embodiment, as shown in FIGS. 19A-19D, a layer of silicon nitride 360N approximately 0.6 μm thick is deposited on the top surface of dielectric structure 330 and the metal intermediate structures 334, followed by the deposition of a seed layer 360S on the top surface of nitride layer 360N. For example, seed layer 360S can be implemented with a layer of aluminum copper. Seed layer 360S can alternately be formed by depositing 300 Å of titanium, 3000 Å of copper, and 300 Å of titanium.

After seed layer 360S has been formed, a magnetic material, such as an alloy of nickel and iron like permalloy, is electroplated to a thickness of, for example, 5 μm to form a magnetic material layer 360Y. Following this, a patterned photoresist mask 360M is formed on magnetic material layer 360Y.

Next, as illustrated in FIGS. 20A-20D, the exposed regions of magnetic material layer 360Y and seed layer 360S are etched and removed to form magnetic core structure 360. In this example, nitride layer 360N is left in place, but the exposed regions could alternately be removed. Patterned photoresist layer 360M is then removed in a conventional manner. In addition, a plating mold can alternately be used to define the regions where the magnetic material is to be electroplated.

In a second embodiment, as shown in FIGS. 21A-21D, a magnetic material layer 362 is sputter deposited on the top surface 330T of dielectric structure 330 and the metal intermediate structures 334. Magnetic material layer 362 can be implemented with, for example, cobalt tantalum zirconium (CoTaZr) or permalloy.

Following this, a patterned photoresist layer 364 is formed on magnetic material layer 362. After patterned photoresist layer 364 has been formed, the exposed regions of magnetic material layer 362 are etched and removed to form magnetic core structure 360. Patterned photoresist layer 364 is then removed in a conventional manner.

Following the formation of magnetic core structure 360, as shown in FIGS. 22A-22D, a dielectric structure 370 with a substantially planar top surface 370T is formed on the non-conductive top surface 330T of dielectric structure 330, the upper plate structures 334S, the upper dummy structures 334D, the lower plate via structures 334V, and the lower side wall coil structures 334C.

In the present example, dielectric structure 370 can be formed by conventionally depositing a silicon nitride layer 370N on the top surface 330T of dielectric structure 330, the metal intermediate structures 334, and magnetic core structure 360. When, as in the first (electroplated) embodiment, nitride layer 360N (FIGS. 20A-20D) is left in place, a patterned photoresist layer substantially opposite to patterned photoresist layer 360M (FIGS. 19A-19D) can be formed on silicon nitride layer 370N. Following this, the exposed regions of silicon nitride layer 370N can be etched until silicon nitride layer 370N has been substantially removed from silicon nitride layer 360N to provide a nitride layer with a substantially uniform thickness.

Figure 22A:
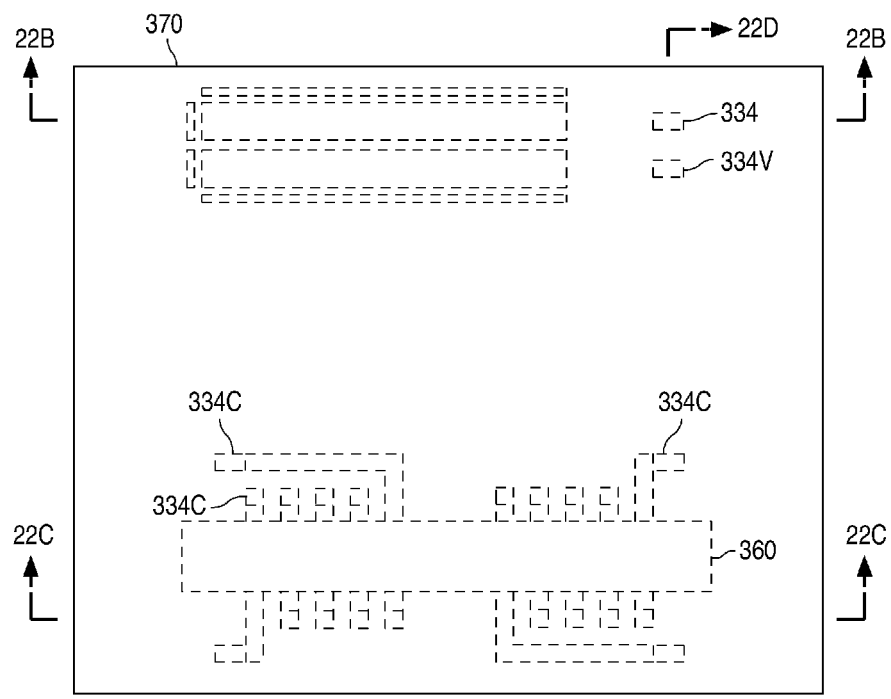
Figure 22B:
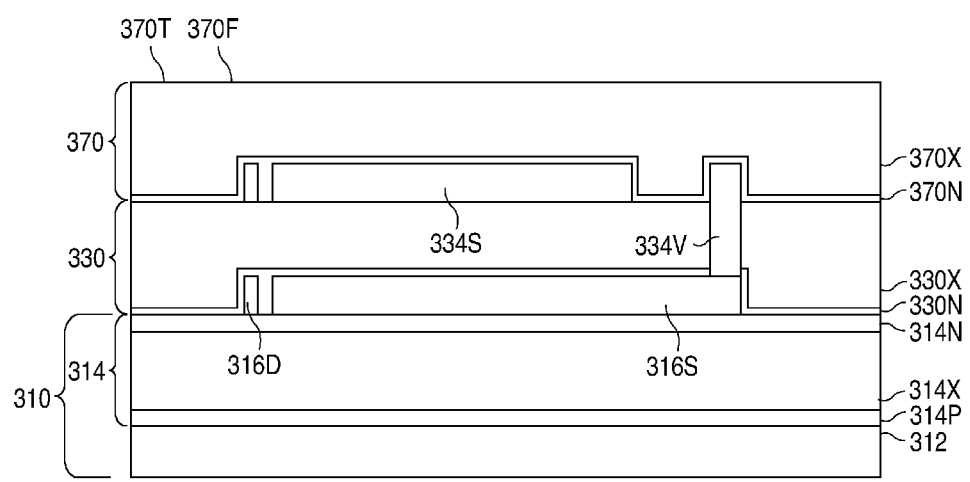
Figure 22C:
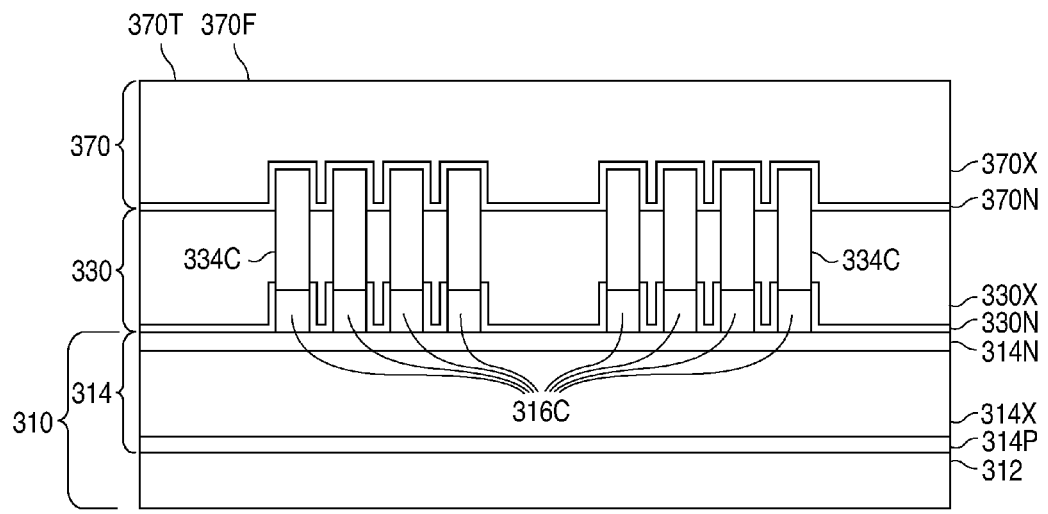
Figure 22D:
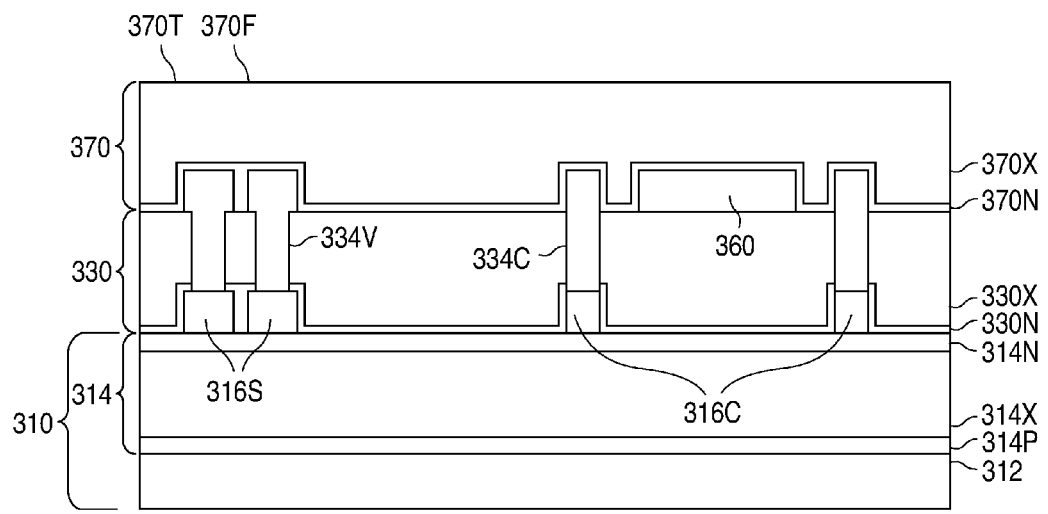
Figure 23A:
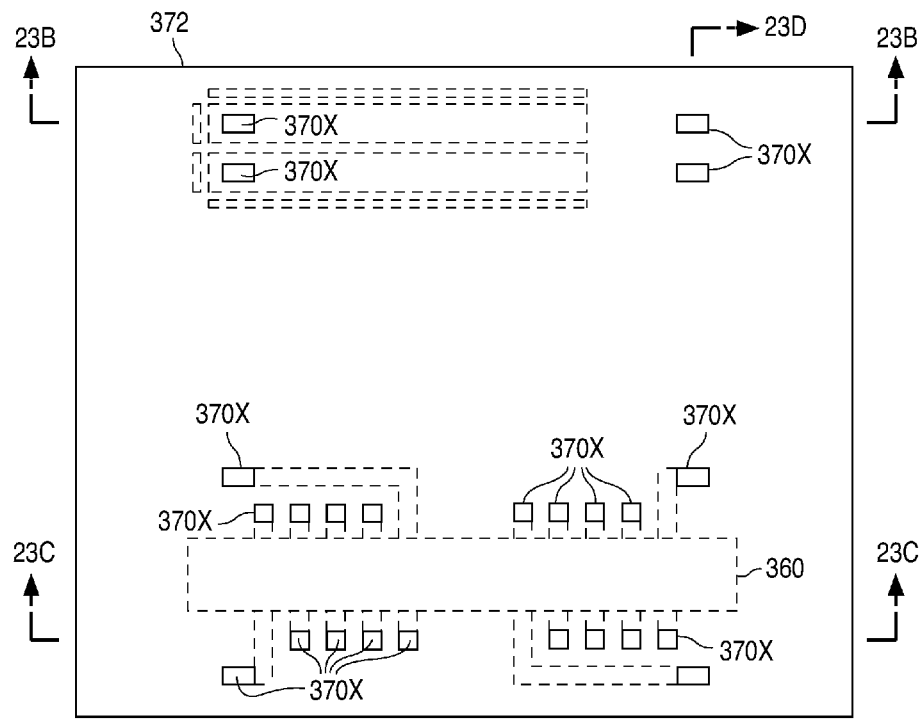
Figure 23B:
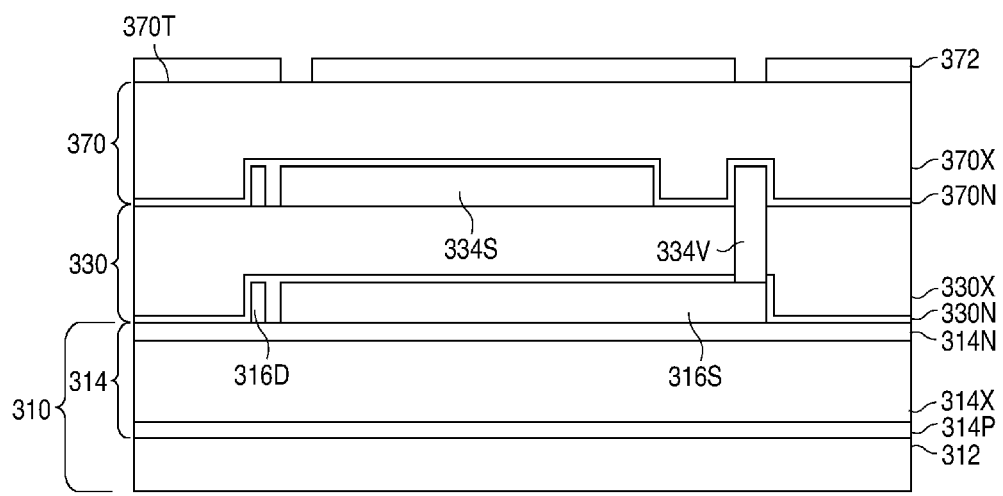
Figure 23C:
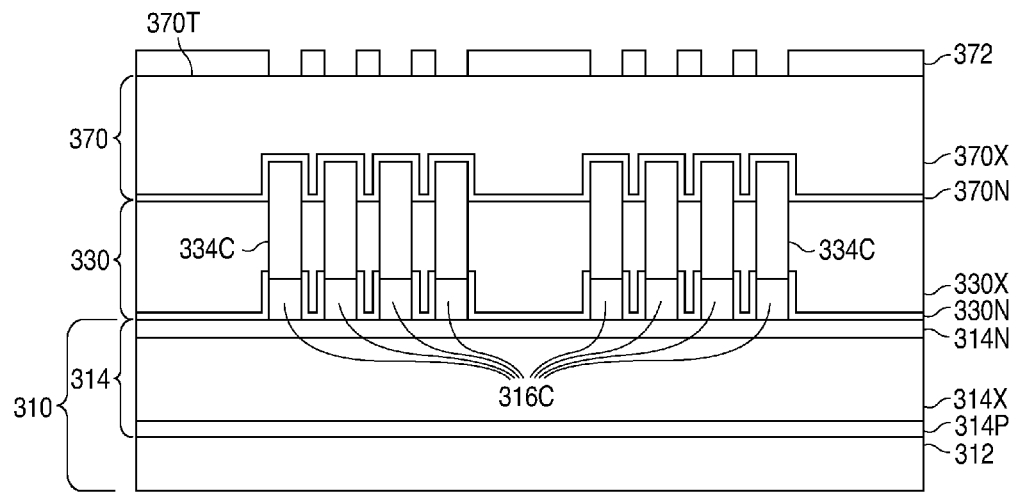
Figure 23D:
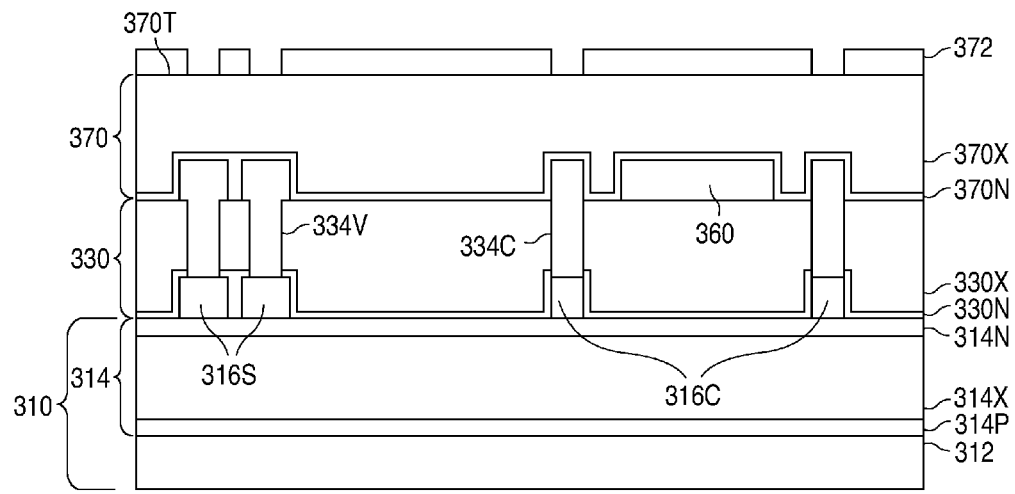
Figure 24A:
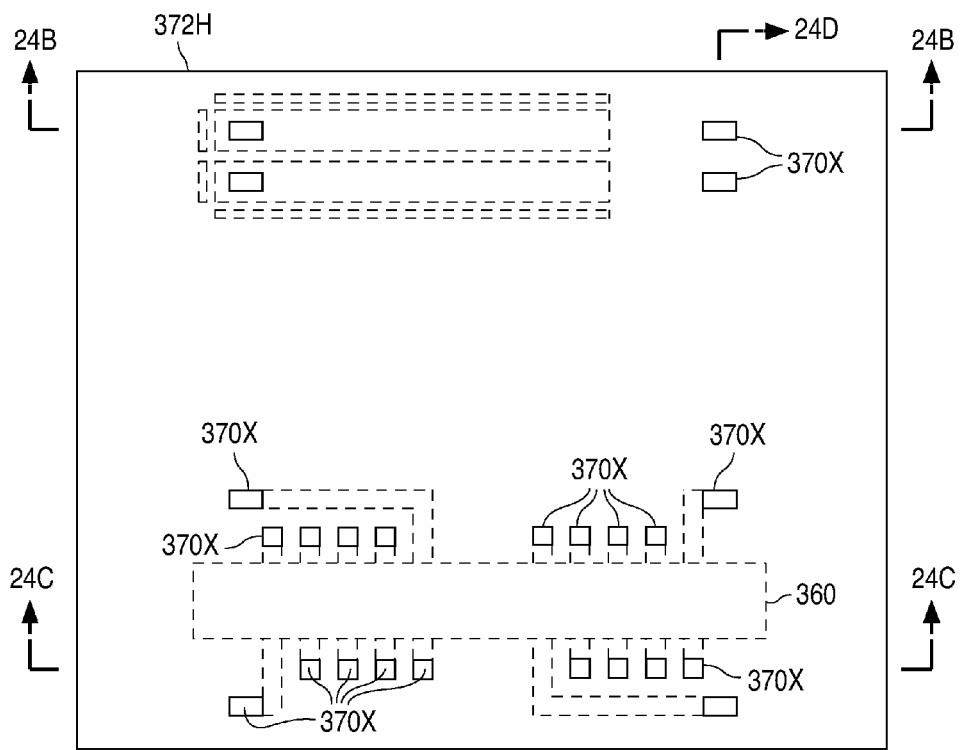
Figure 24B:
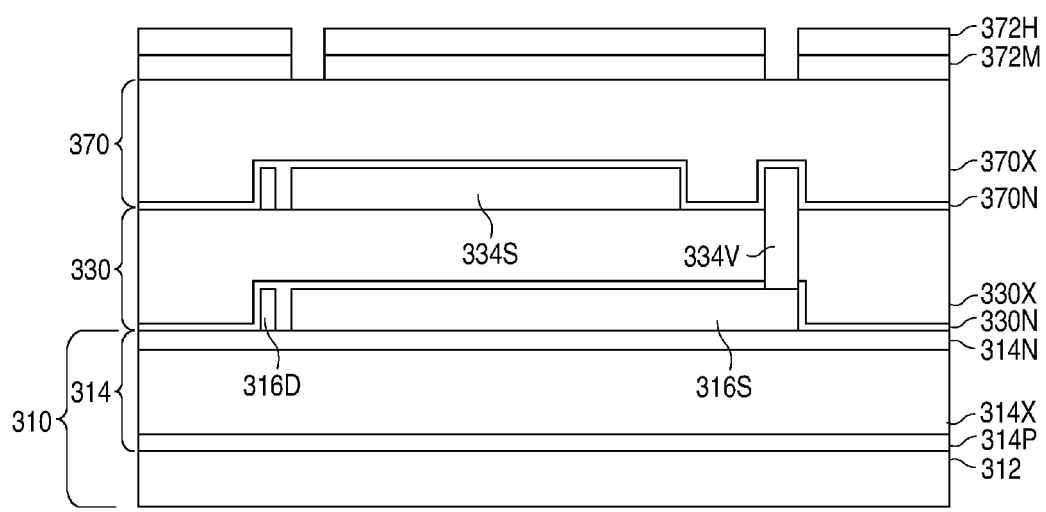
Figure 24C:
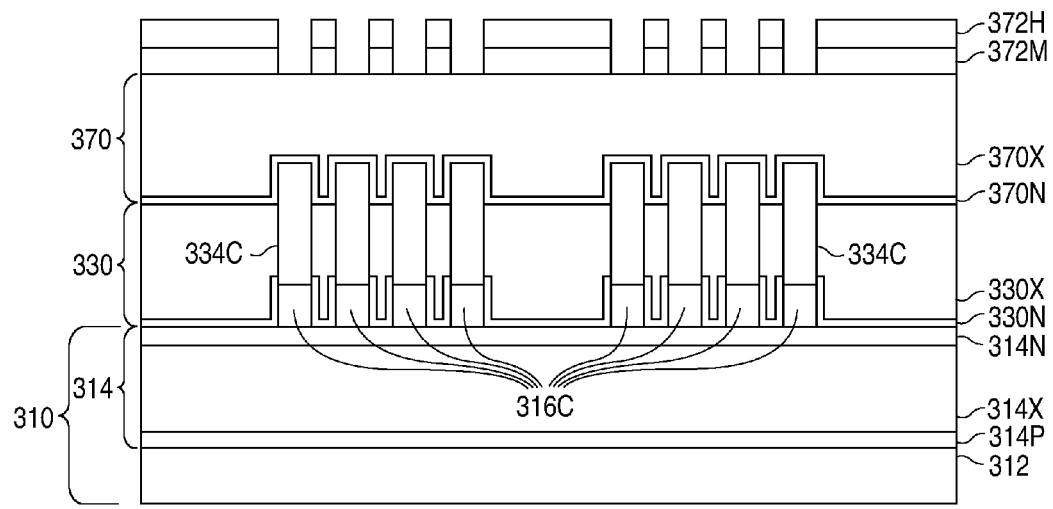
Figure 24D:
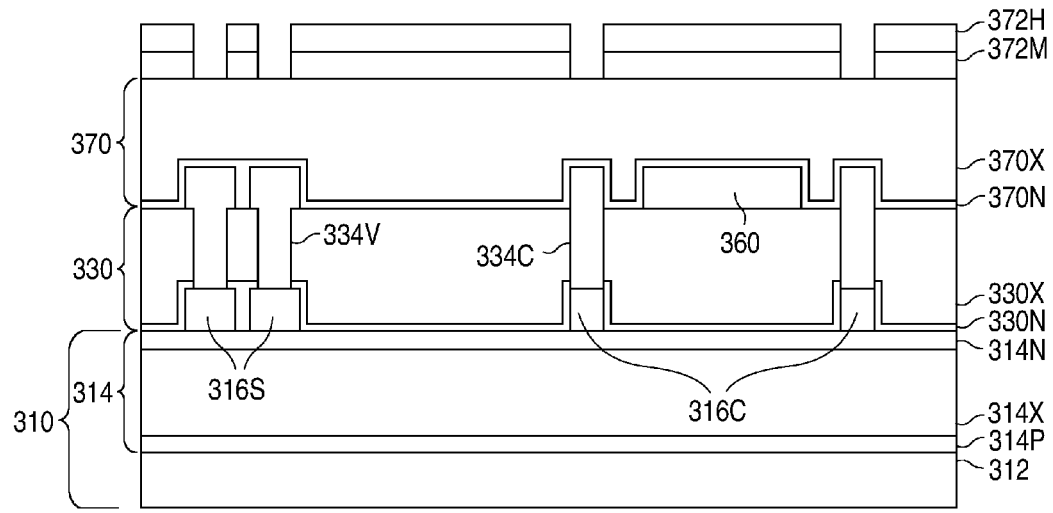
Figure 25A:
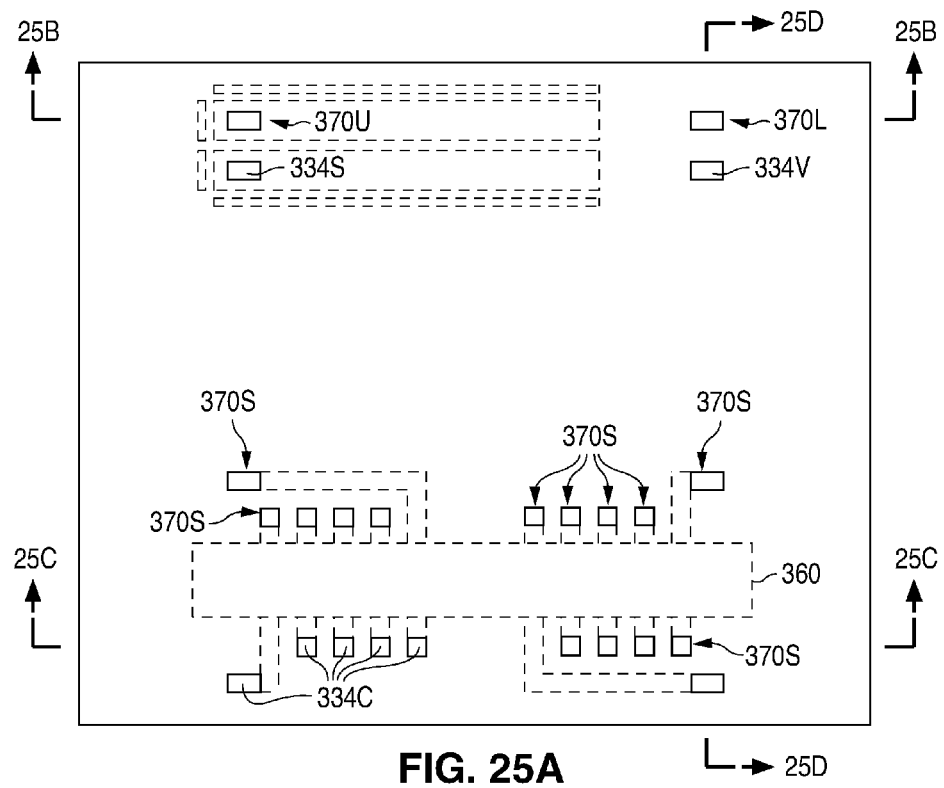
Figure 25B:
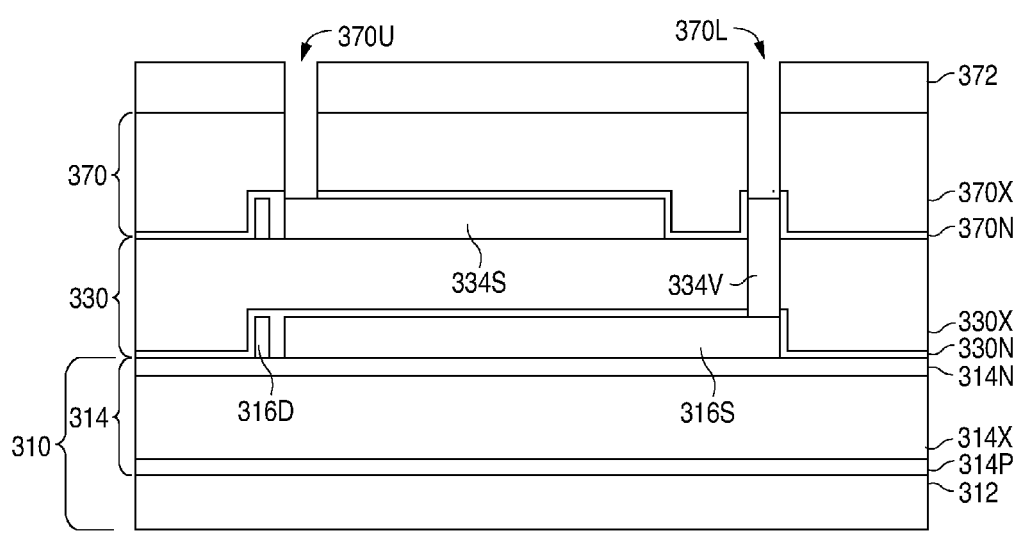
Figure 25C:
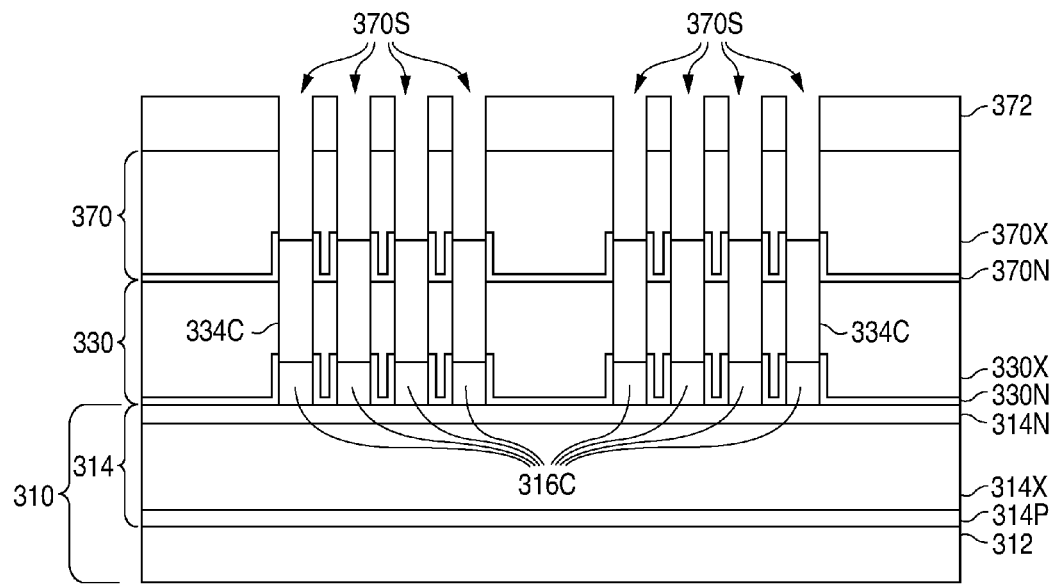
Figure 25D:
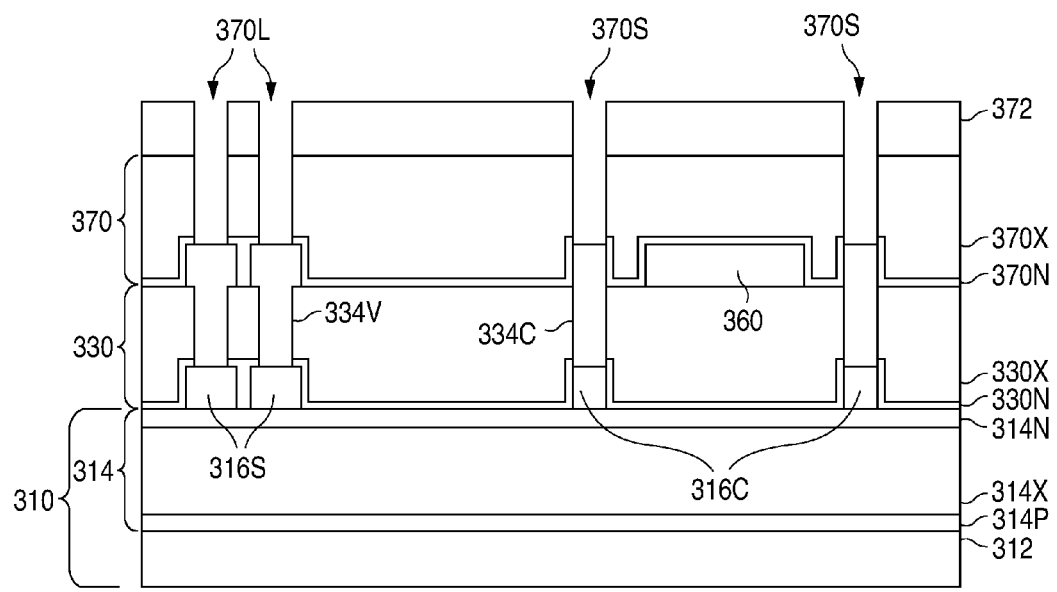
Figure 26A:
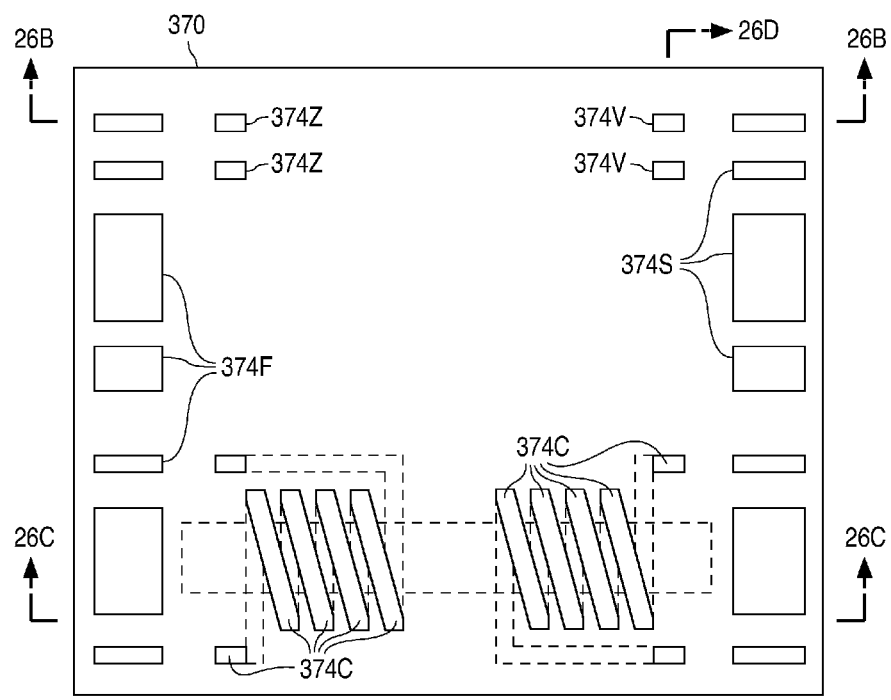
Figure 26B:
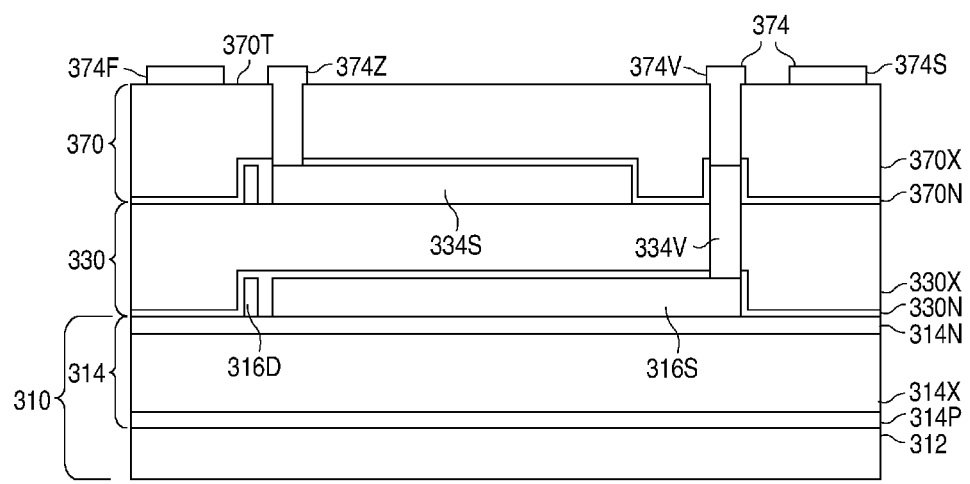
Figure 26C:
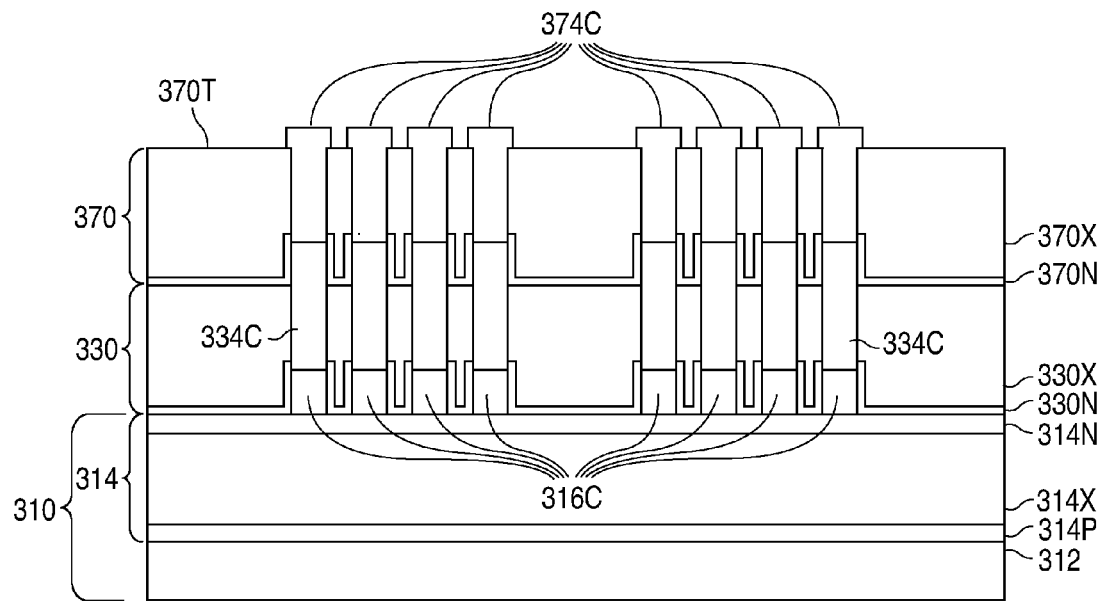
Figure 26D:
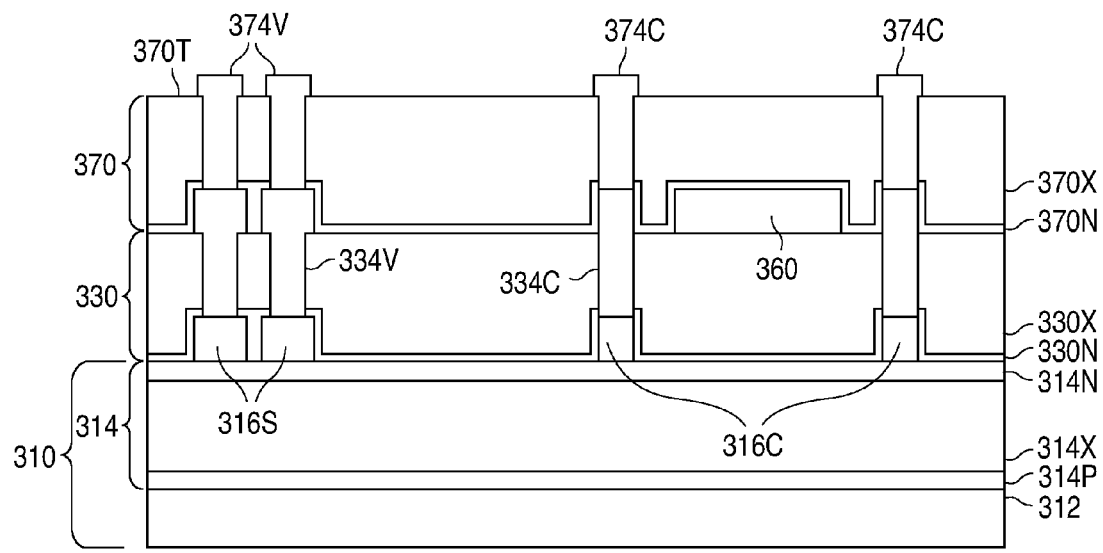
Figure 27A:
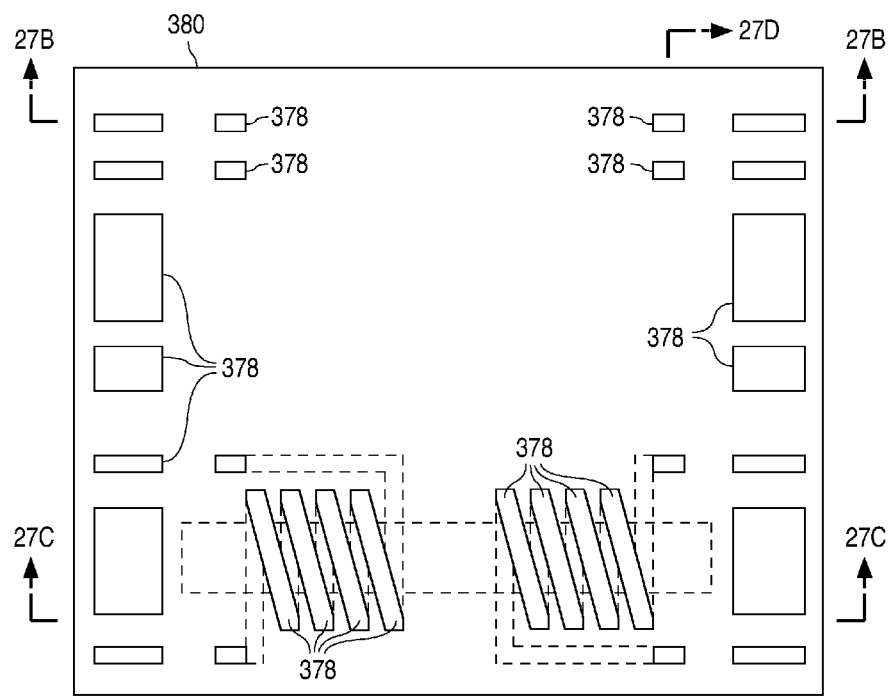
Figure 27B:
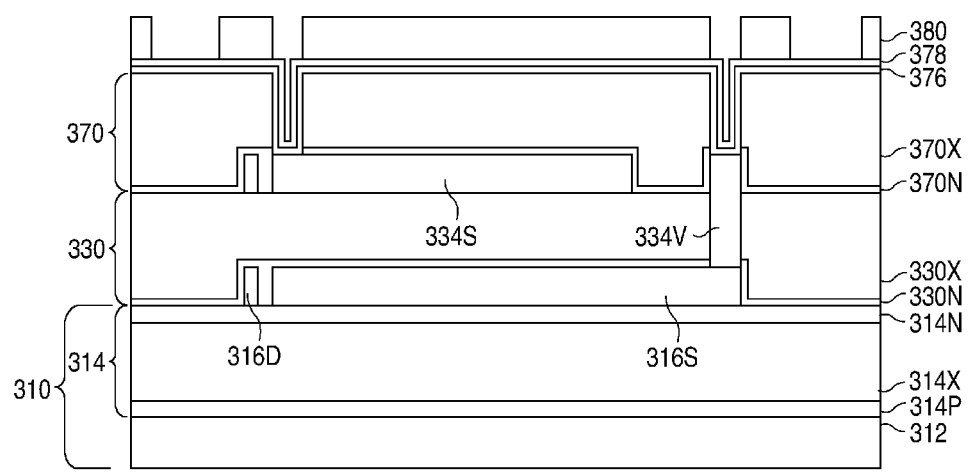
Figure 27C:
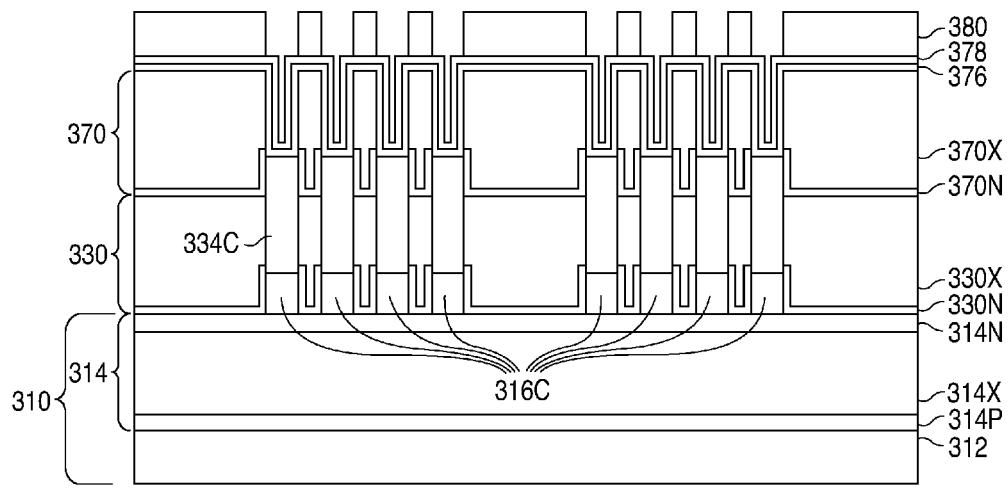
Figure 27D:
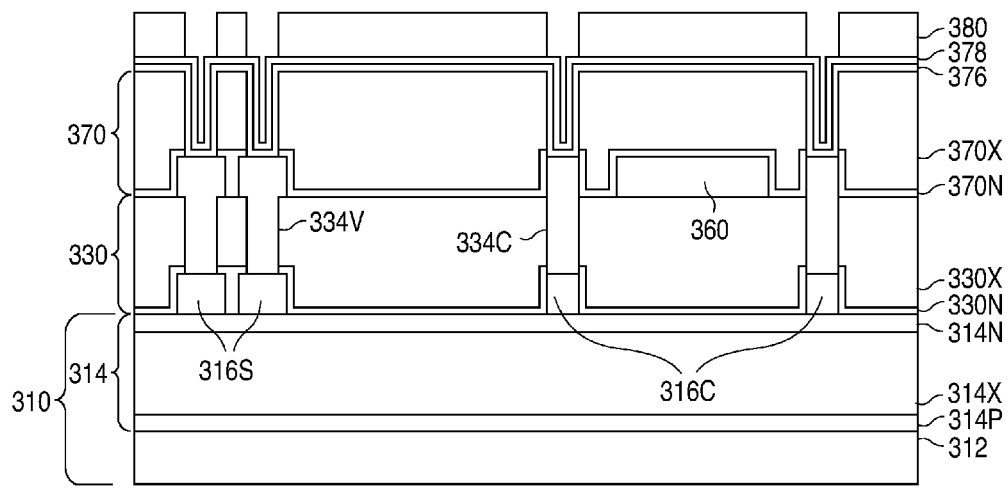
Figure 28A:
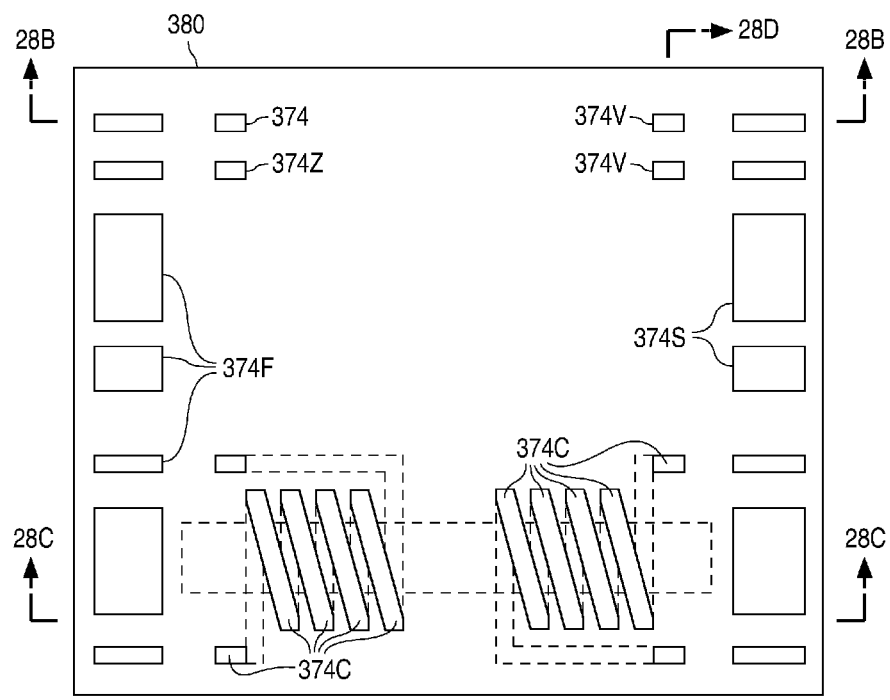
Figure 28B:
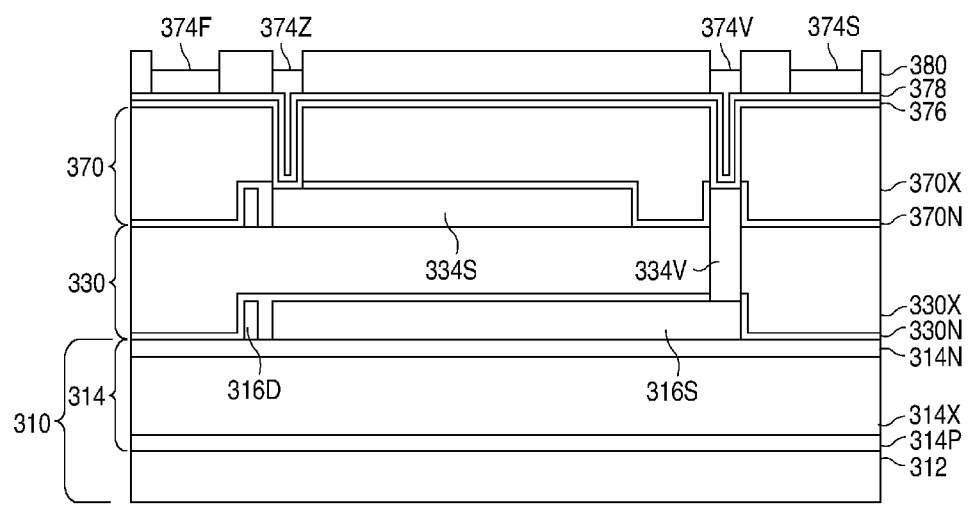
Figure 28C:
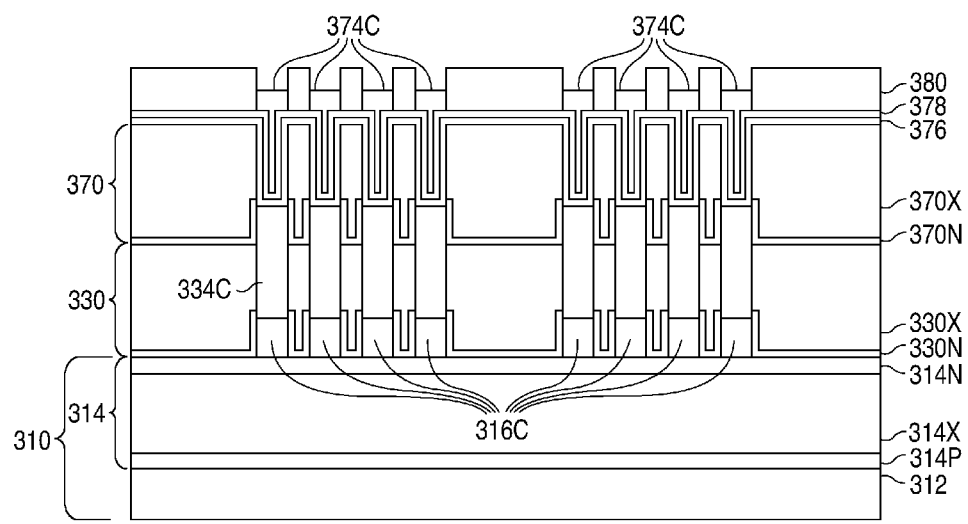
Figure 28D:
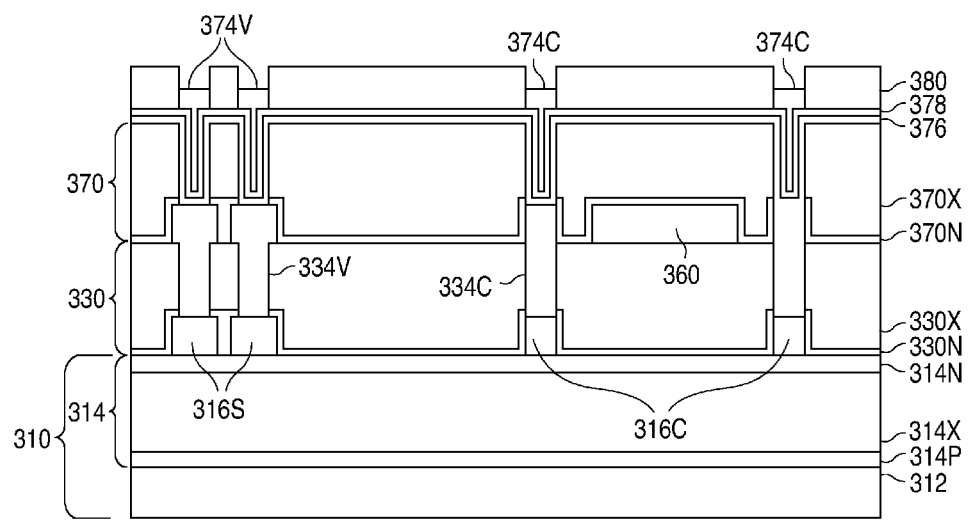
Figure 29A:
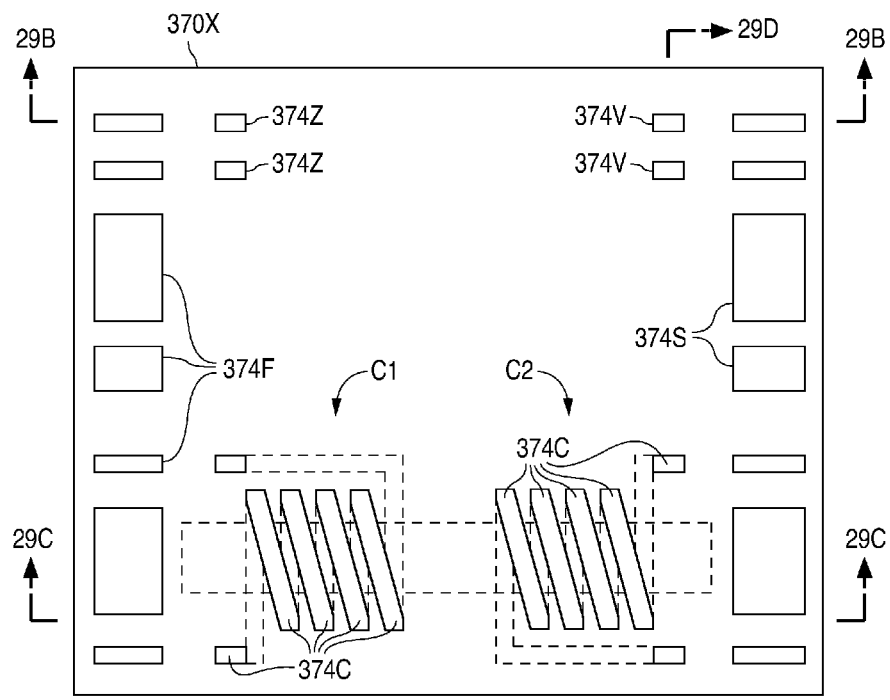
Figure 29B:
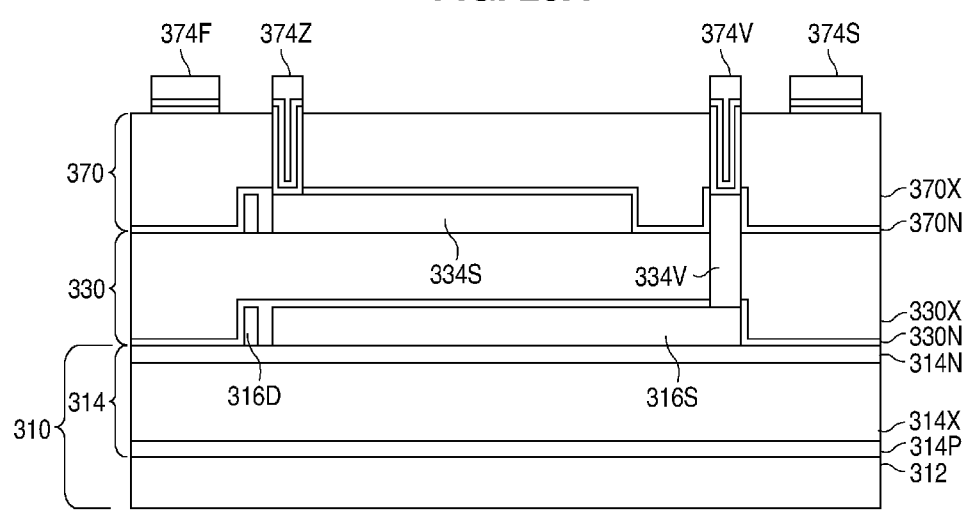
Figure 29C:
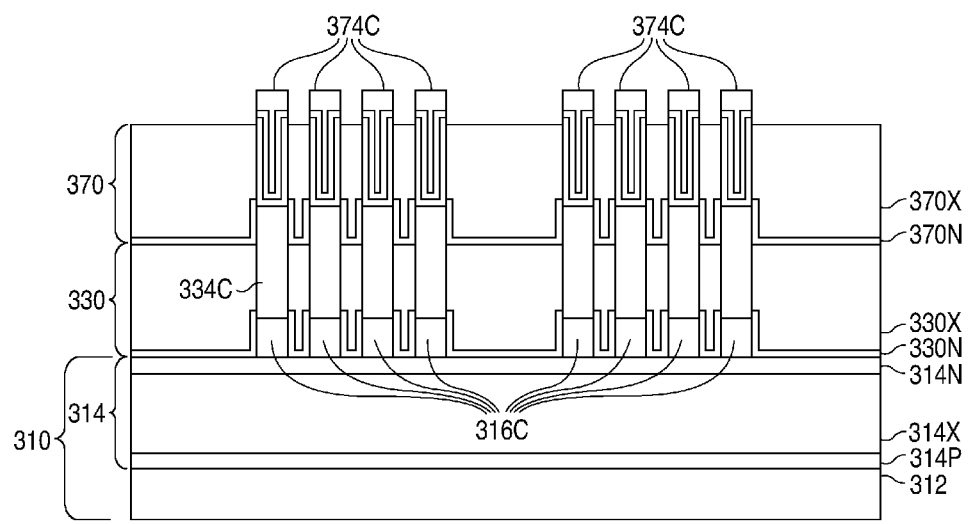
Figure 29D:
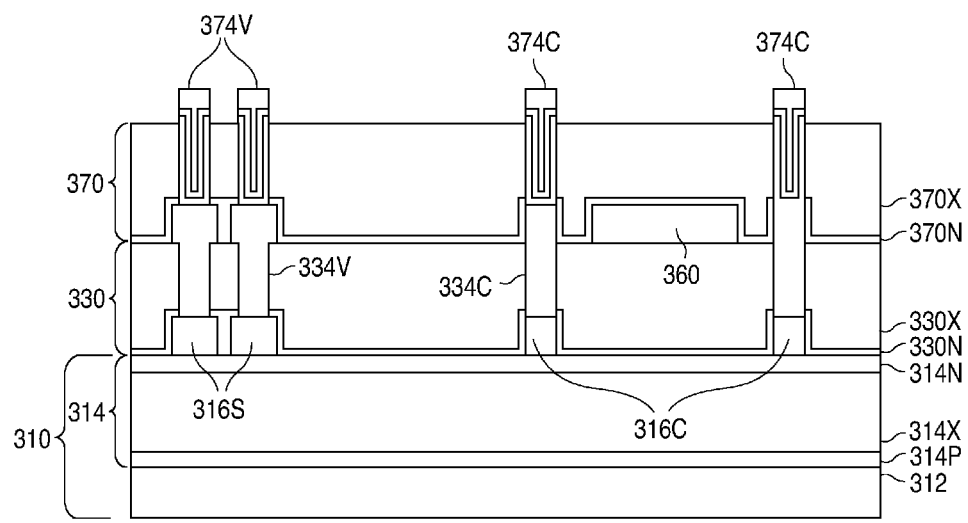
Figure 30A:
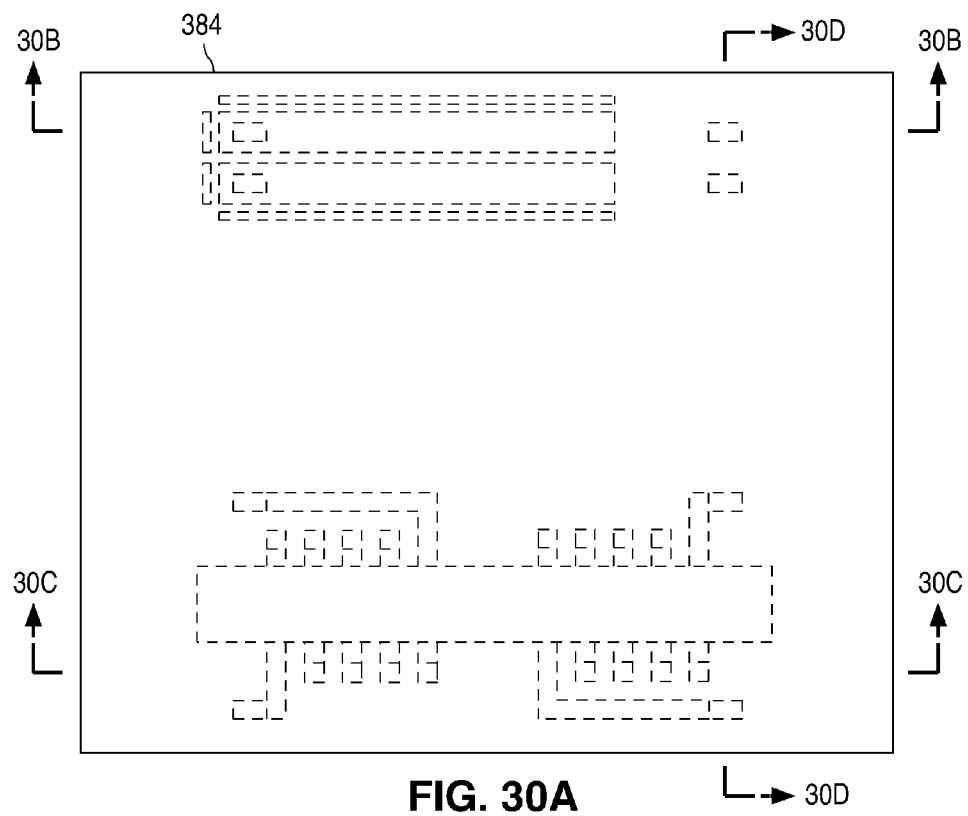
Figure 30B:
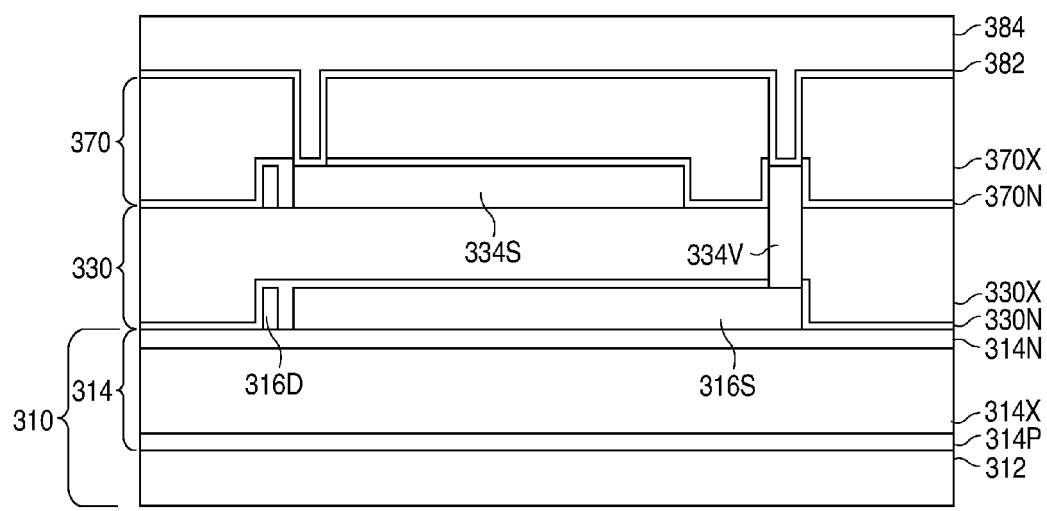
Figure 30C:
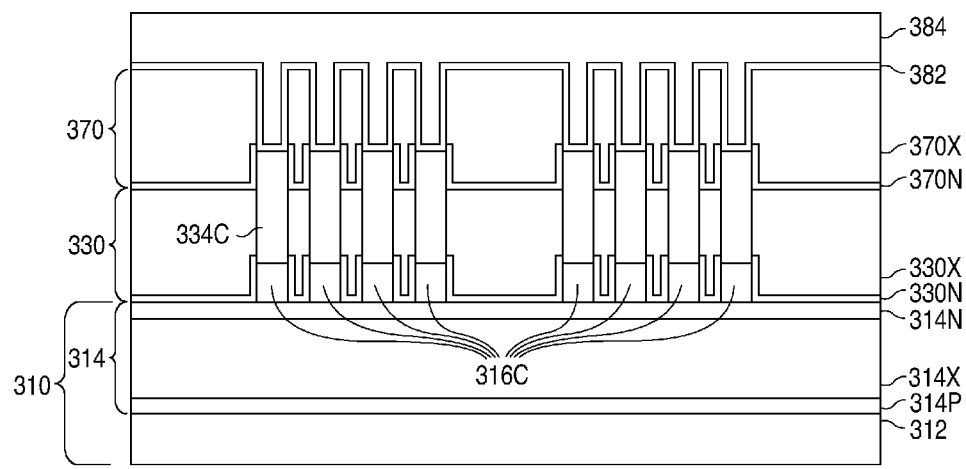
Figure 30D:
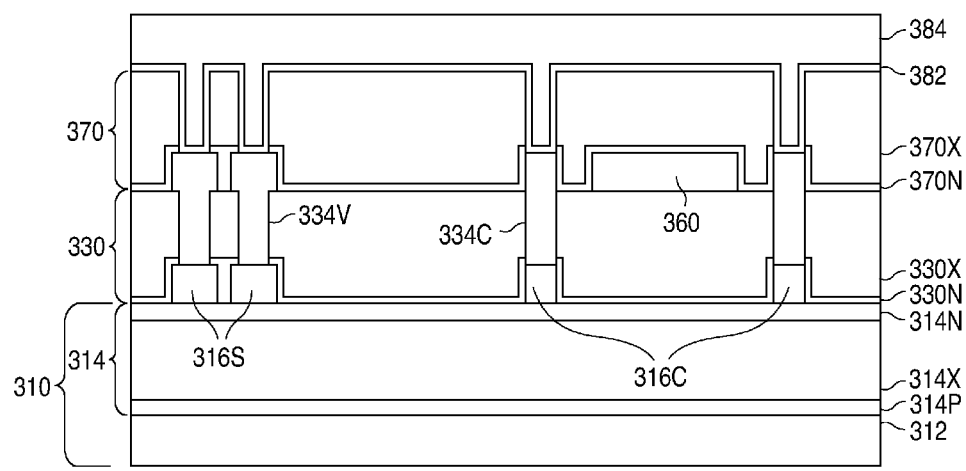
Figure 31A:
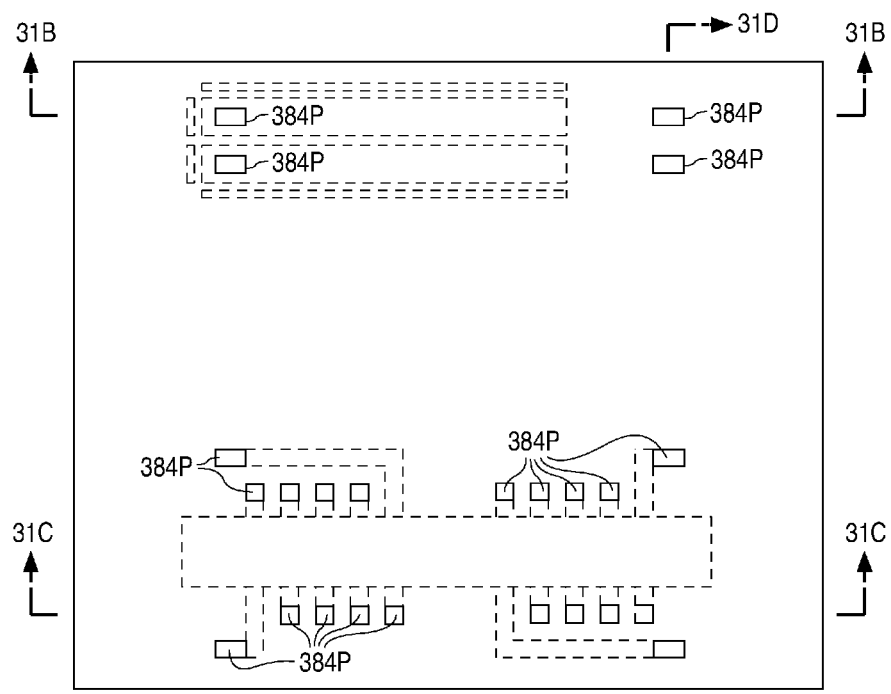
Figure 31B:
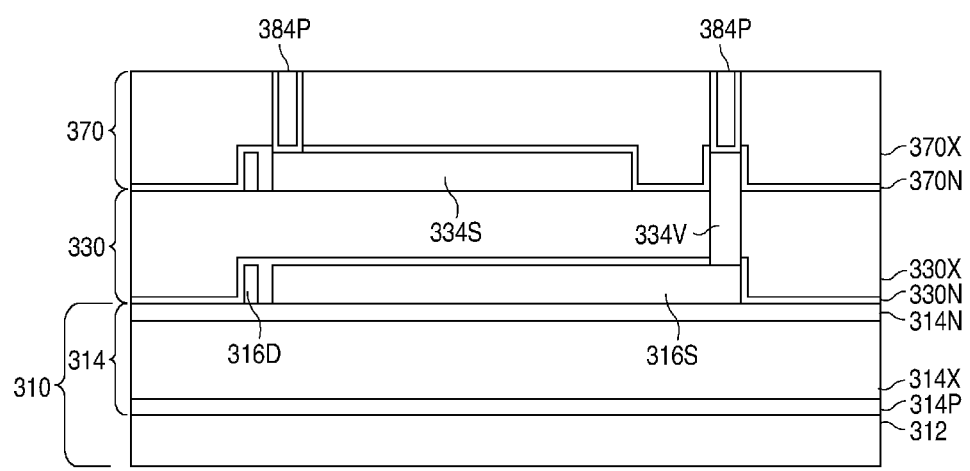
Figure 31C:
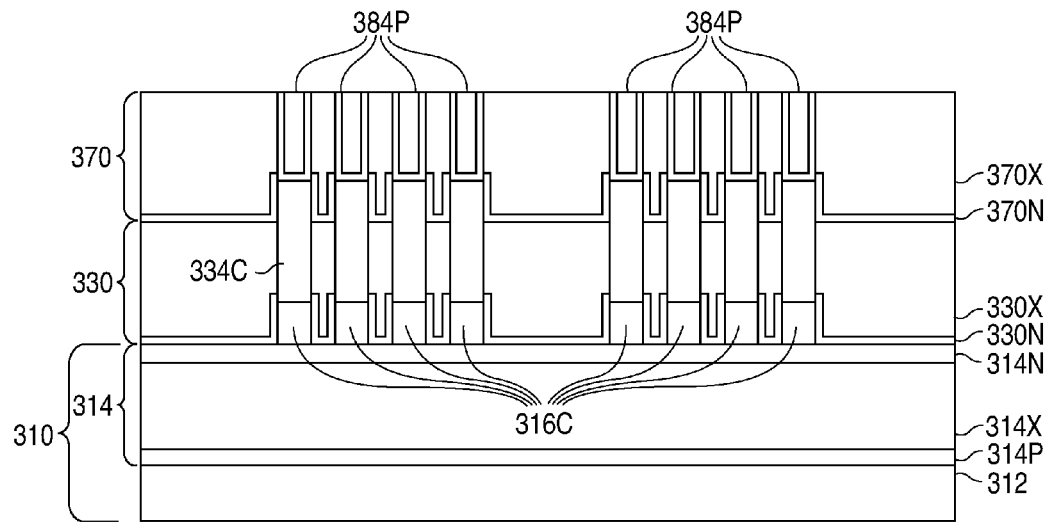
Figure 31D:
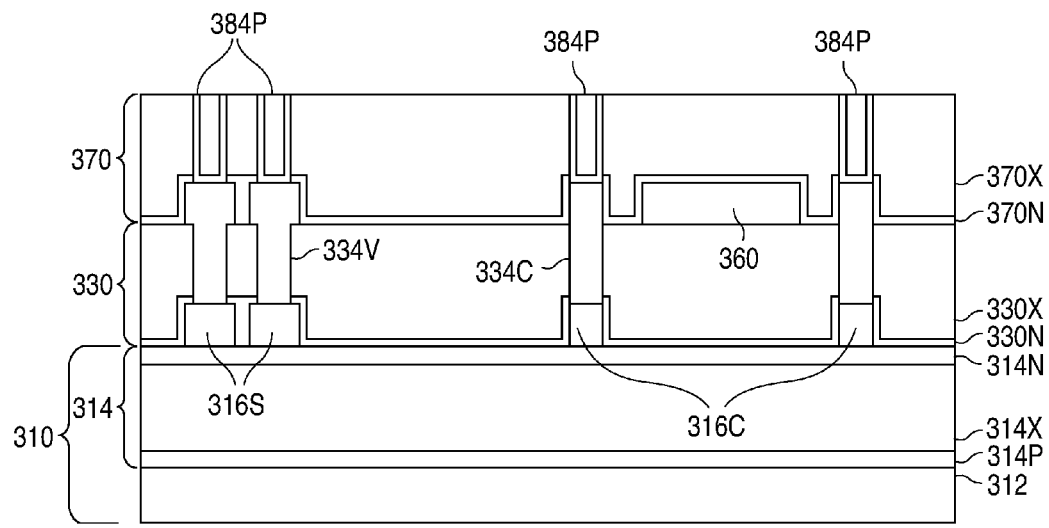
Figure 32A:
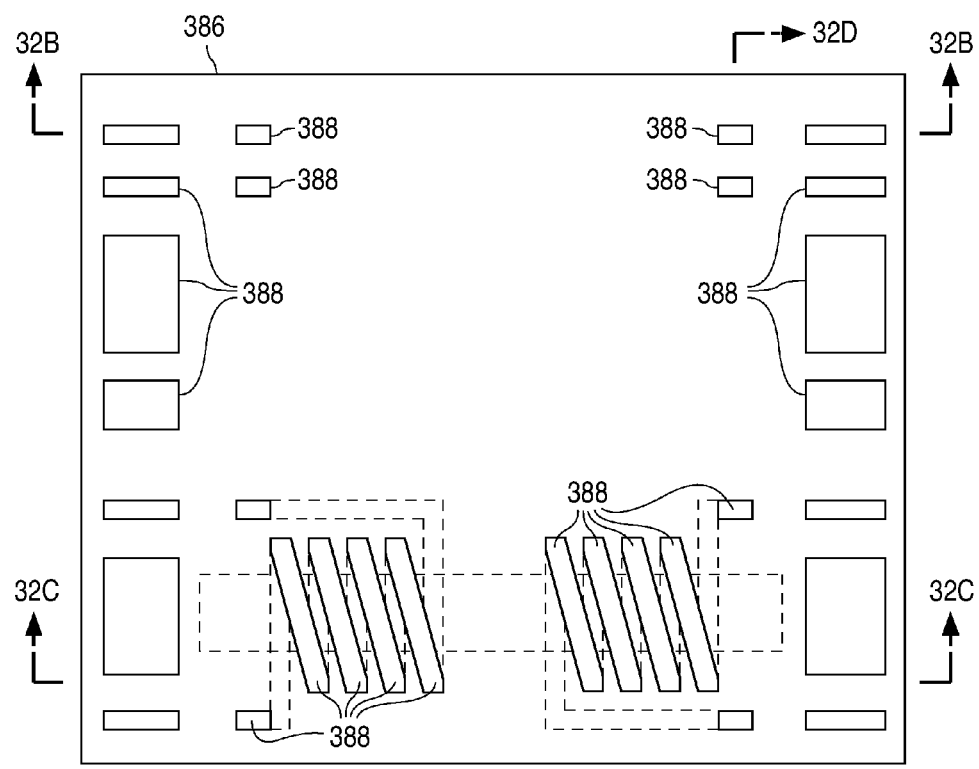
Figure 32B:
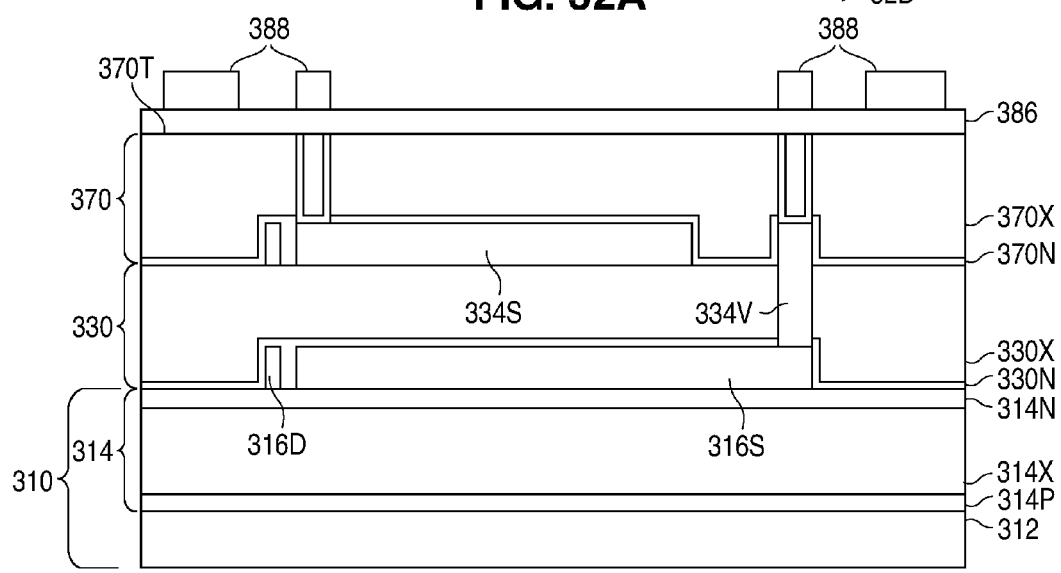
Figure 32C:
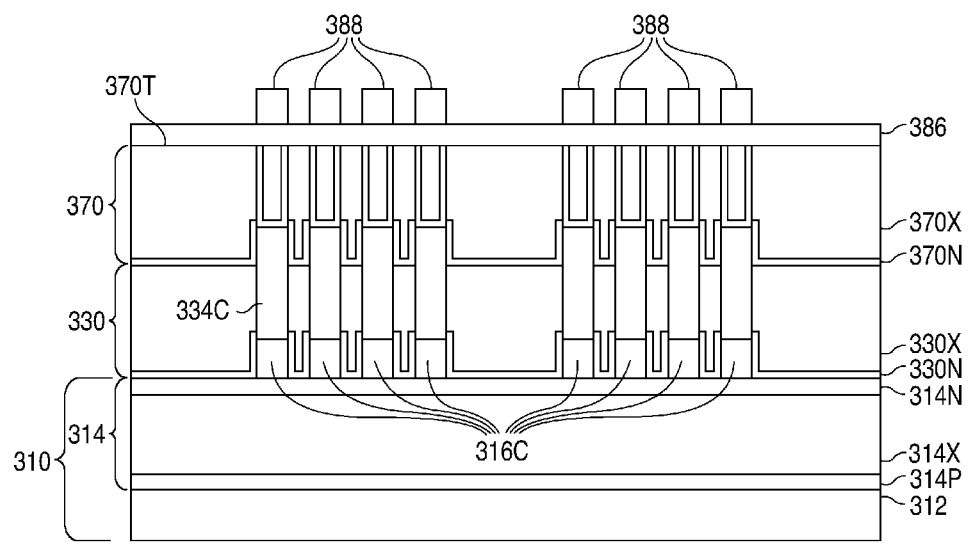
Figure 32D:
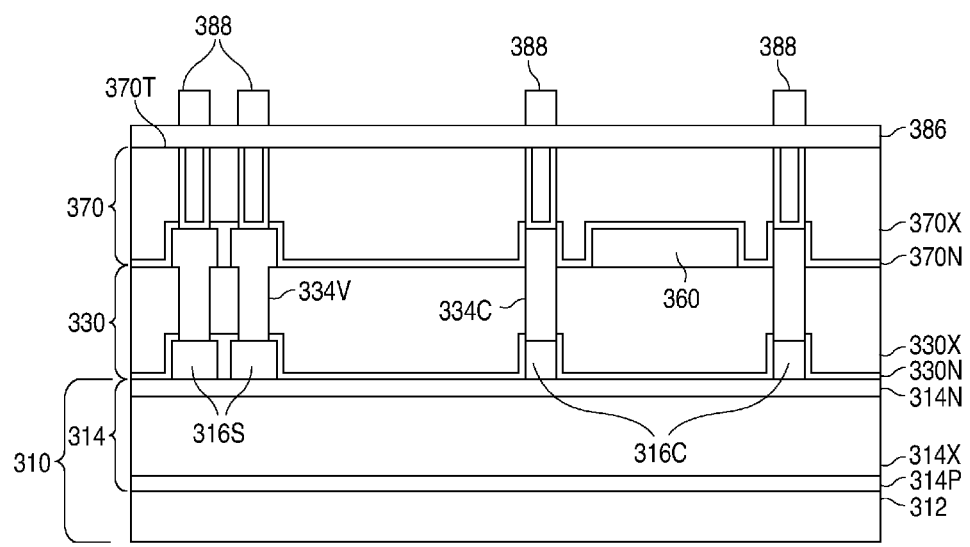
Figure 33A:
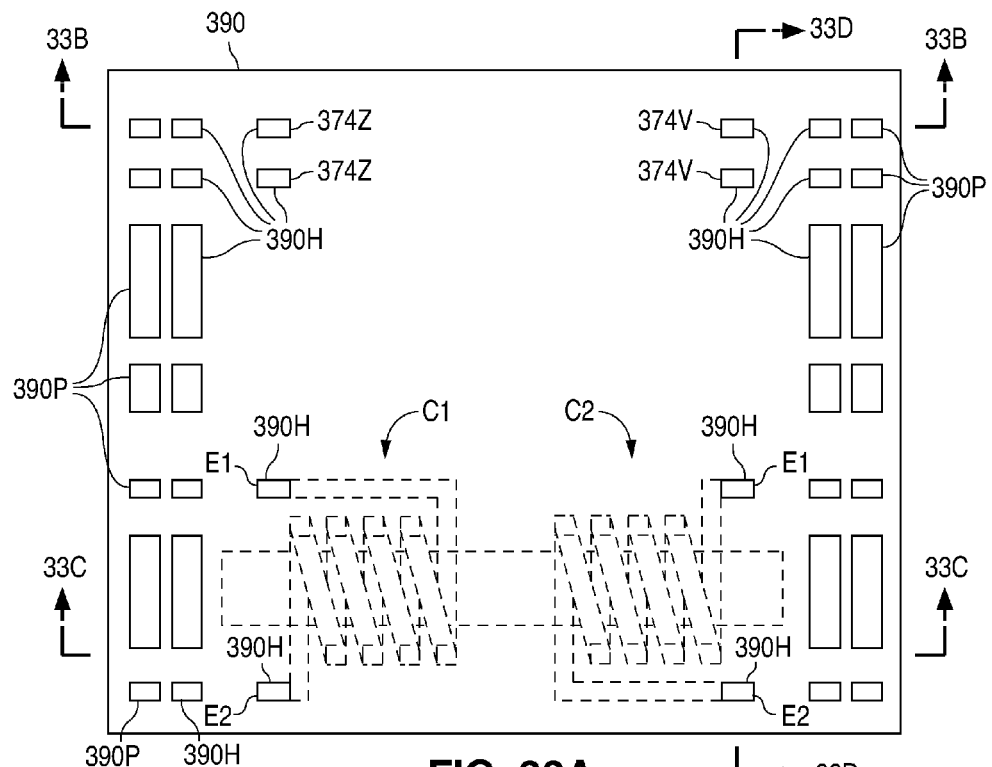
Figure 33B:
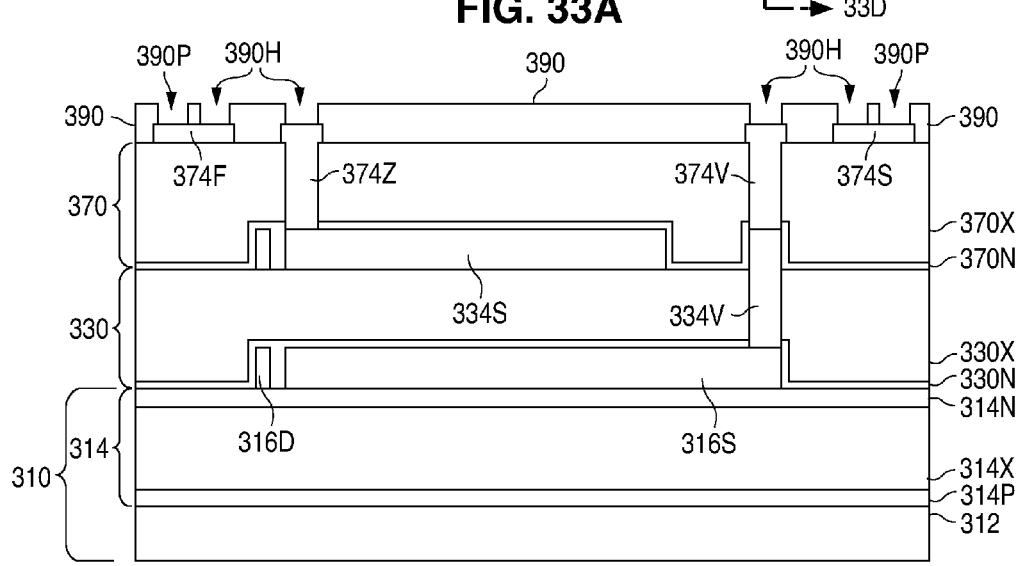
Figure 33C:
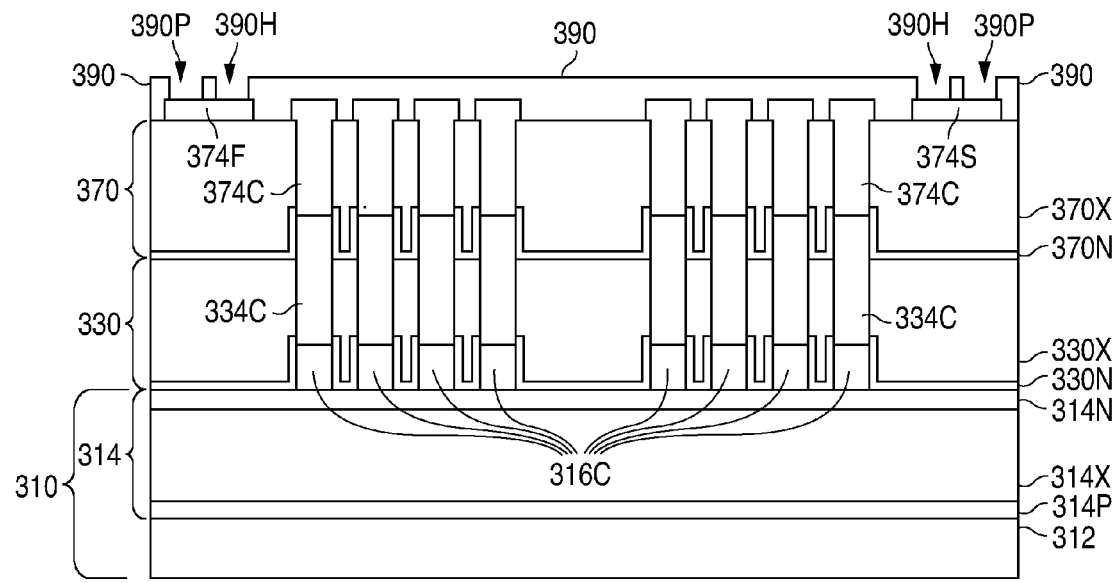
Figure 33D:
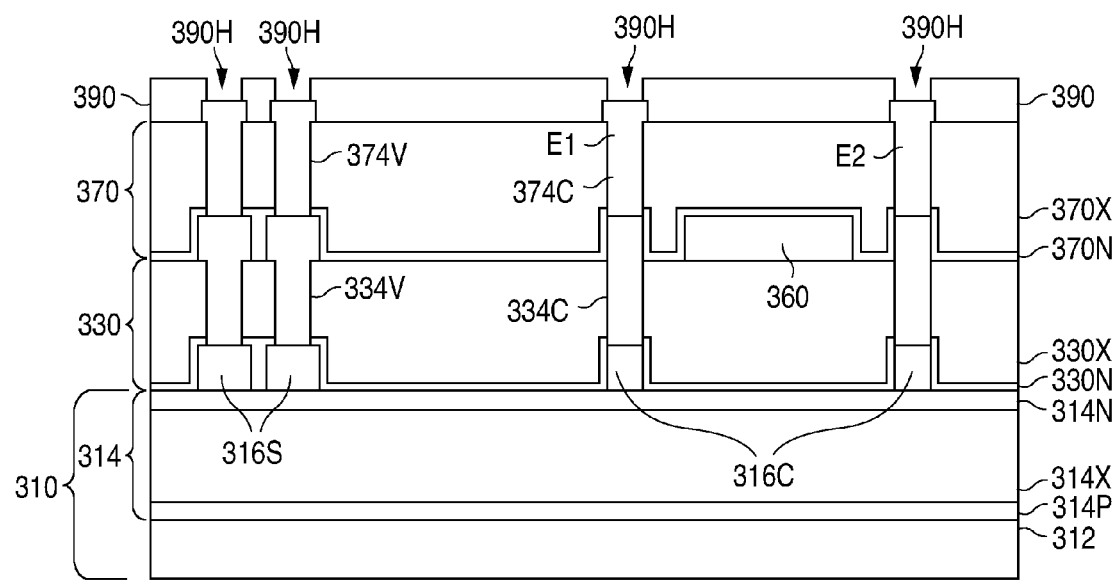
Figure 34A:
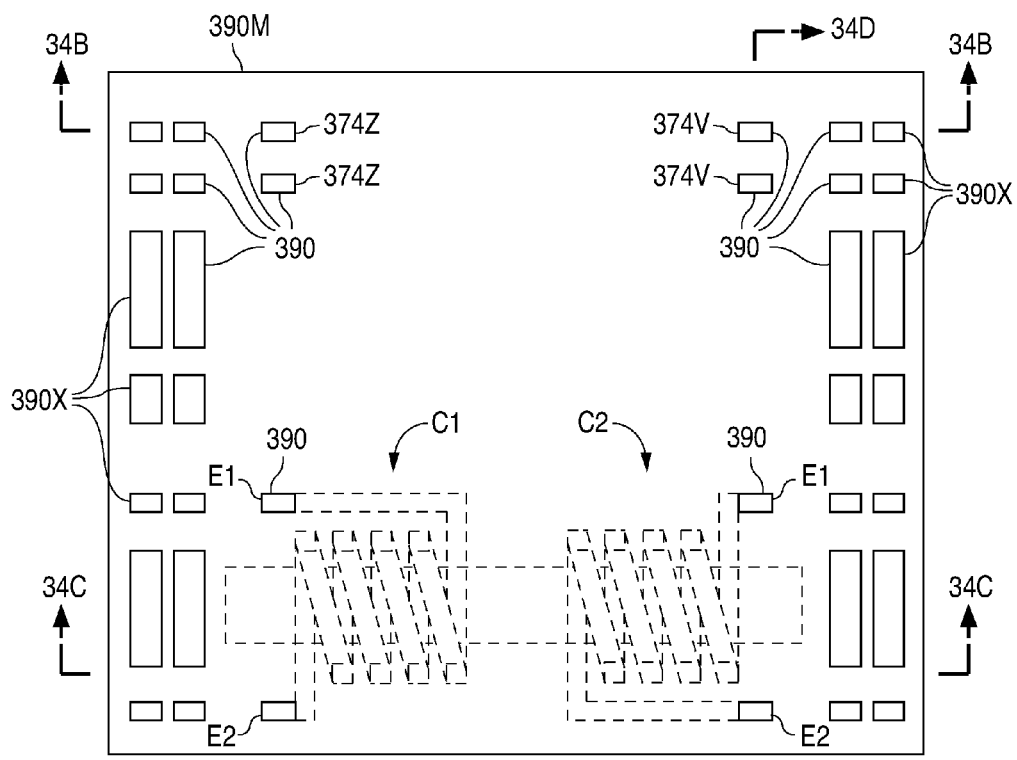
Figure 34B:
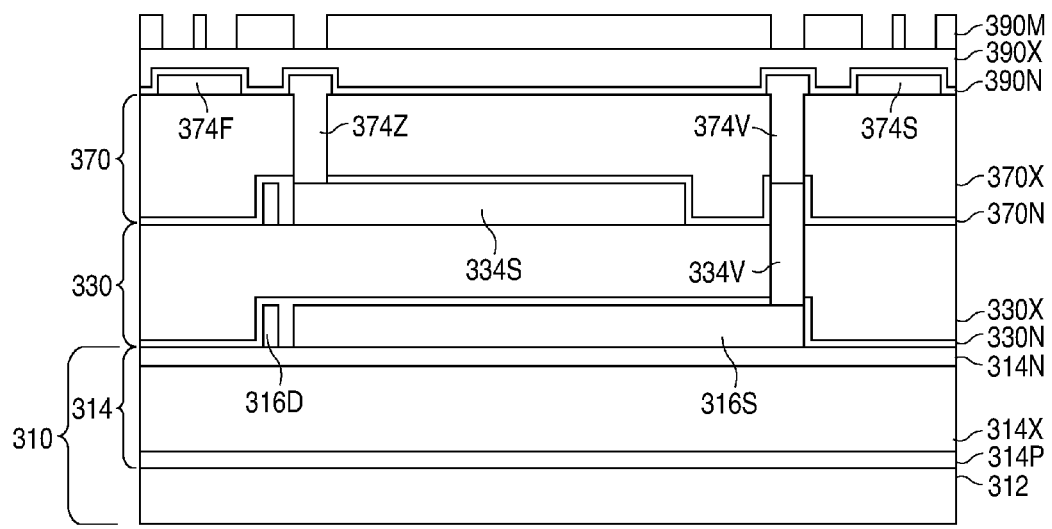
Figure 34C:
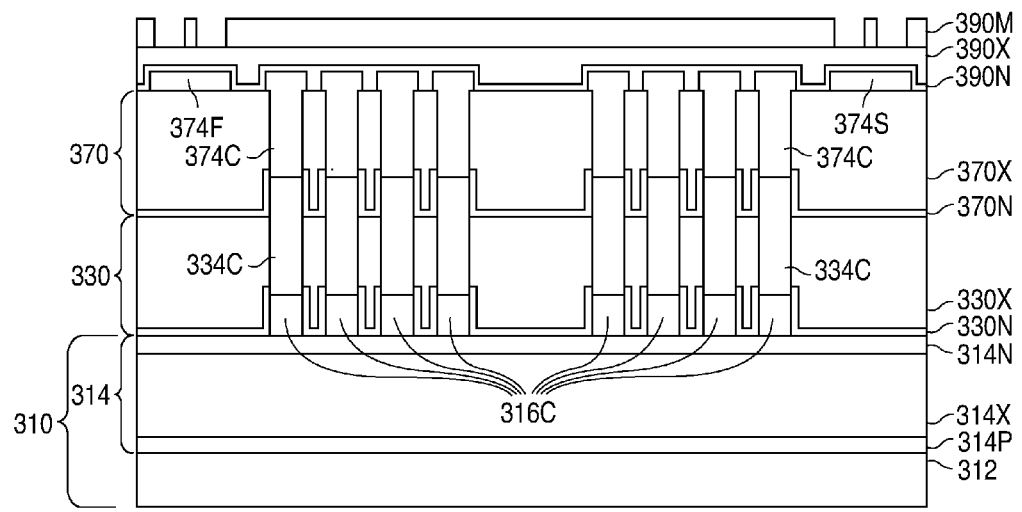
Figure 34D:
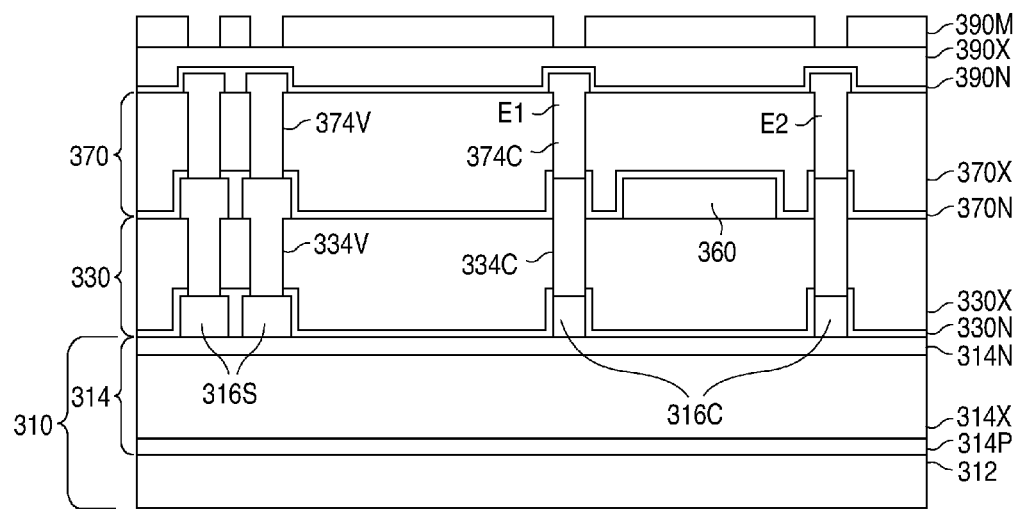
Figure 35A:
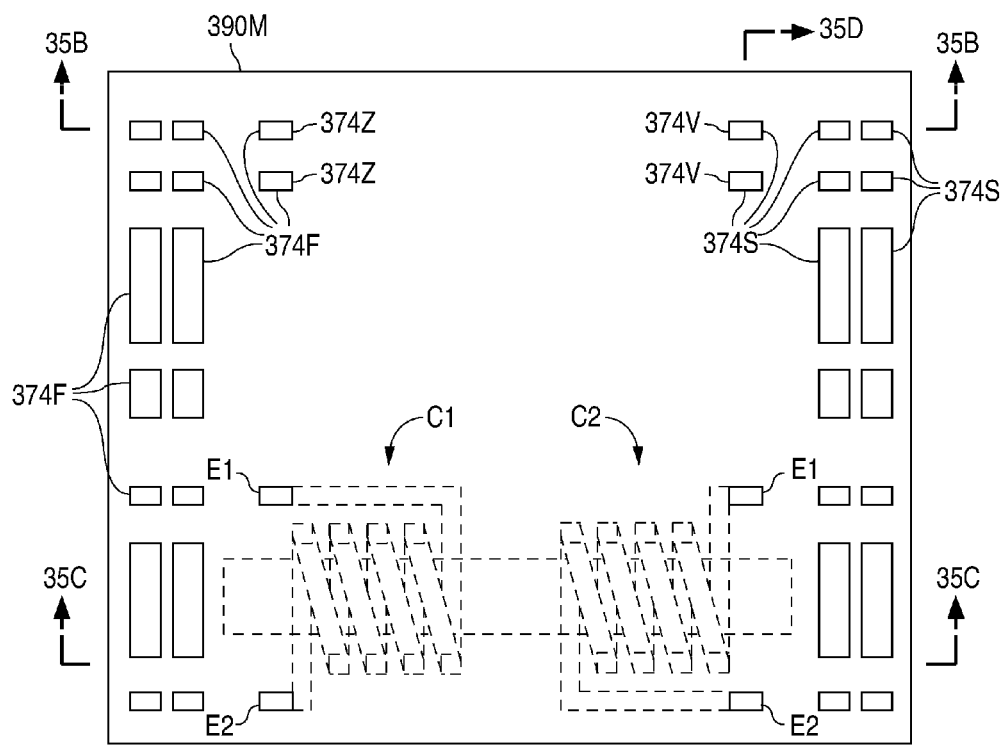
Figure 35B:
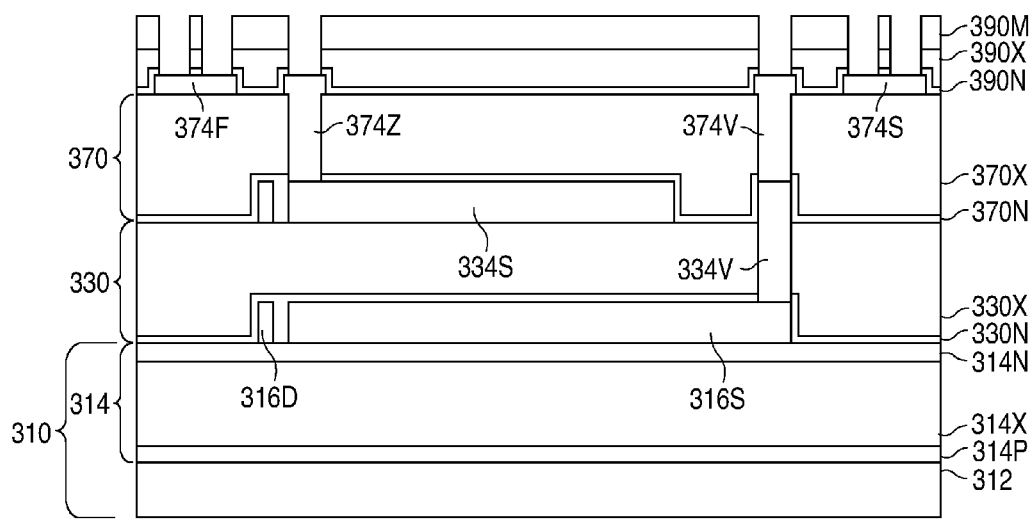
Figure 35C:
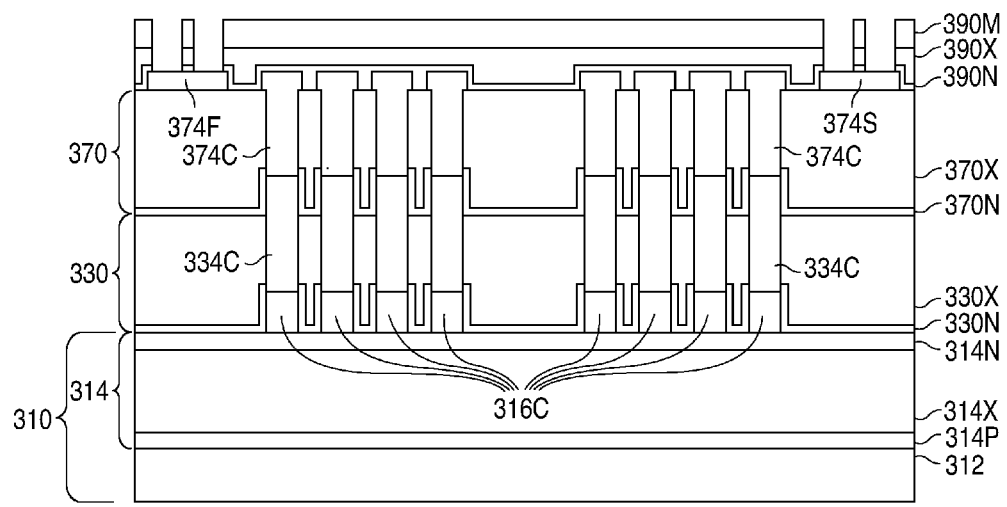
Figure 35D:
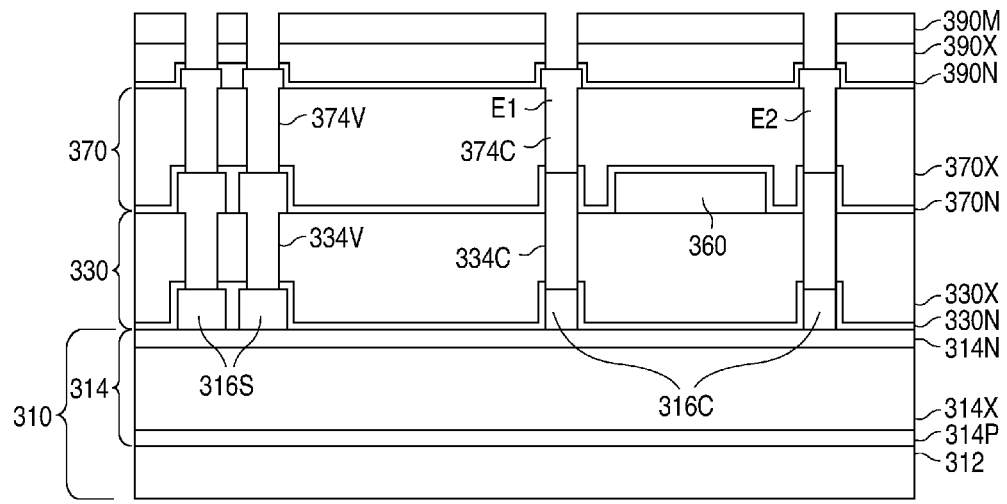
Figure 36A:
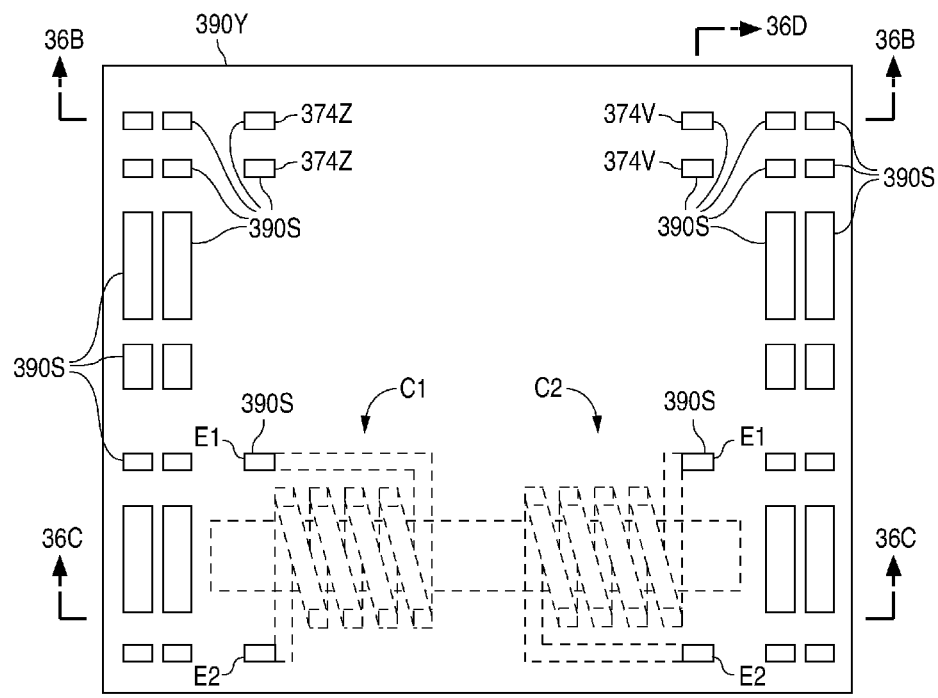
Figure 36B:
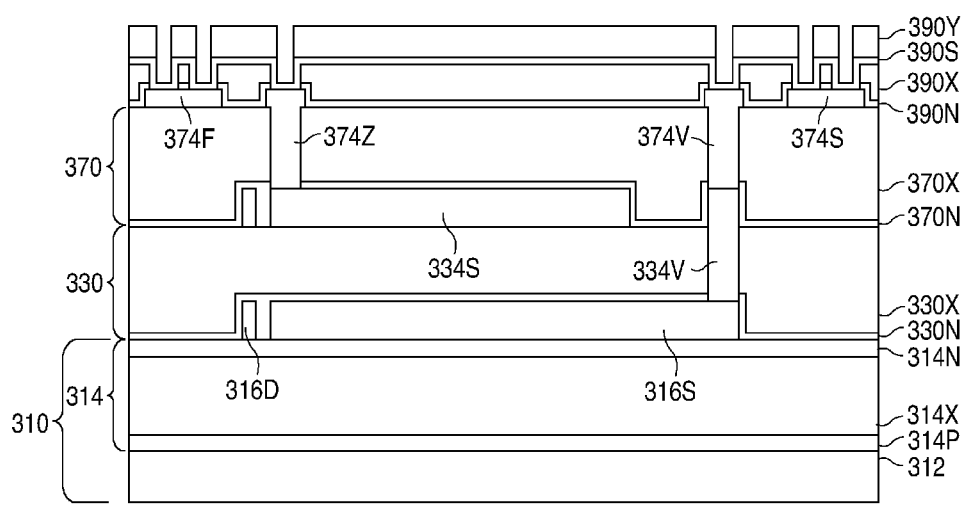
Figure 36C:
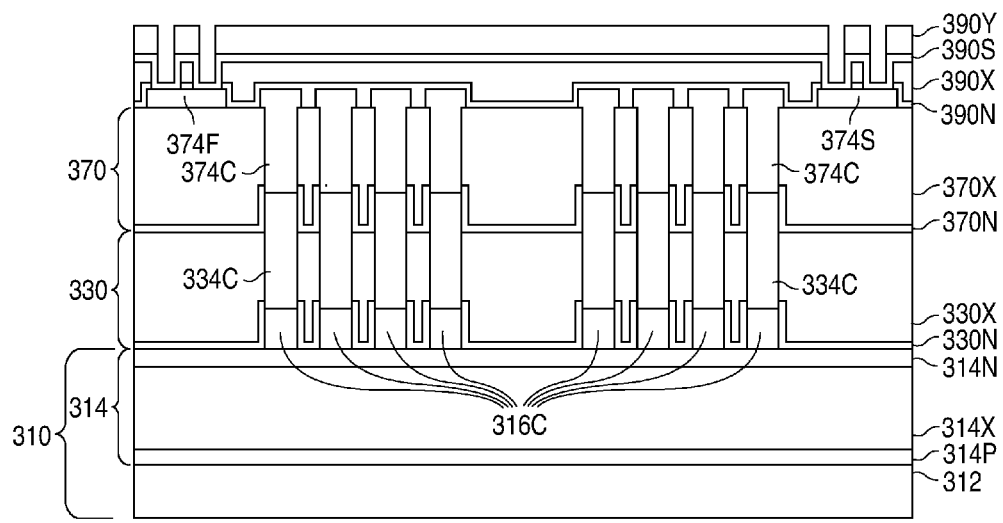
Figure 36D:
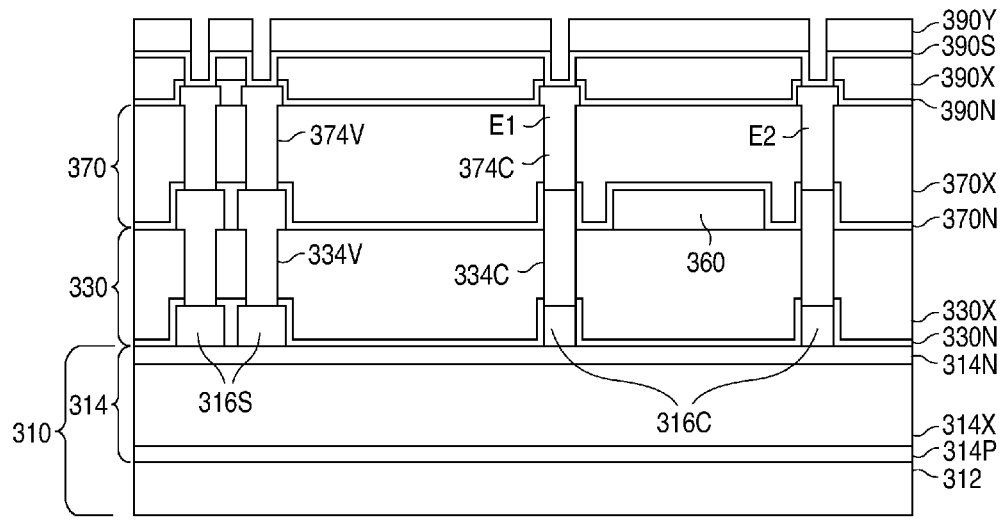
Figure 37A:
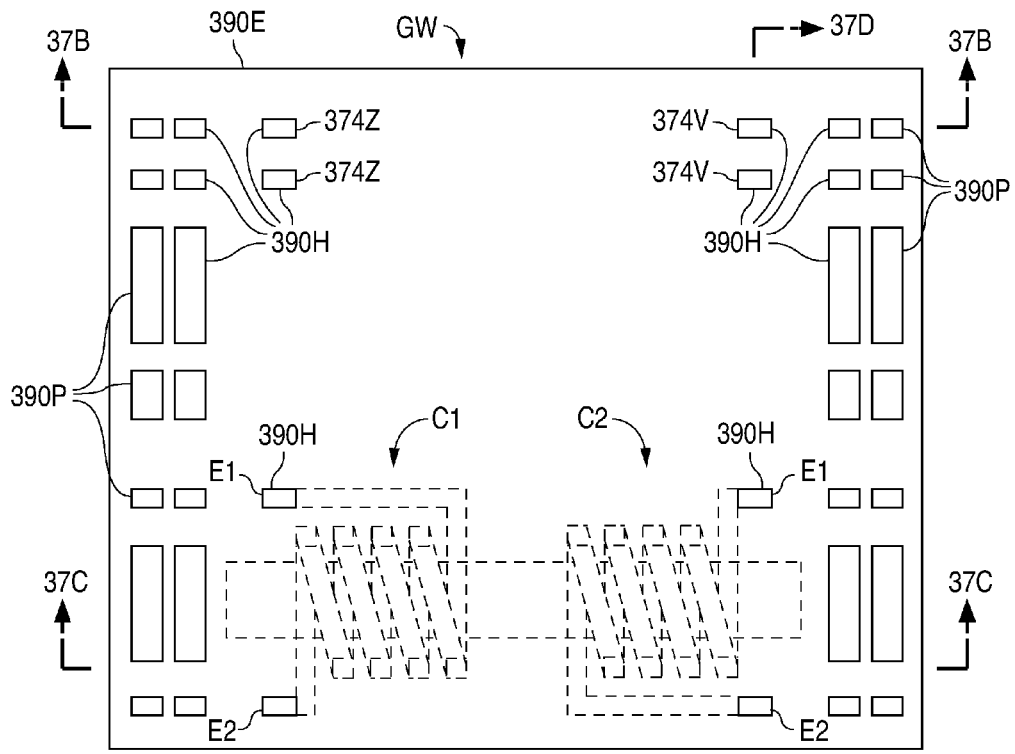
Figure 37B:
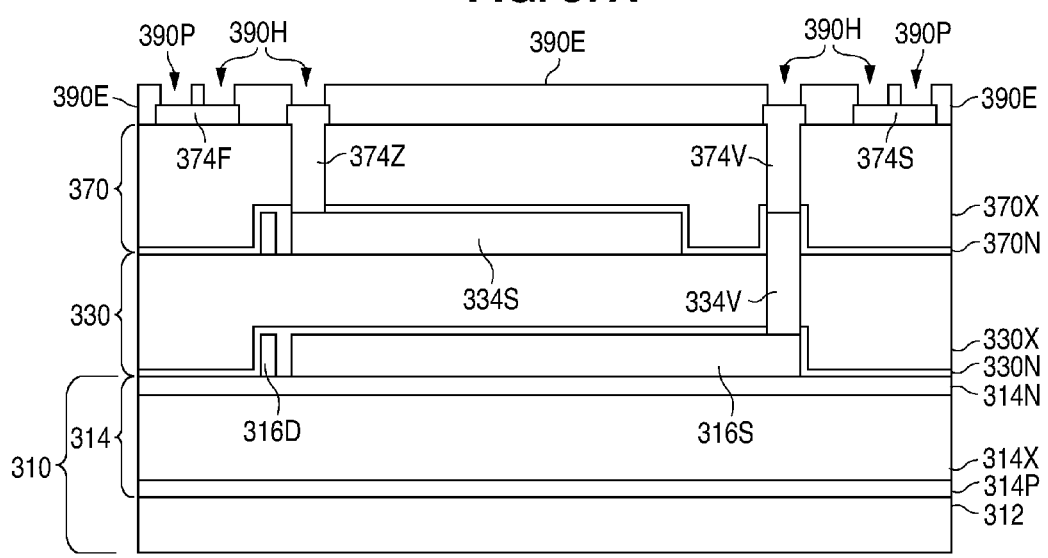
Figure 37C:
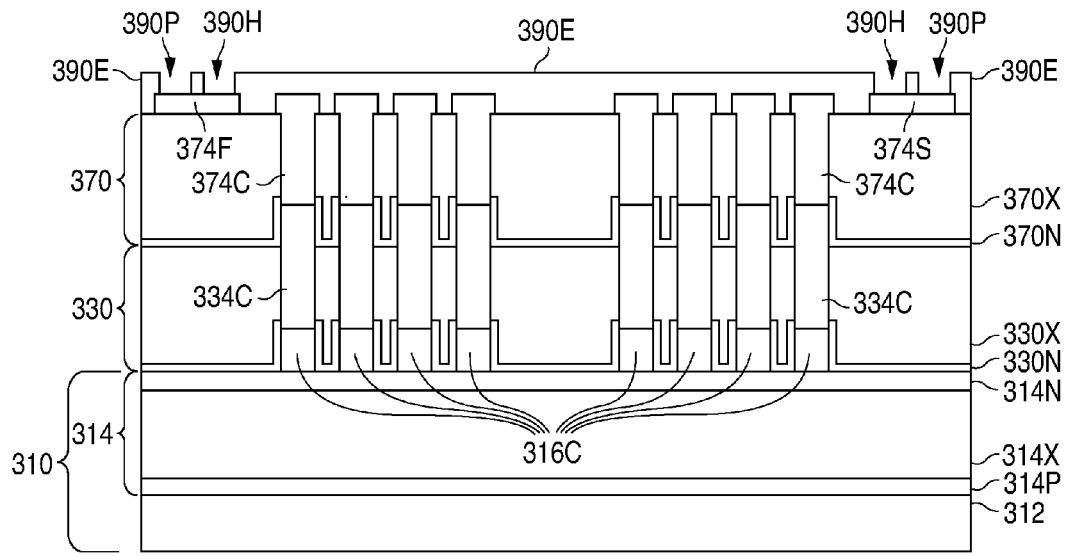
Figure 37D:
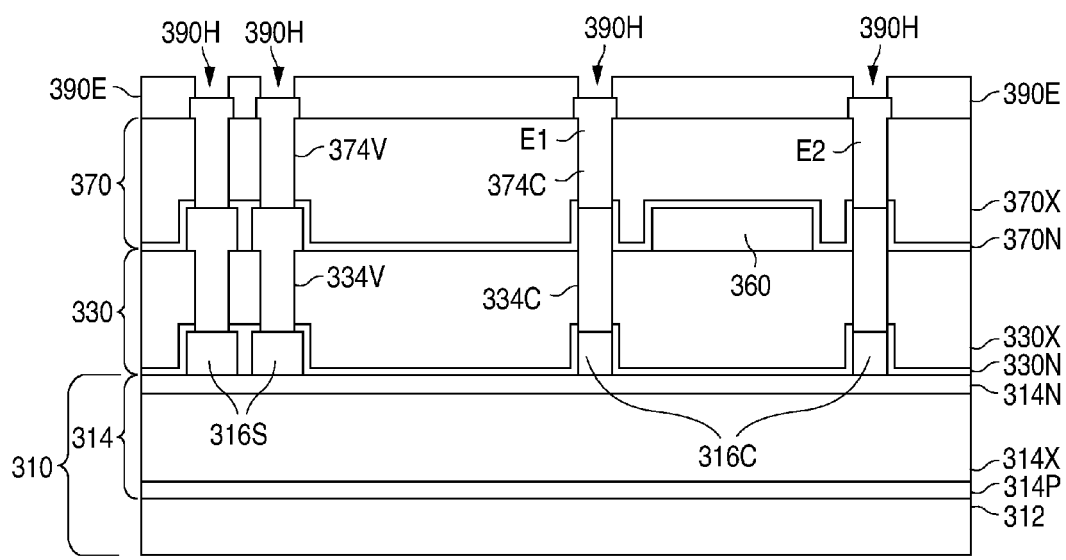
Figure 38A:
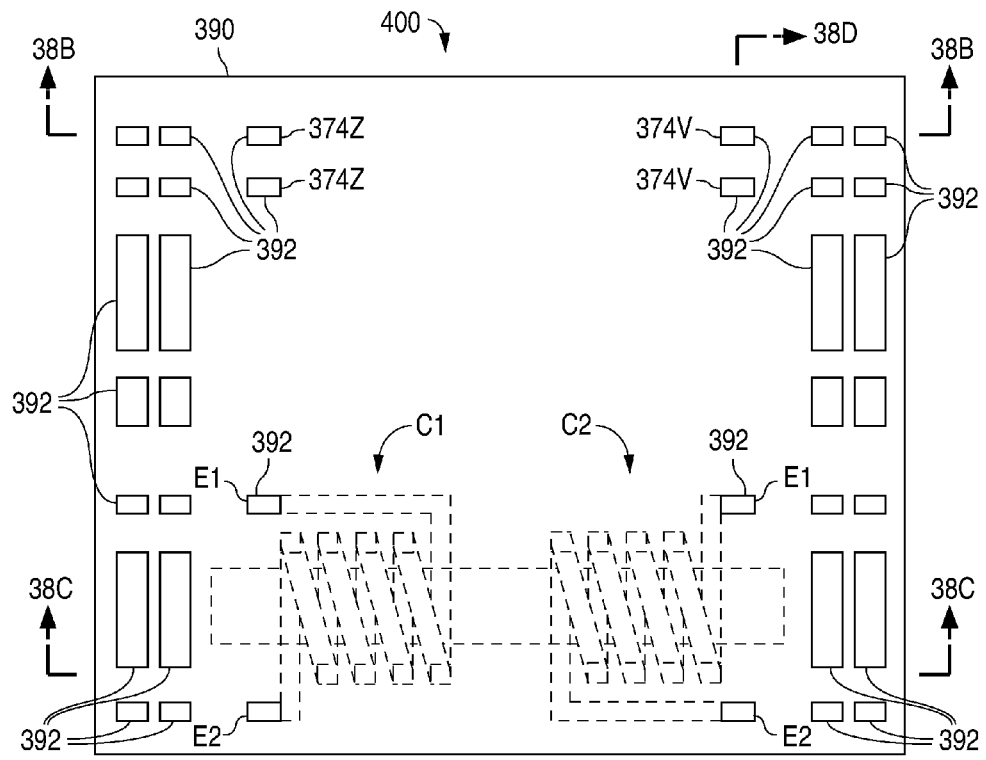
Figure 38B:
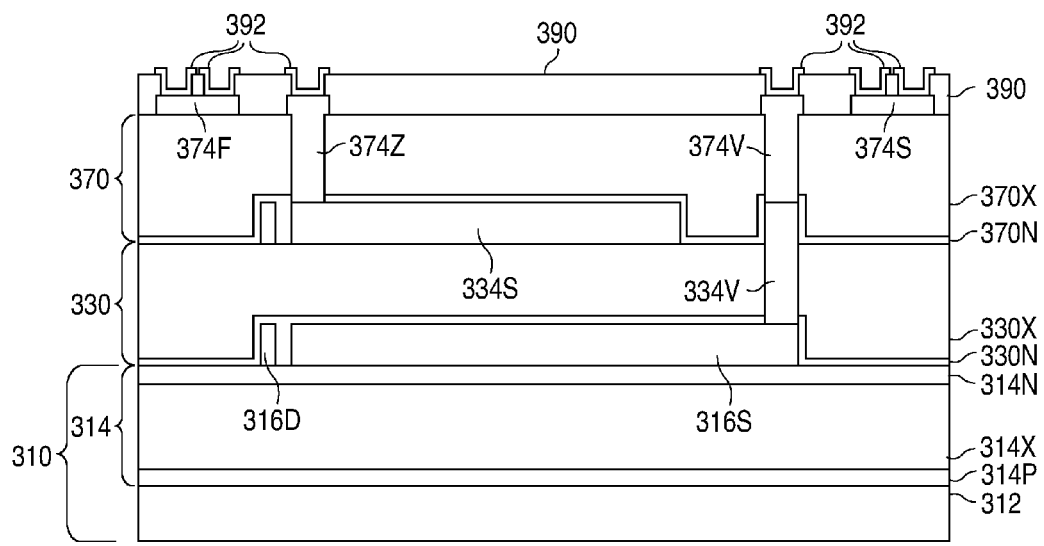
Figure 38C:
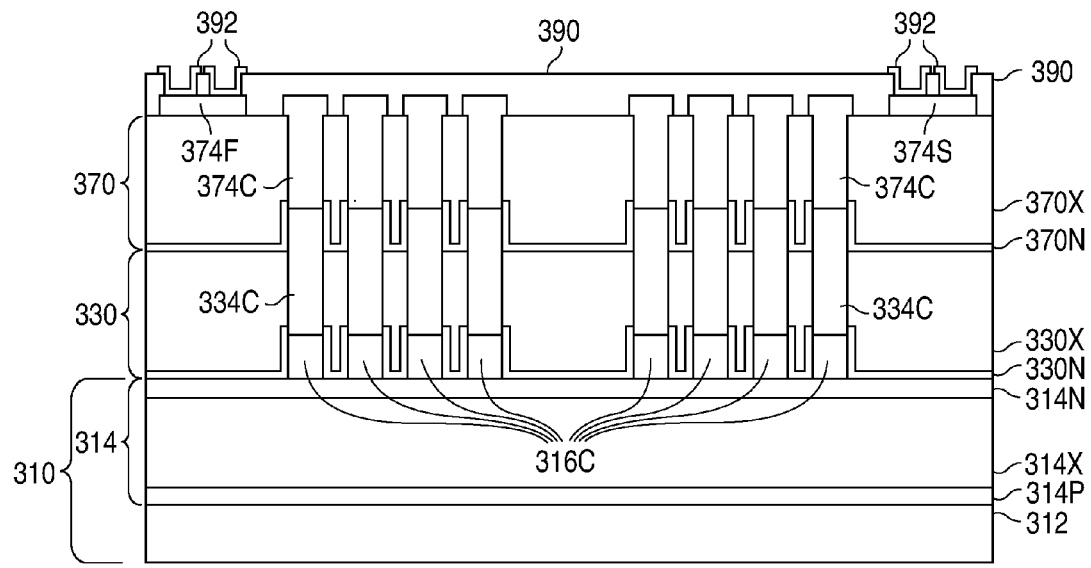
Figure 38D:
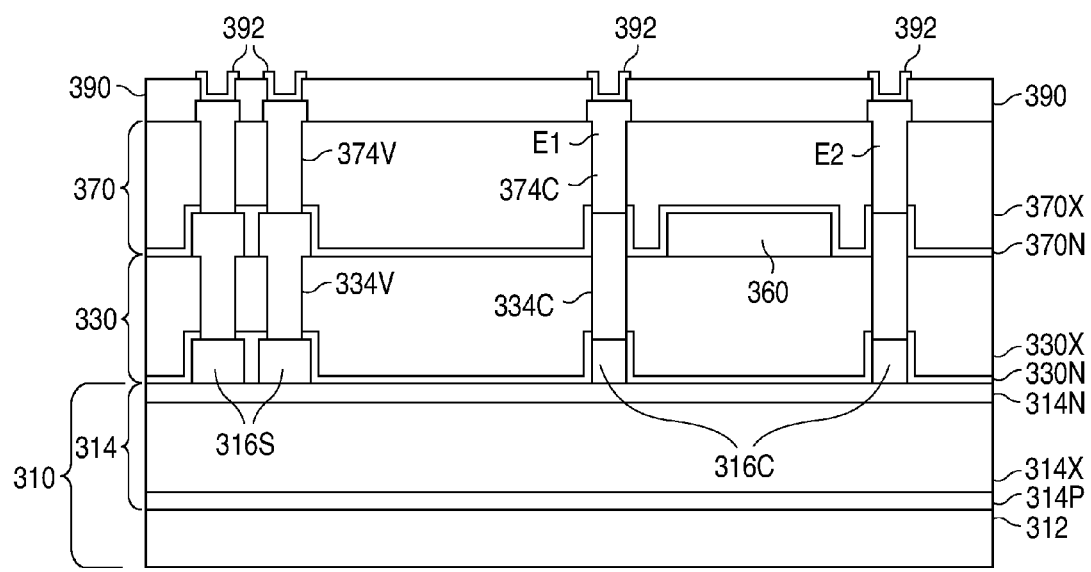
Figure 39A:
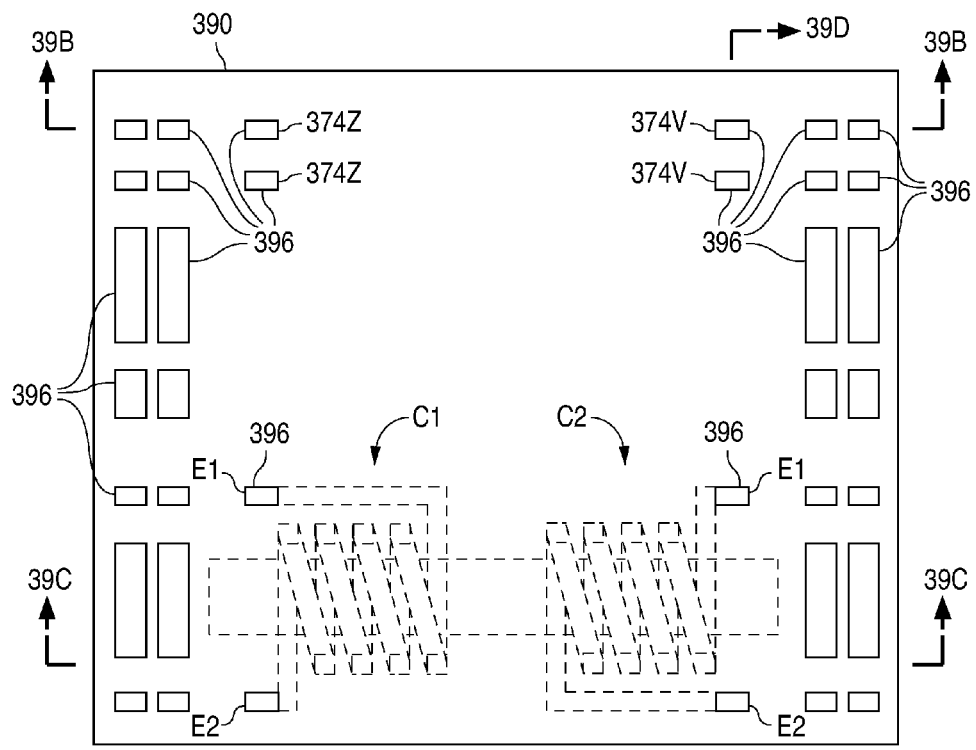
Figure 39B:
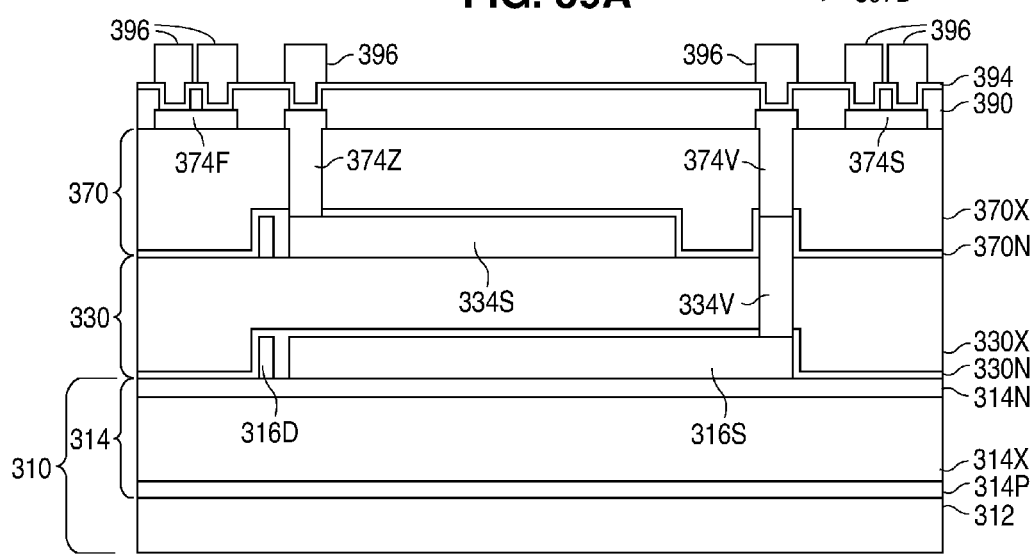
Figure 39C:
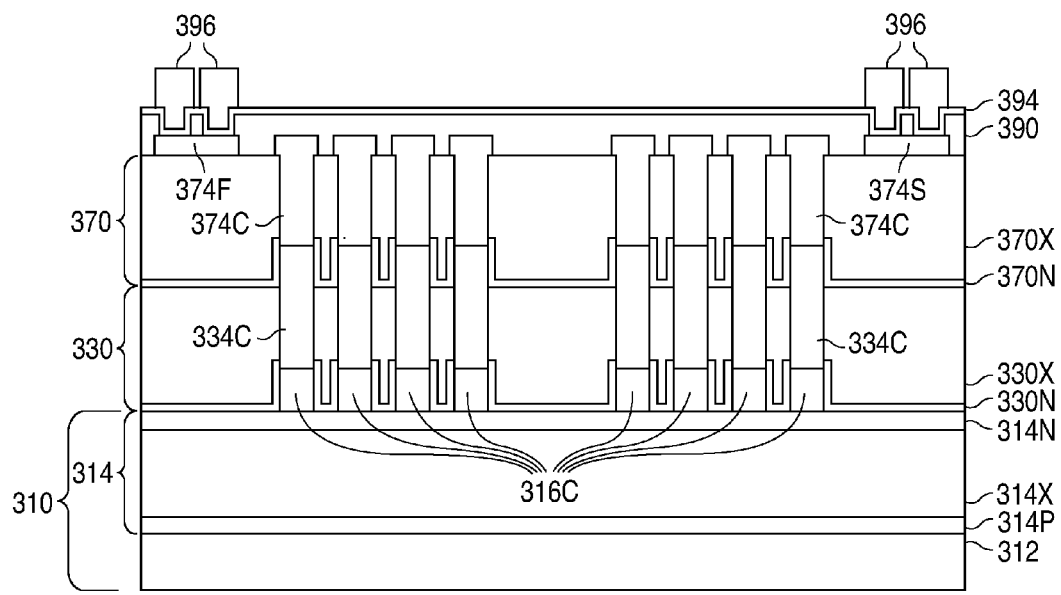
Figure 39D:
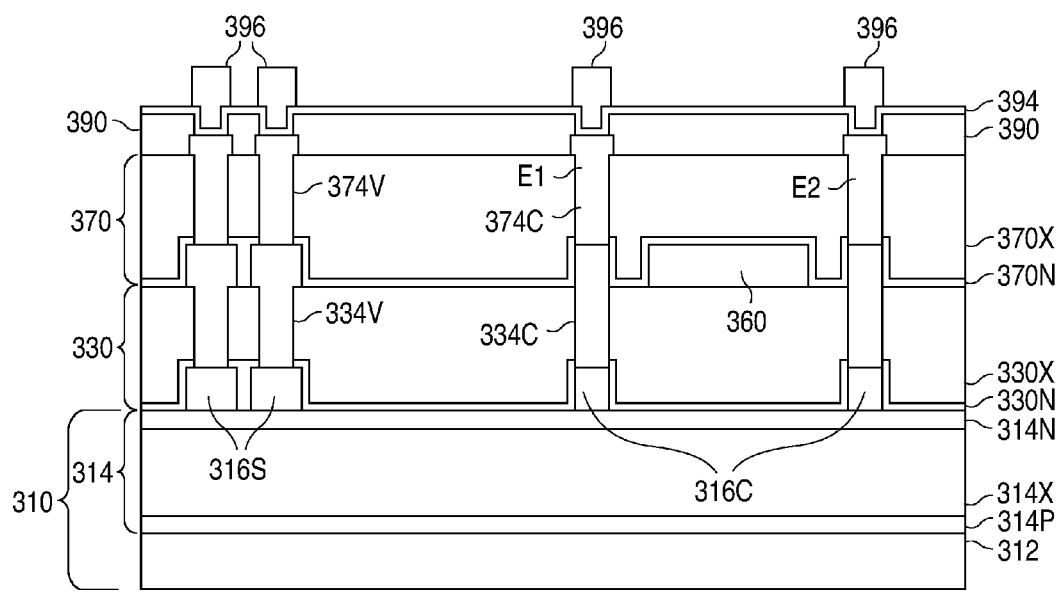
Figure 40A:
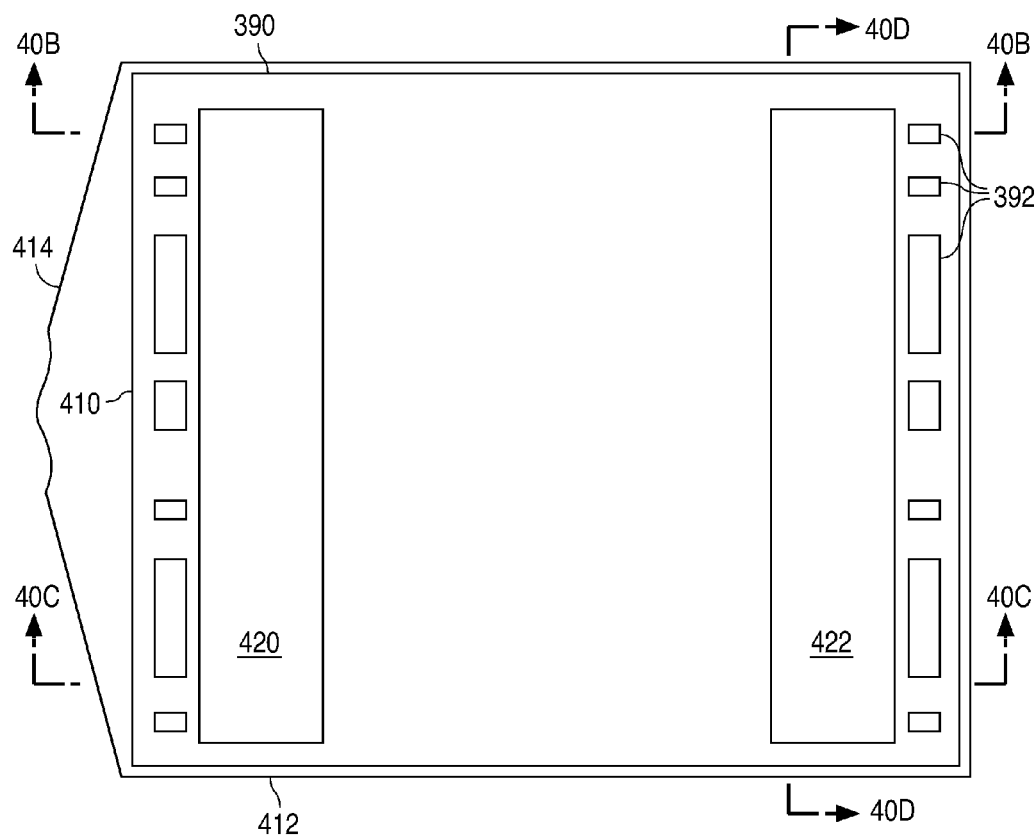
Figure 40B:
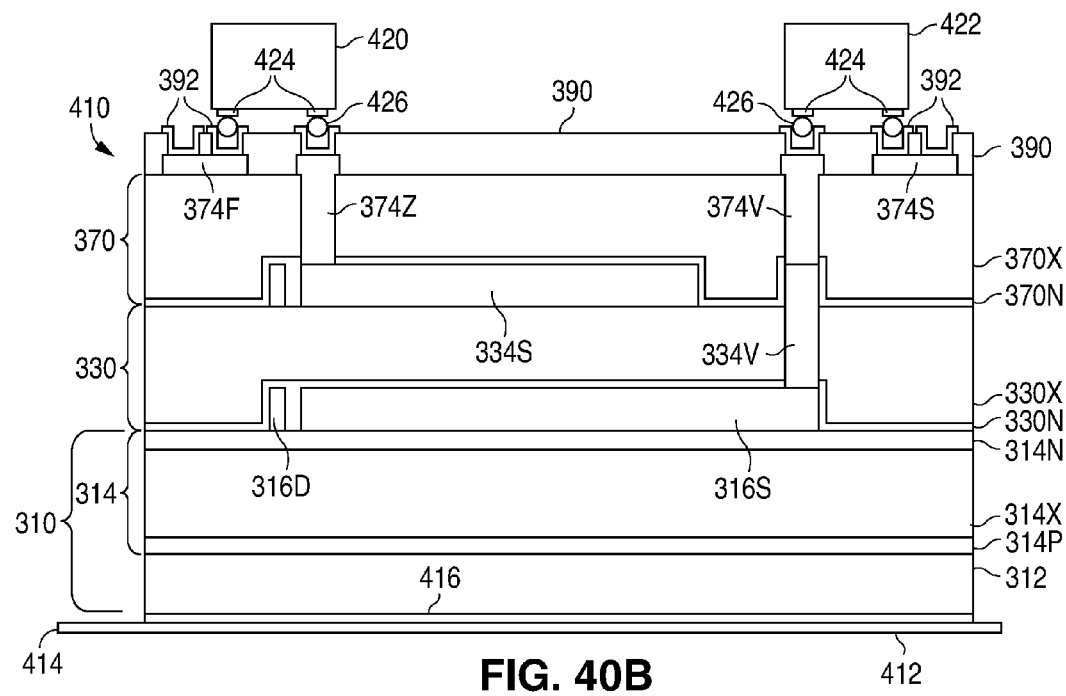
Figure 40C:
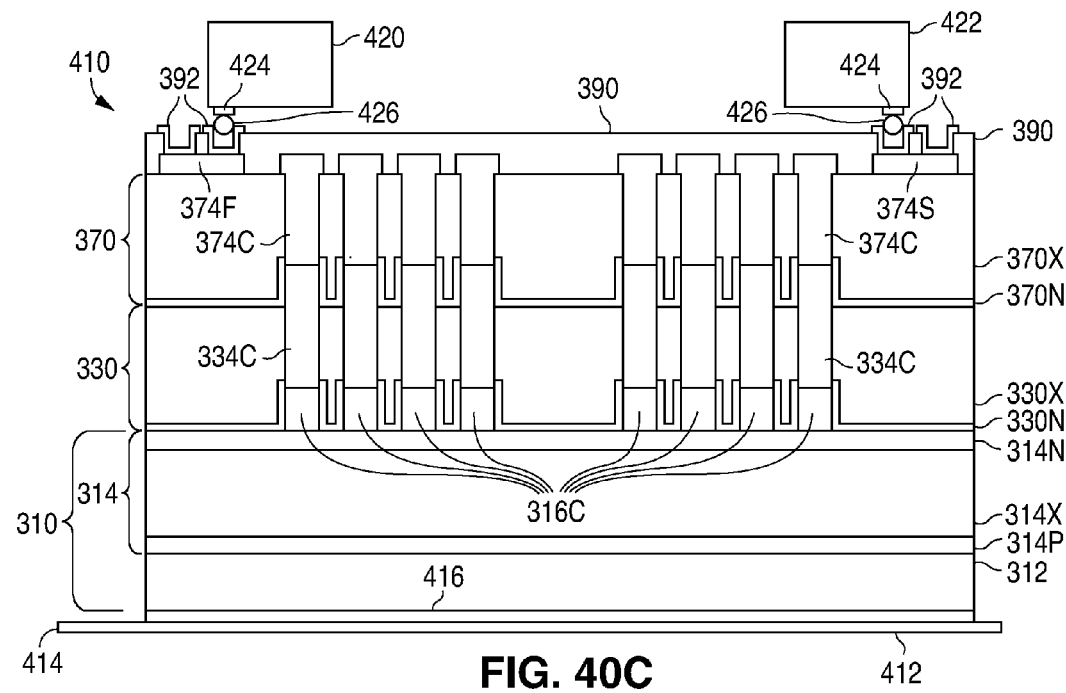
Figure 40D:
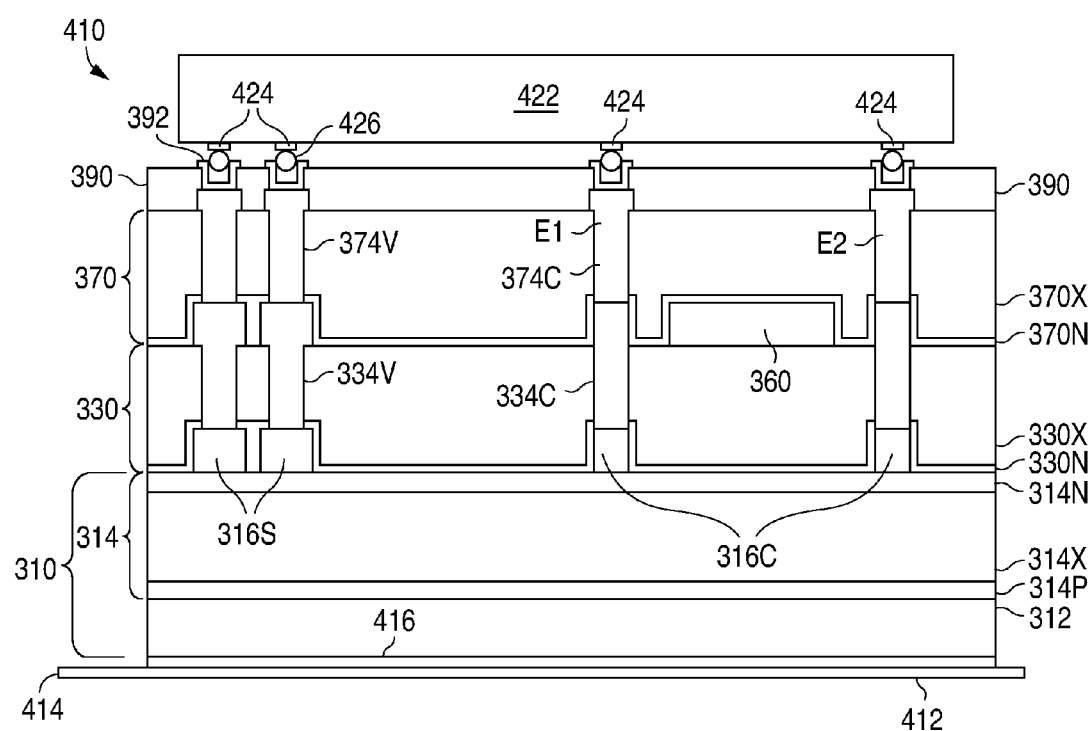
Figure 41A:
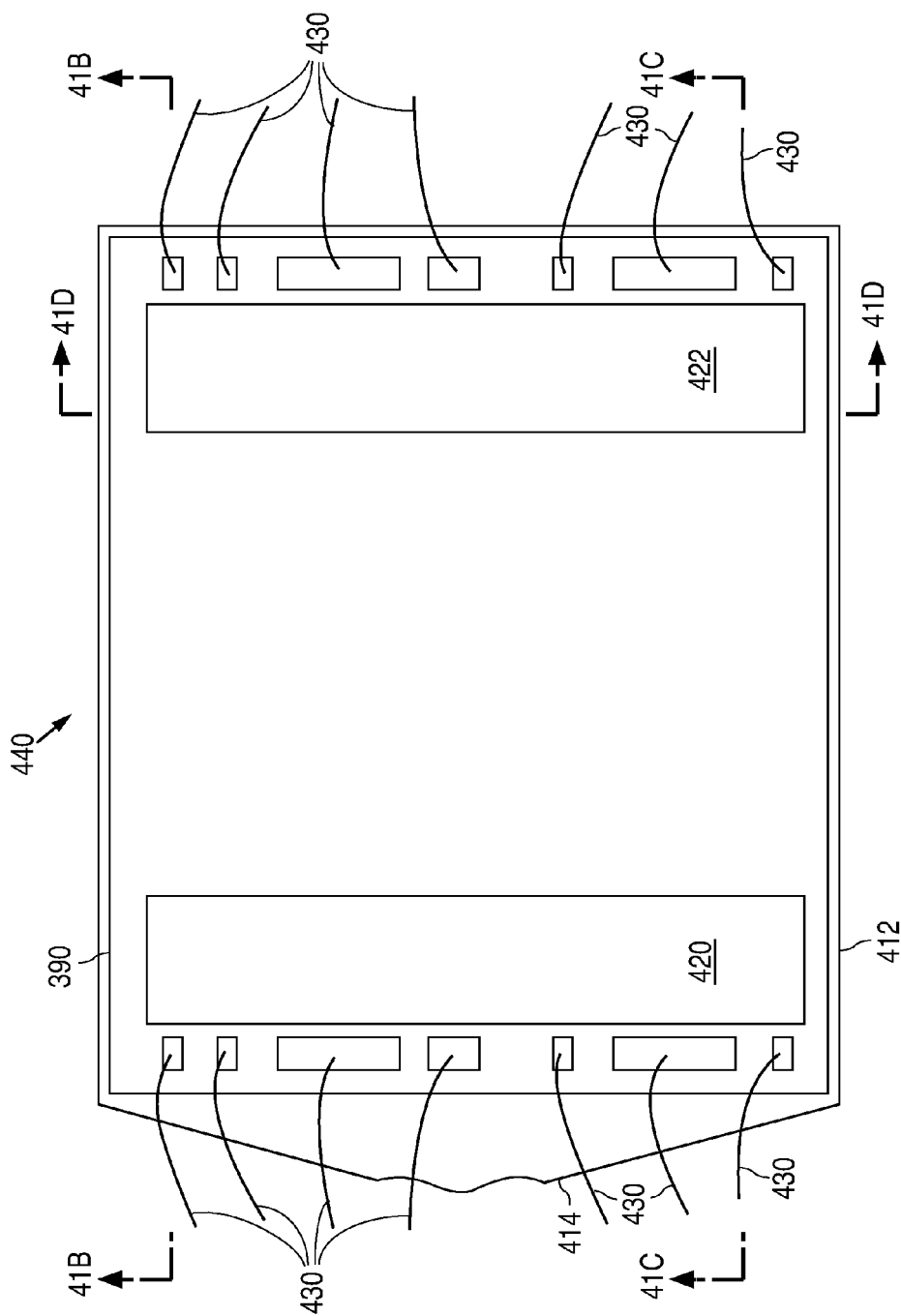
Figure 41B:
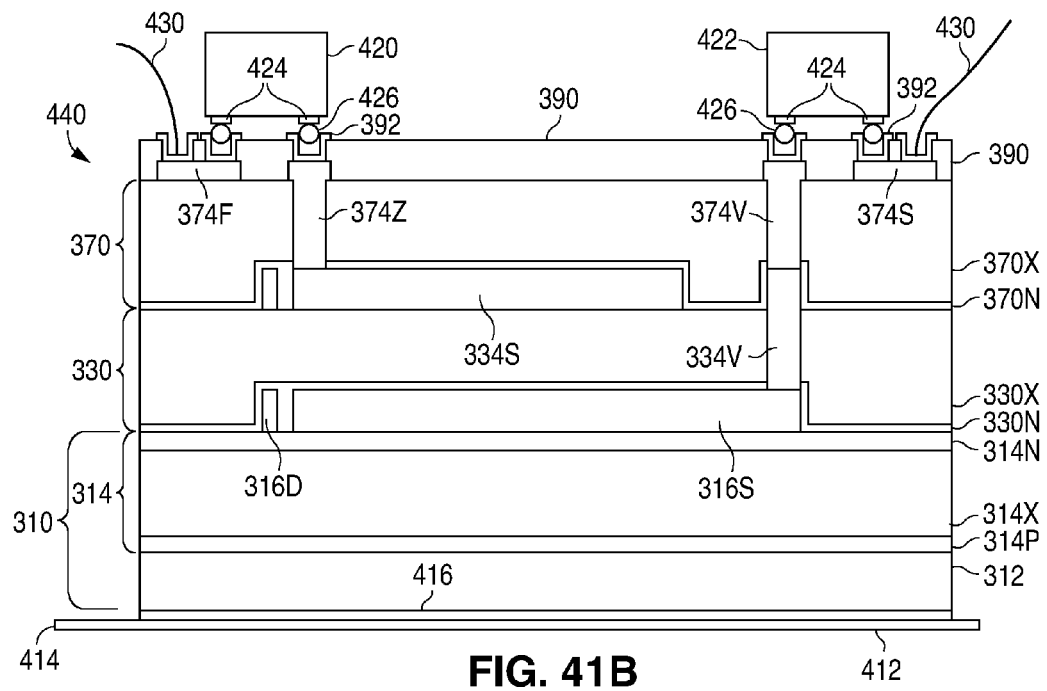
Figure 41C:
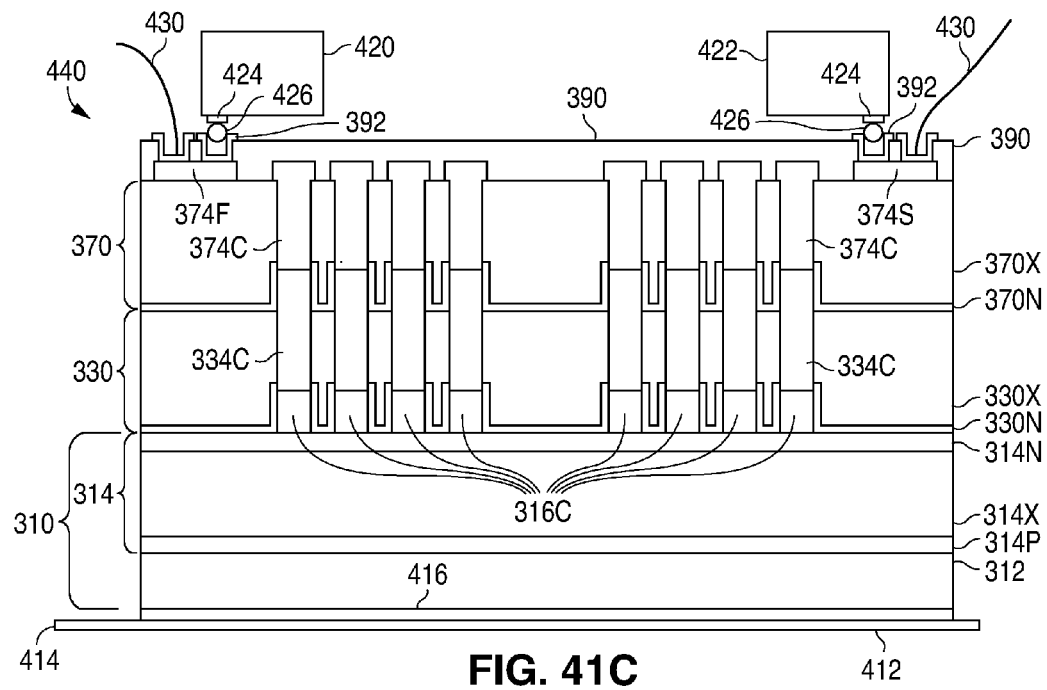
Figure 41D:
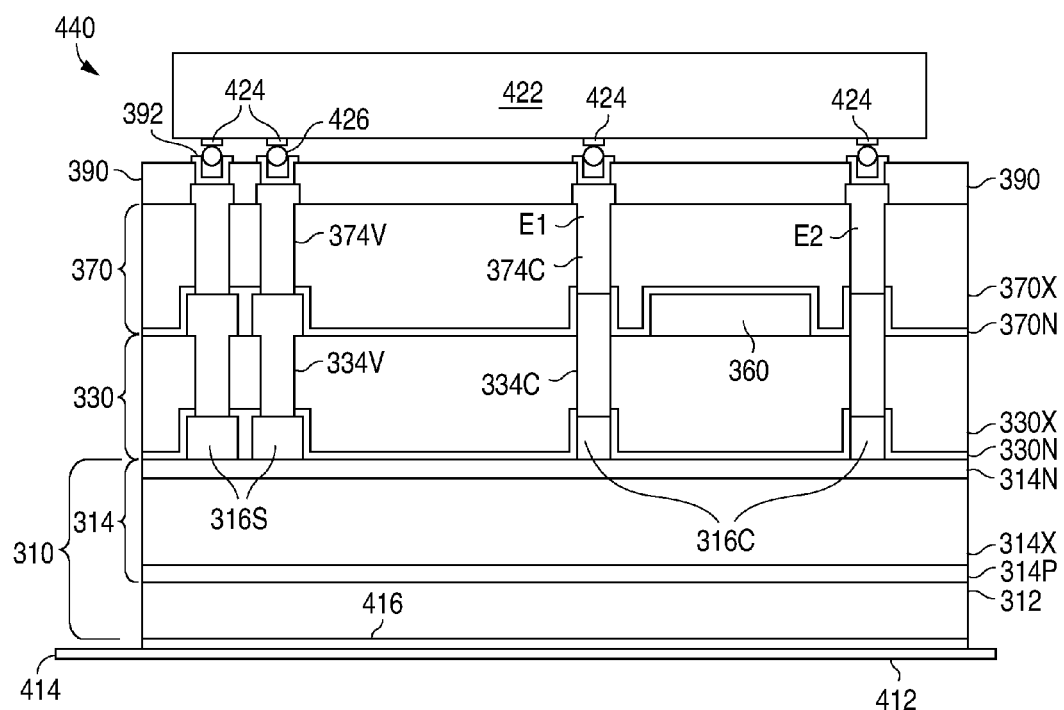

After this, as further shown in FIGS. 22A-22C, a layer of silicon dioxide 370X approximately 10-15 μm thick is conventionally formed with plasma enhanced chemical vapor deposition on the top surface of silicon nitride layer 370N. Alternately, silicon nitride layer 370N, which is used along with silicon nitride layer 360N to encapsulate magnetic core structure 360, can be optionally omitted when encapsulation is not required.

Following the formation of oxide layer 370X, oxide layer 370X is planarized in a conventional manner, such as with chemical-mechanical polishing, until oxide layer 370 has a substantially planar top surface 370F, which defines the substantially planar top surface 370T of dielectric structure 370.

As shown in FIGS. 23A-23D, after dielectric structure 370 has been formed, a hard mask 372 is formed on the substantially planar top surface 370T of dielectric structure 370. As shown in FIGS. 24A-24D, hard mask 372 can be formed by conventionally depositing a layer of masking material 372M, such as a layer of aluminum, or a layer of oxide with an overlying layer of nitride, followed by the conventional formation of a patterned photoresist layer 372H. Following this, the exposed regions of masking material 372M are etched to form the openings in hard mask 372. Patterned photoresist layer 372H is then removed in a conventional manner to complete the formation of hard mask 372. Alternately, depending on the thickness of the dielectric to be etched, a thick patterned photoresist layer can be used in lieu of hard mask 372.

After hard mask 372 has been formed, as shown in FIGS. 25A-25D, the exposed regions of dielectric structure 370 are etched away to form a number of lower via openings 370L that exposes the lower plate via structures 334V, a number of upper plate via openings 370U that exposes the upper plate structures 334S, and a number of side wall coil openings 370S that expose the lower side wall coil structures 334C. Hard mask 372 is then removed in a conventional manner.

As shown in FIGS. 26A-26D, after hard mask 372 has been removed, a number of metal upper structures 374 are formed on the non-conductive top surface 370T of dielectric structure 370, in the lower via openings 370L, in the upper plate via openings 370U, and in the side wall coil openings 370S. The metal upper structures 374 include a number of lower plate via structures 374V that make electrical connections to the lower plate via structures 334V, a number of upper plate via structures 374Z that make electrical connections to the upper plate structures 334S, a number of upper coil structures 374C that make electrical connections to the lower side wall coil structures 334C, a number of high-voltage die metal regions 374F, and a number of low-voltage die metal regions 374S. The metal upper structures 374 can be formed in a number of different ways.

In a first embodiment, as shown in FIGS. 27A-27D, the metal upper structures 374 are formed by first depositing a copper diffusion barrier layer 376 on dielectric structure 370 to line the lower via openings 370L, the upper plate via openings 370U, and the side wall coils openings 370S. Barrier layer 376 can be implemented with, for example, nitride, titanium nitride, titanium, or tantalum.

If barrier layer 376 is non-conductive, then a patterned photoresist layer is formed on barrier layer 376, followed by an etch to remove a portion of barrier layer 376. The portion removed by the etch exposes the top surfaces of the lower plate via structures 334V, the upper plate structures 334S, and the lower side wall coil structures 334C.

After barrier layer 376, which is illustrated as a conductive barrier layer, has been formed, a seed layer 378 is conventionally formed on barrier layer 376 (and the top surfaces of the lower plate via structures 334V, the upper plate structures 334S, and the lower side wall coil structures 334C when a non-conductive barrier layer is used).

For example, seed layer 378 can be implemented with a layer of aluminum copper. Seed layer 378 can alternately be formed by depositing 300 Å of titanium, 3000 Å of copper, and 300 Å of titanium. After seed layer 378 has been formed, a plating mold 380 is formed on the top surface of seed layer 378.

As shown in FIGS. 28A-28D, following the formation of plating mold 380, copper is electroplated in a conventional manner to a depth of approximately 5 μm to form the lower plate via structures 374V, the upper plate via structures 374Z, the upper coil structures 374C, the high-voltage die metal regions 374F, and the low-voltage die metal regions 374S.

After this, as shown in FIGS. 29A-29D, plating mold 380 and the exposed regions of seed layer 378 and barrier layer 376 are removed in a conventional manner. The electrical connection of the upper coil structures 374C with the lower side wall coil structures 334C which, in turn, are connected to the lower coil structures 316C forms a transformer with a high-voltage coil C1 and a low-voltage coil C2 that are wrapped around magnetic core structure 360.

In a second embodiment, as shown in FIGS. 30A-30D, the metal upper structures 374 are formed by first depositing a liner layer 382 on dielectric structure 370 to line the lower via openings 370L, the upper plate via openings 370U, and the side wall coil openings 370S. Liner layer 382 can be implemented with, for example, titanium/titanium nitride. After liner layer 382 has been formed, a metal layer 384, such as tungsten, is conventionally deposited on liner layer 382 to fill up the lower via openings 370L, the upper plate via openings 370U, and the side wall coil openings 370S.

Following this, as shown in FIGS. 31A-31D, metal layer 384 is planarized, such as with chemical-mechanical polishing, to expose the top surface of dielectric structure 370, and form via plug structures 384P in the lower via openings 370L to make electrical connections to the lower plate via structures 334V, the upper plate via openings 370U to make electrical connections to the upper plate structures 334S, and in the side wall coil openings 370S to make electrical connections to the lower side wall coil structures 334C.

As shown in FIGS. 32A-32D, after the via plug structures 384P have been formed, a metal layer 386, such as aluminum, is sputter deposited onto the non-conductive top surface 370T of dielectric structure 370 to a depth of approximately 5 μm. Alternately, metal layer 386 can include multiple layers of metal such as, for example, a layer of titanium, a layer of titanium nitride, a layer of aluminum copper, a layer of titanium, and a layer of titanium nitride.

Once metal layer 386 has been formed, a patterned photoresist layer 388 approximately 1.0 μm thick is formed on the top surface of metal layer 386 in a conventional manner. Following the formation of patterned photoresist layer 388, metal layer 386 is etched to remove the exposed regions of metal layer 386 and form the lower plate via structures 374V in the lower via openings 370L that make electrical connections to the lower plate via structures 334V. The etch also forms the upper plate via structures 374Z in the upper plate via openings 370U to make electrical connection to the upper plate structures 334S, the upper coil structures 374C to make electrical connections to the lower side wall coil structures 334C, the high-voltage metal die regions 374F, and the low-voltage metal die regions 374S.

Metal layer 386 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 388 is then removed in a conventional manner, such as with acetone. Once patterned photoresist layer 388 has been removed, the resulting structure is conventionally cleaned to remove organics, such as with a Piranha etch.

As shown in FIGS. 33A-33D, after the lower plate via structures 374V, the upper plate via structures 374Z, the upper coil structures 374C, the high-voltage die metal regions 374F, and the low-voltage die metal regions 374S have been formed, a passivation layer 390 is formed on the top surface 370T of dielectric structure 370 and the metal upper structures 374. As further shown in FIGS. 33A-33D, passivation layer 390 is formed to have a number of flip chip openings 390H and a number of pad openings 390P.

The flip chip openings 390H expose the upper plate via structures 374Z and two ends E1 and E2 of coil C1 (part of the upper coil structures 374C), along with portions of the high-voltage die metal regions 374F. The flip chip openings 390H also expose the lower plate via structures 374V and two ends E1 and E2 of coil C2 (part of the upper coil structures 374C), along with portions of the low-voltage die metal regions 374S. The pad openings 390P expose portions of the high-voltage die metal regions 374F and portions of the low-voltage die metal regions 374S.

Passivation layer 390 can be formed in a number of different ways. As shown in FIGS. 34A-34D, in a first embodiment, passivation layer 390 can be formed by depositing a layer of silicon nitride 390N approximately 0.6 μm thick on the top surface 370T of dielectric structure 370. Following this, a layer of silicon dioxide 390X approximately 10-20 μm thick is deposited on nitride layer 390N. Oxide layer 390X and silicon nitride layer 390N can be deposited in a conventional manner, and oxide layer 390X can optionally be omitted in cases where lateral isolation will be provided by a molding compound. Once oxide layer 390X has been formed, a patterned photoresist layer 390M approximately 1.0 μm thick is formed on the top surface of oxide layer 390X in a conventional manner.

As shown in FIGS. 35A-35D, following the formation of patterned photoresist layer 390M, the exposed regions of oxide layer 390X and nitride layer 390N are etched to expose the upper plate via structures 374Z, the two ends E1 and E2 of coil C1 (part of the upper coil structures 374C), portions of the high-voltage die metal regions 374F, the lower plate via structures 374V, the two ends E1 and E2 of coil C2 (part of the upper coil structures 374C), and portions of the low-voltage die metal regions 374S. Patterned photoresist layer 390M is then removed in a conventional manner.

Next, as shown in FIGS. 36A-36D, a layer of silicon nitride 390S approximately 0.6 μm thick is deposited on the top surface of oxide layer 390X and the exposed regions of the upper plate via structures 374Z, the two ends E1 and E2 of coil C1, portions of the high-voltage die metal regions 374F, the lower plate via structures 374V, the two ends E1 and E2 of coil C2, and portions of the low-voltage die metal regions 374S.

Following this, a patterned photoresist layer 390Y approximately 1.0 µm thick is formed on the top surface of nitride layer 390S in a conventional manner. The openings in patterned photoresist layer 390Y are made slightly smaller that the openings in patterned photoresist layer 390M to ensure that oxide layer 390X is completely sealed against moisture absorption.

After patterned photoresist layer 390Y has been formed, the exposed regions of nitride layer 390S are etched to form passivation layer 390 with the flip chip openings 390H and the pad openings 390P. Patterned photoresist layer 390Y is then removed in a conventional manner.

Alternately, in a second embodiment, as shown in FIGS. 37A-37D, passivation layer 390 can be formed by depositing an epoxy layer 390E, such as SU-8, on dielectric structure 370 and the metal upper structures 374. Epoxy layer 390E is then exposed with a pattern and cured to form passivation layer 390 with the flip chip openings 390H and the pad openings 390P.

As shown in FIGS. 38A-38D, after passivation layer 390 has been formed, metal pads 392, such as aluminum pads, are next formed in the flip chip openings 390H and the pad openings 390P to complete the formation of a galvanic wafer 400. The metal pads 392 make electrical connections with the upper plate via structures 374Z, the two ends E1 and E2 of coil C1 (part of the metal upper structures 374), the exposed portions of the high-voltage die metal regions 374F, the lower plate via structures 374V, the two ends E1 and E2 of coil C2 (part of the metal upper structures 374), and the exposed portions of the low-voltage die metal regions 374S.

The metal pads 392 can be formed, as shown in FIGS. 39A-39D, by sputter depositing a metal layer 394, such as aluminum, approximately 1000 Å thick, followed by the deposition of a patterned photoresist layer 396. Once patterned photoresist layer 396 has been formed, the exposed regions of metal layer 394 are etched to form the metal pads 392. Patterned photoresist layer 396 is then removed in a conventional manner.

After galvanic wafer 400 has been formed (following the formation of the metal pads 392), the back side of galvanic wafer 400 can be ground down as necessary so that the completed assembly can fit into a package. Following this, galvanic wafer 400 is diced to form a large number of galvanic die.

As shown in FIGS. 40A-40D, after galvanic wafer 400 has been diced, a galvanic die 410 is physically connected to a DAP 412 of a lead frame 414 that only has a single DAP using a conventional pick-and-place machine. Galvanic die 410 can be physically connected to DAP 412 using an adhesive 416 such as, for example, a conductive or non-conductive epoxy or die attach film.

After galvanic die 410 has been connected to DAP 412, a high-voltage die 420 and a low-voltage die 422, which each have a number of bond pads 424 that provide points of external electrical connections for die 420 and die 422, are connected to the metal pads 392 as flip chips using a conventional pick-and-place machine. High-voltage die 420 and low-voltage die 422 are physically and electrically connected to the metal pads 392 by way of solder balls 426 in a conventional manner.

As shown in FIGS. 41A-41D, after the bond pads 424 on high-voltage die 420 and the bond pads 424 on low-voltage die 422 have been connected to the metal pads 392, the high-voltage die metal regions 374F, which are connected to high-voltage die 420, and the low-voltage die metal regions 374S, which are connected to low-voltage die 422, are conventionally electrically connected to pad contacts on lead frame 414 by bonding wires 430. The resulting structure is then encapsulated in a conventional manner to form a galvanically-isolated multi-die chip 440.

The sequence of attaching galvanic die 410 to DAP 412, and high-voltage die 420 and low-voltage die 422 to galvanic die 410 is arbitrary. Thus, high-voltage die 420 can be connected to galvanic die 410, and low-voltage die 420 can be connected to galvanic die 410 before galvanic die 410 is connected to DAP 412.

Figure 42A:
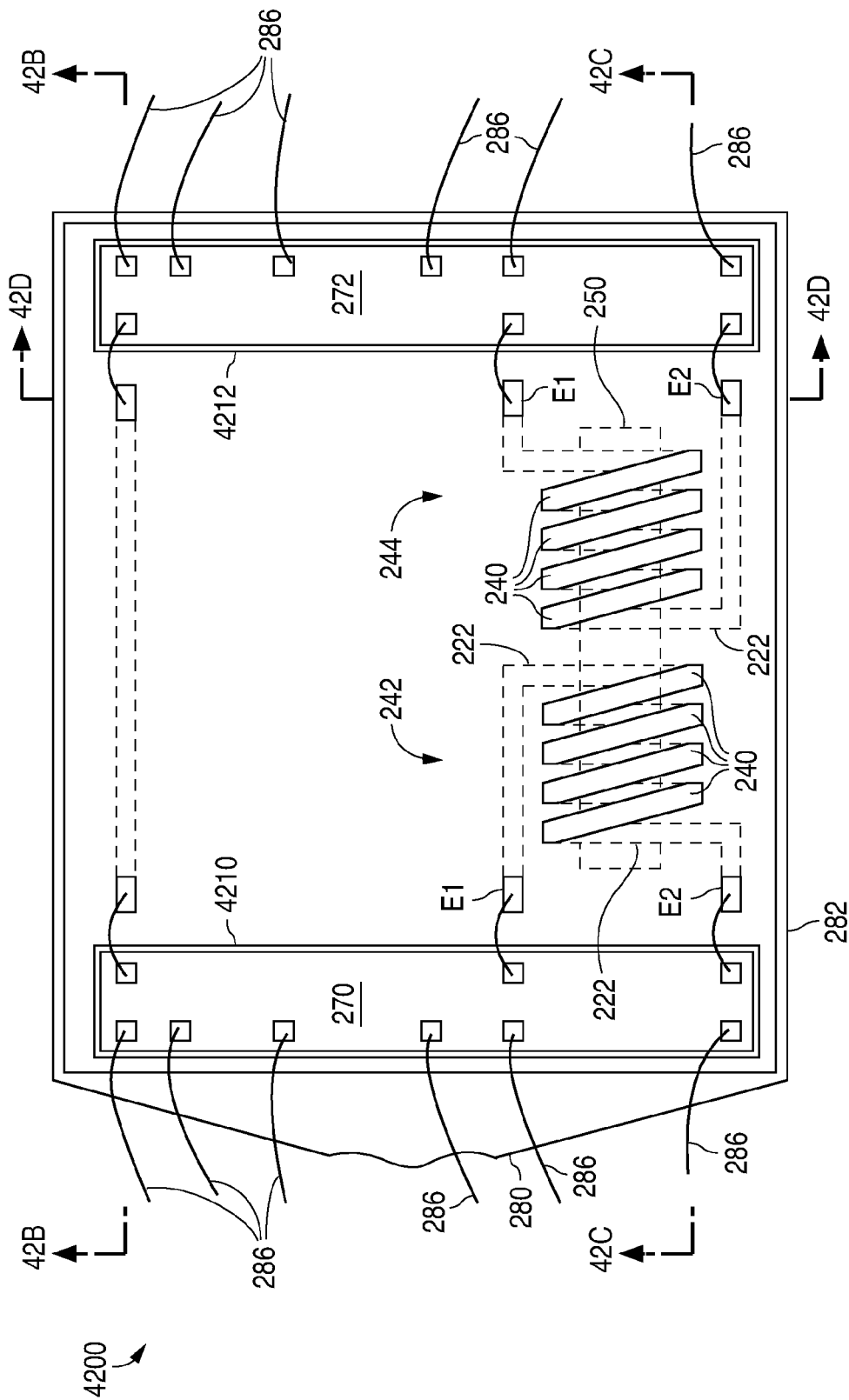
FIGS. 42A-42D are views illustrating an example of a galvanically-isolated, multi-die chip 4200 in accordance with an alternate embodiment of the present invention.
Figure 42B:
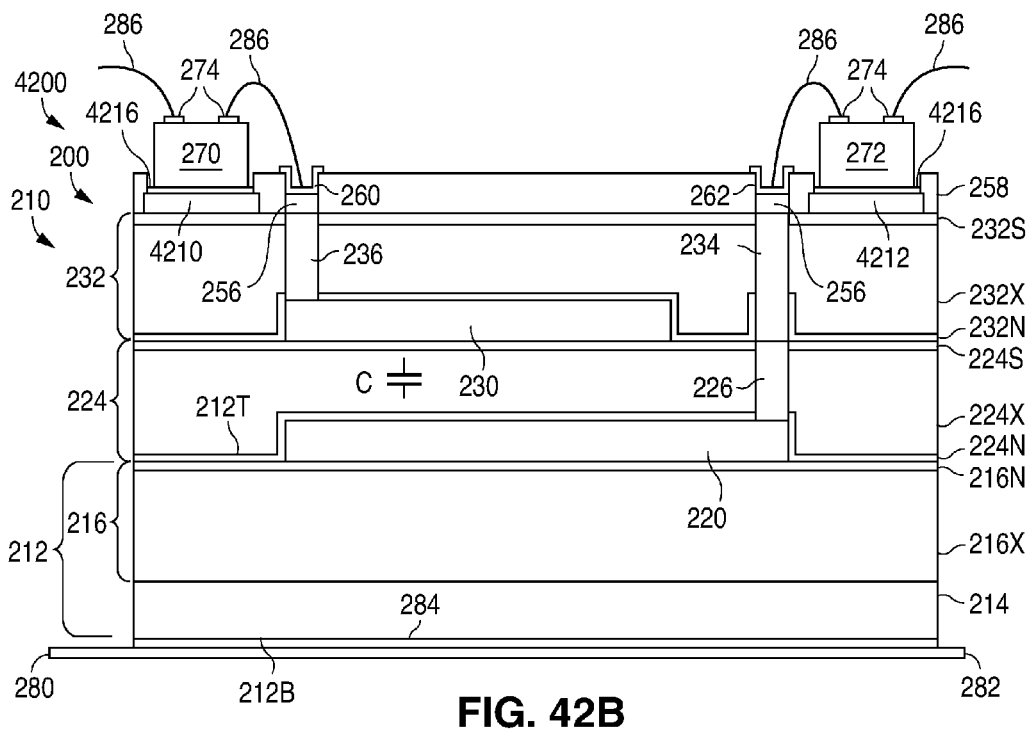
Figure 42C:
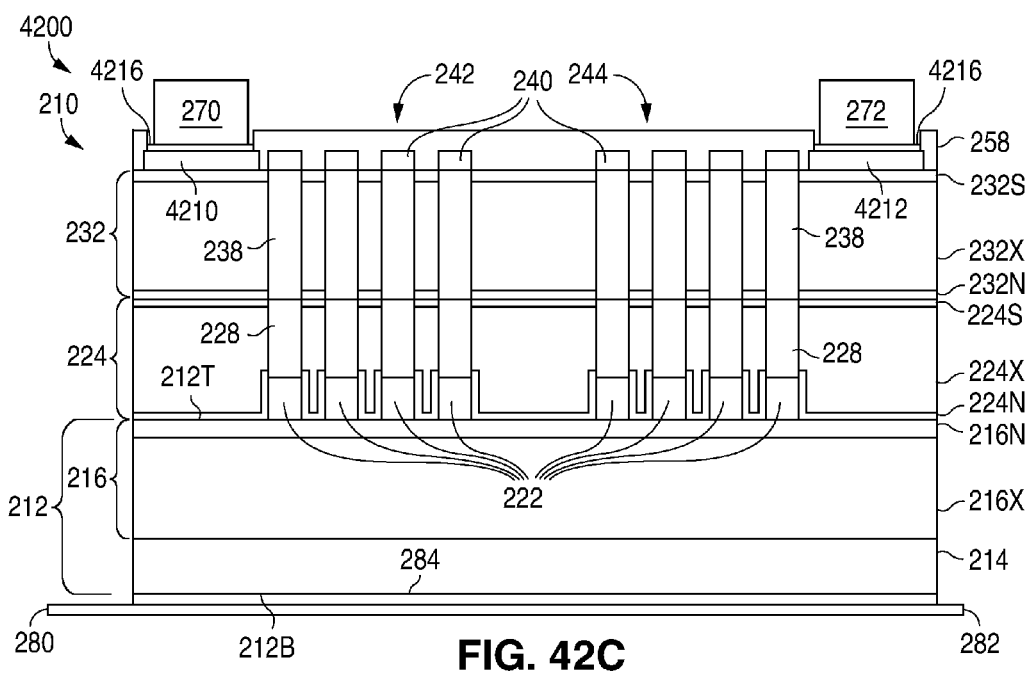
Figure 42D:
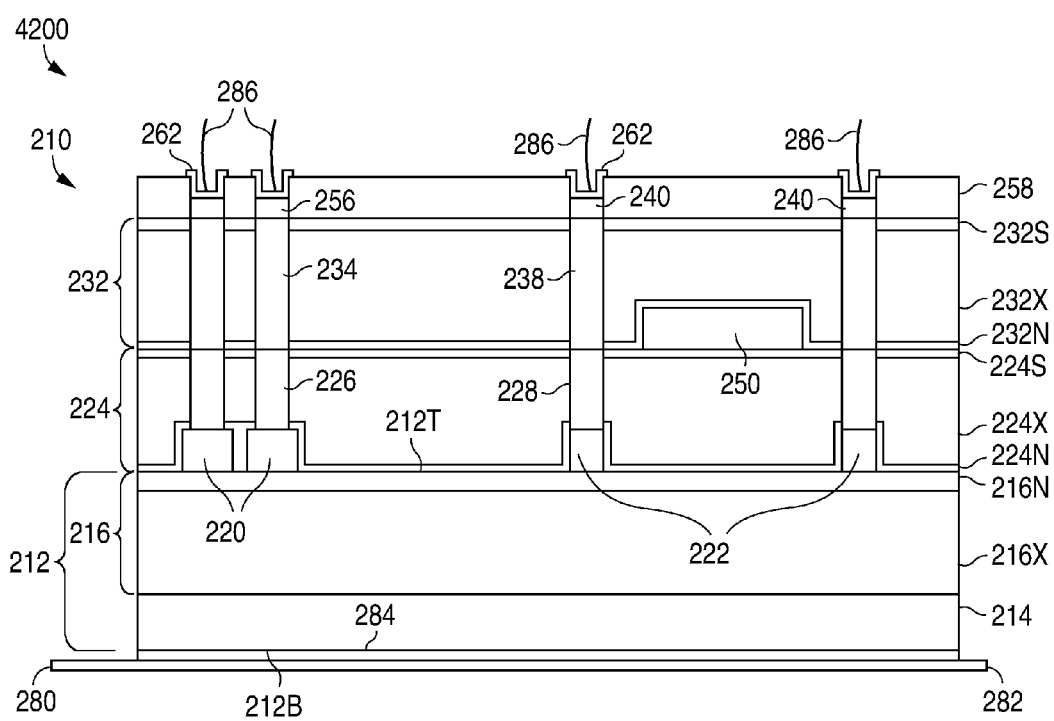

FIGS. 42A-42D show views that illustrate an example of a galvanically-isolated, multi-die chip 4200 in accordance with an alternate embodiment of the present invention. FIG. 42A shows a plan view, while FIG. 42B shows a cross-sectional view taken along lines 42B-42B of FIG. 42A, FIG. 42C shows a cross-sectional view taken along lines 42C-42C of FIG. 42A, and FIG. 42D shows a cross-sectional view taken along lines 42D-42D of FIG. 42A. Multi-die chip 4200 is similar to multi-die chip 200 and, as a result, utilizes the same reference numerals to designate the structures which are common to both chips.

As shown in FIGS. 42A-42D, multi-die chip 4200 differs from multi-die chip 200 in that high-voltage die 270 and low-voltage die 272 of multi-chip 4200 are connected to galvanic isolation die 210 in a conventional bottom-side down manner. In the present example, the bottom surface of high-voltage die 270 is attached to a high-voltage metal strip 4210 (but can alternately be attached directly to the top surface of dielectric structure 232 or passivation layer 258), and the bottom surface of low-voltage die 272 is attached to a low-voltage metal strip 4212 (but can alternately be attached directly to the top surface of dielectric structure 232) by way of an adhesive 4216. Adhesive 4216 can be implemented with, for example, a conductive or non-conductive epoxy or die attach film.

Multi-die chip 4200 also differs from multi-die chip 200 in that the bonding wires 286 of multi-die chip 4200 instead electrically connect the bond pads 274 on high-voltage die 270 to the high-voltage pads 260 and pad contacts on lead frame 414, and the bond pads 274 on low-voltage die 272 to the low-voltage pads 262 and pad contacts on lead frame 414.

Multi-die chip 4200 can be formed in the same manner as multi-die chip 440, except that high-voltage metal strip 4210 can be formed as a single structure rather than as multiple high-voltage die regions 374F, and low-voltage metal strip 4212 can be formed as a single structure rather than as multiple high-voltage die regions 374S. In addition, the openings in passivation layer 258 are also modified to accommodate die 270 and die 272, and an adhesive rather than solder is utilized to provide physical attachment.

Thus, a galvanically-isolated, multi-die chip and a method of forming the chip have been described. One of the advantages of the present invention is that the present invention provides galvanic isolation between a high-voltage die and a low-voltage die for both signal and power paths in a package that is smaller and less expensive to fabricate than conventional approaches.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor structure comprising:
   a non-conductive structure;
   a transformer touching the non-conductive structure and having a first coil, a second coil spaced apart from the first coil, and a magnetic core structure that lies within the first and second coils, the first coil having a plurality of lower coil structures that lie in a first horizontal plane within the non-conductive structure and a plurality of upper coil structures that lie in a second horizontal plane within the non-conductive structure, the second horizontal plane lying above the first horizontal plane;

a signal structure touching the non-conductive structure and having a pair of metal members, the pair of metal members being spaced apart, a first metal member of the pair of metal members lying in a horizontal plane that lies above the first horizontal plane, a second metal member of the pair of metal members lying in a horizontal plane that lies below the second horizontal plane;

a first via member that touches and extends through the non-conductive structure to touch the first metal member;

a second via member that touches and extends through the non-conductive structure to touch the second metal member; and a plurality of third via members that touch and extend through the non-conductive structure to touch the lower coil structures and the upper coil structures.

2. The semiconductor structure of claim 1 wherein the non-conductive structure includes a substrate structure that has a bottom surface and a top surface, the top surface being completely non-conductive such that no conductive structure extends through the top surface of substrate structure.

3. The semiconductor structure of claim 2 wherein the plurality of lower coil structures touch the top surface of the substrate structure.

4. The semiconductor structure of claim 3 wherein the second metal member touches the top surface of the substrate structure.

5. The semiconductor structure of claim 1 and further comprising:
a cap structure that touches the non-conductive structure; and
a high-voltage die having bond pads that are electrically connected to the first coil and the first metal member.

6. The semiconductor structure of claim 5 and further comprising a bonding wire that touches a bond pad of the high-voltage die and the first coil, the high-voltage die being attached to the cap structure.

7. The semiconductor structure of claim 5 and further comprising solder that touches a bond pad of the high-voltage die and the first coil.

8. The semiconductor structure of claim 5 and further comprising a low-voltage die electrically connected to the second coil and the second metal member.

9. The semiconductor structure of claim 8 wherein the low-voltage die is physically attached to the cap structure and electrically connected to the second coil and the first metal member by way of bonding wires.

10. The semiconductor structure of claim 8 wherein the low-voltage die is electrically connected to the second coil and the first metal member by way of solder.

11. The semiconductor structure of claim 9 wherein the first metal member lies directly vertically over a portion of the second metal member.

12. The semiconductor structure of claim 2 and further comprising a lead frame, the lead frame having a single die attach pad, the bottom surface of the substrate structure being physically connected to the single die attach pad by an adhesive.

13. A method of forming a semiconductor structure comprising:
forming a non-conductive structure;
forming a transformer, the transformer touching the non-conductive structure and having a first coil, a second coil spaced apart from the first coil, and a magnetic core structure that lies within the first and second coils, the first coil having a plurality of lower coil structures that lie in a first horizontal plane within the non-conductive structure, and a plurality of upper coil structures that lie within a second horizontal plane within the non-conductive structure, the second horizontal plane lying above the first horizontal plane;
forming a signal structure, the signal structure touching the non-conductive structure and having a pair of metal members, the pair of metal members being spaced apart, a first metal member of the pair of metal members lying in a horizontal plane that lies above the first horizontal plane, a second metal member of the pair of metal members lying in a horizontal plane that lies below the second horizontal plane;
forming a first via member that touches and extends through the non-conductive structure to touch the first metal member;
forming a second via member that touches and extends through the non-conductive structure to touch the second metal member; and
forming a plurality of third via members that touch and extend through the non-conductive structure to touch the lower coil structures and the upper coil structures.

14. The method of claim 13 wherein the non-conductive structure includes a substrate structure that has a bottom surface and a top surface, the top surface being completely non-conductive such that no conductive structure extends through the top surface of substrate structure.

15. The method of claim 14 wherein the plurality of lower coil structures touch the top surface of the substrate structure.

16. The method of claim 15 wherein the second metal member touches the top surface of the substrate structure.

17. The method of claim 13 and further comprising:
electrically connecting a high-voltage die to the first coil and the first metal member; and
electrically connecting a low-voltage die to the second coil and the second metal member.

18. The method of claim 17 wherein the high-voltage die is electrically connected to the first coil and the first metal member by way of bonding wires.

19. The method of claim 17 wherein the high-voltage die is electrically connected to the first coil and the first metal member by way of solder.

* * * * *